US011515124B2

(12) United States Patent
Selep et al.

(10) Patent No.: US 11,515,124 B2
(45) Date of Patent: Nov. 29, 2022

(54) SHOWERHEAD FACEPLATE HAVING FLOW APERTURES CONFIGURED FOR HOLLOW CATHODE DISCHARGE SUPPRESSION

(71) Applicant: Lam Research Corporation, Fremont, CA (US)

(72) Inventors: Michael John Selep, Portland, OR (US); Patrick G. Breiling, Tigard, OR (US); Karl Frederick Leeser, West Linn, OR (US); Timothy Scott Thomas, Wilsonville, OR (US); David William Kamp, Wilsonville, OR (US); Sean M. Donnelly, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 69 days.

(21) Appl. No.: 17/211,256

(22) Filed: Mar. 24, 2021

(65) Prior Publication Data

US 2021/0210310 A1 Jul. 8, 2021

Related U.S. Application Data

(62) Division of application No. 16/156,918, filed on Oct. 10, 2018, now Pat. No. 10,984,987.

(51) Int. Cl.
*H01J 37/32* (2006.01)
(52) U.S. Cl.
CPC .............................. *H01J 37/3244* (2013.01)

(58) Field of Classification Search
CPC ..... C23C 16/50; C23C 16/503; C23C 16/505; C23C 16/509; H01J 37/32009–32091; H01J 37/3244
USPC ....... 118/723 E; 156/345.43, 345.44, 345.45, 156/345.46, 345.47
See application file for complete search history.

(56) References Cited

U.S. PATENT DOCUMENTS

| 7,004,107 | B1 * | 2/2006 | Raoux | H01J 37/32174 |
| | | | | 156/345.43 |
| 2002/0063537 | A1 * | 5/2002 | Nam | H01J 37/32009 |
| | | | | 315/169.4 |
| 2012/0304933 | A1 * | 12/2012 | Mai | H01J 37/32449 |
| | | | | 118/723 I |
| 2018/0202046 | A1 * | 7/2018 | Savas | C23C 16/401 |

* cited by examiner

*Primary Examiner* — Rudy Zervigon
(74) *Attorney, Agent, or Firm* — Penilla IP, APC

(57) ABSTRACT

A faceplate of a showerhead has a bottom side that faces a plasma generation region and a top side that faces a plenum into which a process gas is supplied during operation of a substrate processing system. The faceplate includes apertures formed through the bottom side and openings formed through the top side. Each of the apertures is formed to extend through a portion of an overall thickness of the faceplate to intersect with at least one of the openings to form a corresponding flow path for process gas through the faceplate. Each of the apertures has a cross-section that has a hollow cathode discharge suppression dimension in at least one direction. Each of the openings has a cross-section that has a smallest cross-sectional dimension that is greater than the hollow cathode discharge suppression dimension.

21 Claims, 32 Drawing Sheets (View A-A)

(View A-A)

(View B-B)

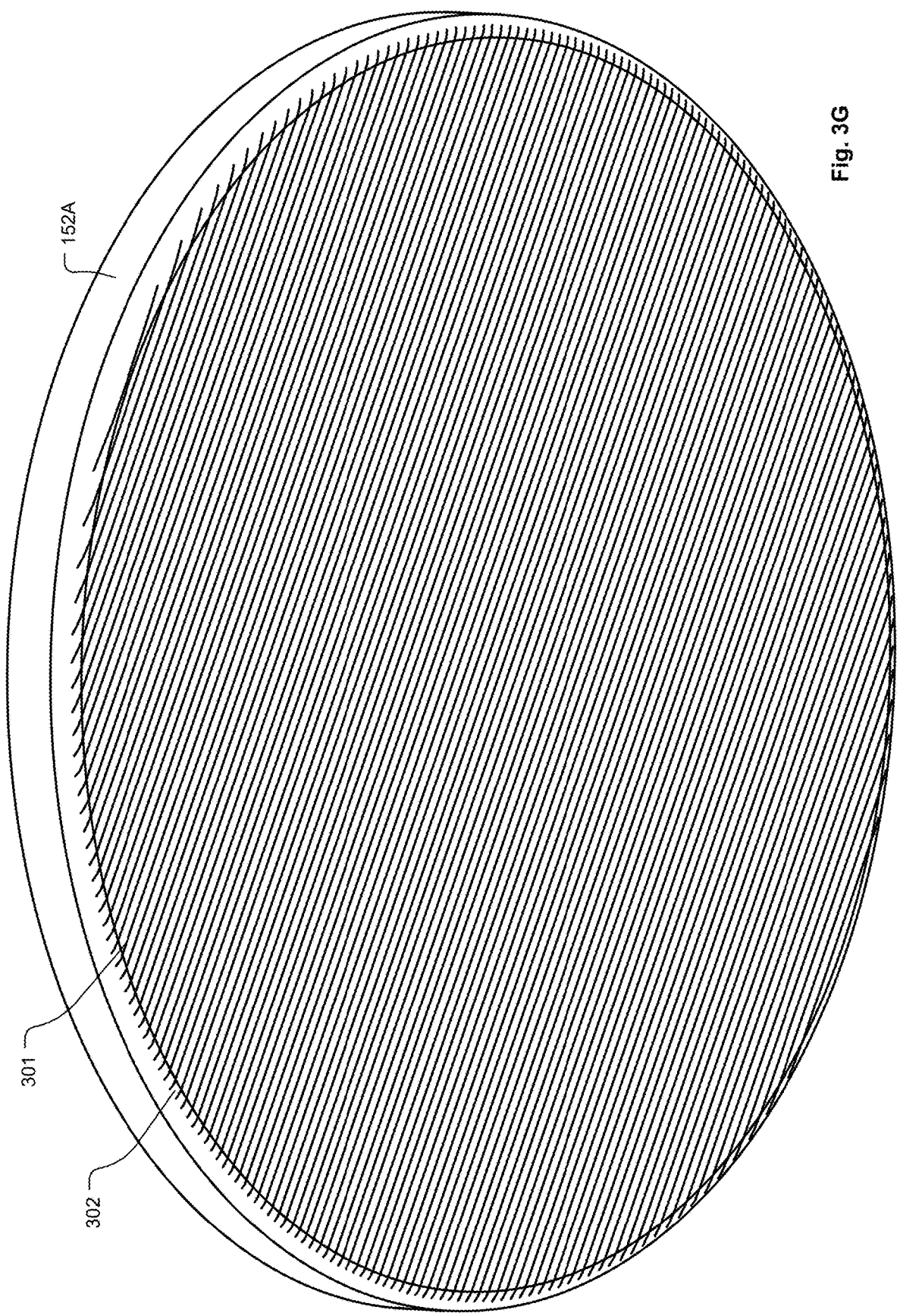

(View A-A)

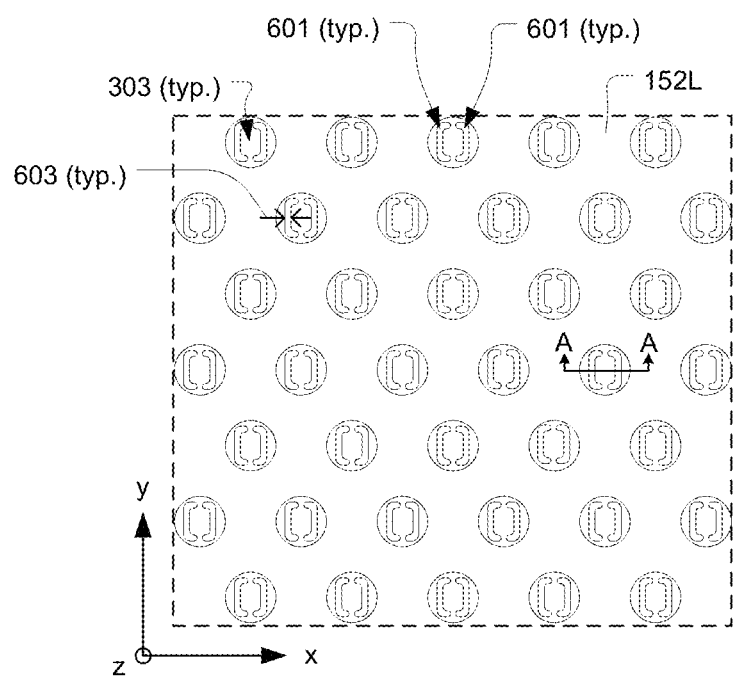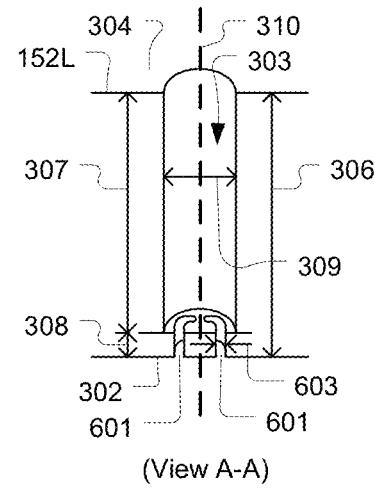
Fig. 6A-1
Fig. 6A-2
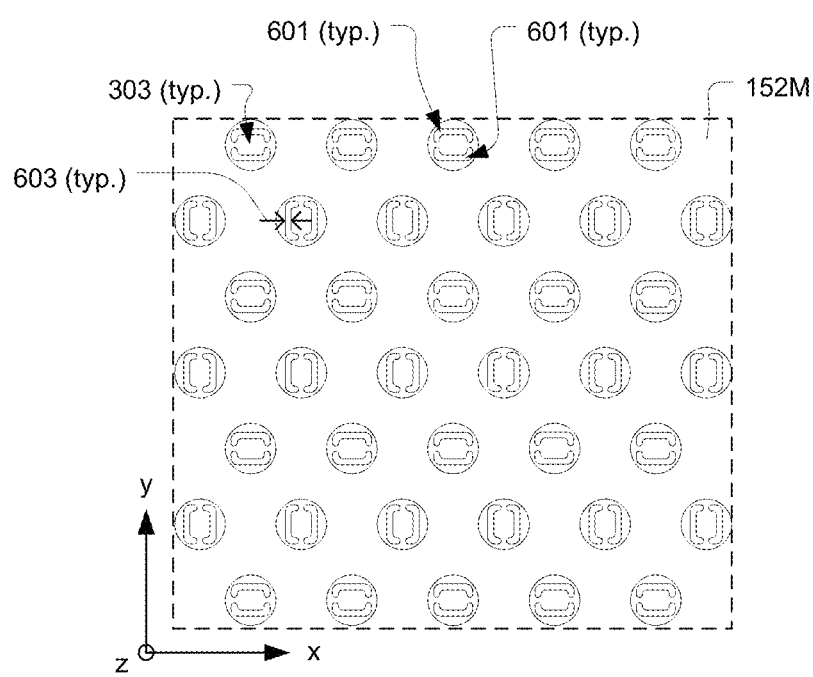
Fig. 6B

(View A-A)

(View A-A)

(View A-A)

(View A-A)

SHOWERHEAD FACEPLATE HAVING FLOW APERTURES CONFIGURED FOR HOLLOW CATHODE DISCHARGE SUPPRESSION

CLAIM OF PRIORITY

This application is a divisional application under 35 U.S.C. 121 of prior U.S. application Ser. No. 16/156,918, filed Oct. 10, 2018, the disclosure of which is incorporated herein by reference in its entirety for all purposes.

BACKGROUND

1. Field of the Disclosure

The present disclosure relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by supplying a process gas into a plasma processing region and by applying radiofrequency (RF) power to the process gas, such that the process gas becomes energized and transforms into the desired plasma within the plasma processing region. The characteristics of the plasma are affected by many process parameters including, but not limited to, material composition of the process gas, flow rate of the process gas, distribution of the process gas, pressure, geometric features of the plasma processing region and surrounding structures, temperatures of the process gas and surrounding materials, frequency and magnitude of the RF power applied, and bias voltage applied to attract charged constituents of the plasma toward the wafer, among other parameters. It is within this context that the present disclosure arises.

SUMMARY

In some embodiments, a showerhead for delivering process gas to a plasma generation region within a substrate processing system is disclosed. The showerhead includes a faceplate having a bottom side and a top side. The bottom side of the faceplate faces the plasma generation region during operation of the substrate processing system. The top side of the faceplate faces one or more plenums into which one or more process gases are supplied during operation of the substrate processing system. The faceplate has an overall thickness as measured between the bottom side and the top side of the faceplate. The faceplate includes apertures formed through the bottom side of the faceplate. The faceplate includes openings formed through the top side of the faceplate. Each of the apertures is formed to extend through a portion of the overall thickness of the faceplate to intersect with at least one of the openings to form a corresponding flow path for process gas through the faceplate. Each of the apertures has a cross-section oriented parallel with the bottom side of the faceplate. The cross-section of each of the apertures has a hollow cathode discharge suppression dimension in at least one direction. Each of the openings has a cross-section oriented parallel with the top side of the faceplate. Each of the openings has a smallest cross-sectional dimension that is greater than the hollow cathode discharge suppression dimension.

In some embodiments, a faceplate is disclosed for a showerhead for delivering process gas to a plasma generation region within a substrate processing system. The faceplate includes a disc having a bottom side and a top side. The bottom side of the disc is configured to face the plasma generation region during operation of the substrate processing system. The top side of the disc is configured to face one or more plenums into which one or more process gases are supplied during operation of the substrate processing system. The disc has an overall thickness as measured between the bottom side and the top side of the disc. The disc includes apertures formed through the bottom side of the disc. The disc includes openings formed through the top side of the disc. Each of the apertures is formed to extend through a portion of the overall thickness of the disc to intersect with at least one of the openings to form a corresponding flow path for process gas through the disc. Each of the apertures has a cross-section oriented parallel with the bottom side of the disc. The cross-section of each of the apertures has a hollow cathode discharge suppression dimension in at least one direction. Each of the openings has a cross-section oriented parallel with the top side of the disc. Each of the openings has a smallest cross-sectional dimension that is greater than the hollow cathode discharge suppression dimension.

In some embodiments, a method is disclosed for manufacturing a faceplate of a showerhead for delivering process gas to a plasma generation region within a substrate processing system. The method includes providing a disc having a bottom side and a top side. The bottom side of the disc is configured to face the plasma generation region during operation of the substrate processing system. The top side of the disc is configured to face one or more plenums into which one or more process gases are supplied during operation of the substrate processing system. The disc has an overall thickness as measured between the bottom side and the top side of the disc. The method also includes forming apertures through the bottom side of the disc. Each of the apertures has a cross-section oriented parallel with the bottom side of the disc. The cross-section of each of the apertures is formed to have a hollow cathode discharge suppression dimension in at least one direction. The method also includes forming openings through the top side of the disc to intersect with at least one of the apertures within the disc to form a corresponding flow path for process gas through the disc. Each of the openings has a cross-section oriented parallel with the top side of the disc. Each of the openings is formed to have a smallest cross-sectional dimension that is greater than the hollow cathode discharge suppression dimension.

BRIEF DESCRIPTION OF THE DRAWINGS

FIG. 3G shows a bottom isometric view of the faceplate 152A as depicted in FIGS. 3A-3F, in accordance with some embodiments.

FIG. 4A-1 shows a bottom view of a portion of a modified faceplate 152G that includes apertures of rectangular cross-sectional shape that are separately formed at each hole location, in accordance with some embodiments.

FIG. 4A-2 shows a vertical cross-section view through a hole of the modified faceplate 152G corresponding to View A-A in FIG. 4A-1, in accordance with some embodiments.

FIG. 4A-3 shows a vertical cross-section view through a hole of the modified faceplate 152G corresponding to View B-B in FIG. 4A-1, in accordance with some embodiments.

FIG. 5A-1 shows a bottom view of a portion of a modified faceplate 152J that includes apertures of curved cross-sectional shape that are separately formed at each hole location, in accordance with some embodiments.

FIG. 5A-2 shows a vertical cross-section view through a hole of the modified faceplate 152J corresponding to View A-A in FIG. 5A-1, in accordance with some embodiments.

FIG. 6A-1 shows apertures of bracket cross-sectional shape that are separately formed at each hole location within a modified faceplate 152L, in accordance with some embodiments.

FIG. 6A-2 shows a vertical cross-section view through a hole of the modified faceplate 152L corresponding to View A-A in FIG. 6A-1, in accordance with some embodiments.

FIG. 6B shows apertures of bracket cross-sectional shape that are separately formed at each hole location within a modified faceplate 152M and that have varying azimuthal orientations about the axis of their corresponding hole, in accordance with some embodiments.

FIG. 7A-1 shows apertures of circular cross-sectional shape that are separately formed at each hole location within a modified faceplate 152N, in accordance with some embodiments.

FIG. 7A-2 shows a vertical cross-section view through a hole of the modified faceplate 152N corresponding to View A-A in FIG. 7A-1, in accordance with some embodiments.

FIG. 7B-1 shows multiple apertures of circular cross-sectional shape per hole within a modified faceplate 152O, in accordance with some embodiments.

FIG. 7B-2 shows a vertical cross-section view through a hole of the modified faceplate 152O corresponding to View A-A in FIG. 7B-1, in accordance with some embodiments.

DETAILED DESCRIPTION

Figure 1:
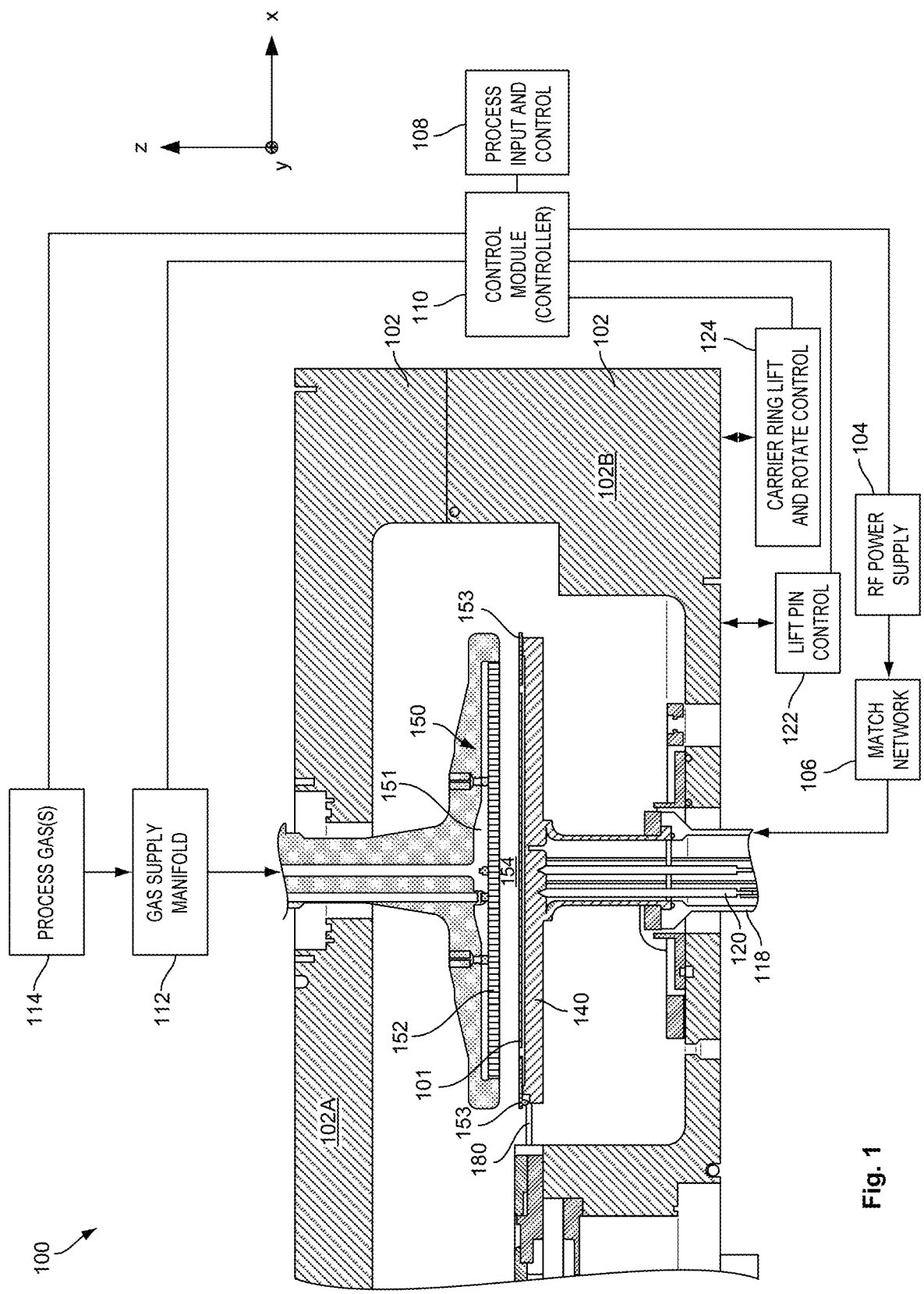
FIG. 1 shows a vertical cross-section of an example substrate processing system, which is used to perform a plasma process to modify a substrate, in accordance with some embodiments.

FIG. 1 shows a vertical cross-section of an example substrate processing system 100, which is used to perform a plasma process to modify a substrate 101, in accordance with some embodiments. The system 100 includes a process chamber 102 having an upper chamber body 102A and a lower chamber body 102B. A center column 118 is defined in the lower chamber body 102B and is configured to support a pedestal 140. In some embodiments, the pedestal 140 is a powered electrode. The pedestal 140 provides a substrate support surface on which the substrate 101 is positioned for processing. The pedestal 140 is electrically coupled to a power supply 104 via a match network 106. The power supply 104 is controlled by a control module 110, e.g., a controller. The control module 110 is configured to operate the substrate processing system 100 by executing process input and control instructions 108. The process input and control instructions 108 can include process recipes and control specifications for process parameters, such as power levels, timing parameters, process gases (e.g., precursors), flow rates of the process gases, mechanical movement of the substrate 101, pressure, temperature within the process chamber 102, etc., so as to direct performance of a plasma-based fabrication process on the substrate 101, such as deposition/formation of a film over the substrate 101 via atomic layer deposition (ALD) or plasma enhanced chemical vapor deposition (PECVD) methods, among other methods, and/or etching of material from the substrate 101.

The center column 118 can also include lift pins 120, which are controlled by a lift pin control system 122. The lift pins 120 are used to raise and lower the substrate 101 relative to the pedestal 140 to enable capture and release of the substrate 101 by an end-effector of a robotic substrate handling system. The lift pin control system 122 is controlled by the control module 110. The substrate processing system 100 further includes a gas supply manifold 112 that is connected to a process gas source 114, e.g., gas supplies from a facility. Depending on the substrate 101 processing being performed, the control module 110 controls the delivery of process gases 114 into a showerhead 150 via the gas supply manifold 112. In some embodiments, such as shown in the example of FIG. 1, the showerhead 150 is configured as a "chandelier showerhead." The showerhead 150 includes one or more plenum regions 151 and a faceplate 152. The faceplate 152 includes a plurality of passages through which process gas travels from the plenum region(s) 151 to reach a plasma processing region 154 between the faceplate 152 and the pedestal 140. The faceplate 152 is configured to distribute the process gas throughout the plasma processing region 154. In some embodiments, during operation, radiofrequency (RF) power is supplied from the power supply 104, via the match network 106, to an electrode of the pedestal 140, and the showerhead 150 is electrically connected to a reference ground potential, such that RF power is transmitted through the plasma processing region 154 to transform the process gas into a plasma within the plasma processing region 154.

In some embodiments, the plenum region(s) 151 of the showerhead 150 is defined by a single plenum region. In some embodiments, the plenum region(s) 151 of the showerhead 150 include an inner plenum region and an outer plenum region, where the outer plenum region is configured to circumscribe the inner plenum region. In these embodiments, the process gases are provided in process windows that are controlled in-part by controlling the flow of the process gas into the inner plenum and/or outer plenum of the showerhead 150. Valving and mass flow control (MFC) mechanisms can be configured to ensure that the correct process gases are delivered to the prescribed locations/plenums during performance of the plasma-based fabrication process on the substrate 101. The valving and MFC mechanisms can be controlled by the control module 110. From the plasma processing region 154, used process gases and volatile by-product materials, if any, are flowed to an outlet (not shown) to exit the process chamber 102. A vacuum source (not shown) (e.g., a one or two stage mechanical dry pump and/or a turbomolecular pump) draws used process gases and volatile by-product materials through the outlet. The vacuum source can also function to maintain a suitably low pressure within the process chamber 102.

In some embodiments, the substrate processing system 100 can include a carrier ring 153 configured to encircle an outer region of the pedestal 140. The carrier ring 153 is configured to sit over a carrier ring support region that is a step down from a substrate support region in the center of the pedestal 140. The carrier ring 153 includes an outer edge side of its disk structure, e.g., outer radius, and a substrate edge side of its disk structure, e.g., inner radius, that is closest to where the substrate 101 sits. The substrate edge side of the carrier ring 153 includes a plurality of contact support structures which are configured to lift the substrate 101 when the carrier ring 153 is lifted by forks 180. Movement of the carrier ring 153 is controlled by a carrier ring lift and rotate control module 124 in response to signals provided by the control module 110 to which the carrier ring lift and rotate control module 124 is connected. For example, the carrier ring lift and rotate control module 124 may be employed to lift the carrier ring 153 along with the substrate 101 and move the substrate 101 into or out of the process chamber 102, e.g., in a single-station system. Alternately, the carrier ring lift and rotate control module 124 may be employed to rotate the carrier ring 153 along with the substrate 101 to another station, e.g., in a multi-station system.

Various embodiments are disclosed herein for the showerhead 150, and more specifically for modified configurations of the faceplate 152 of the showerhead 150. It should be understood that the substrate processing system 100 of FIG. 1 is provided by way of example. The embodiments disclosed herein for the showerhead 150 and modified configurations of the faceplate 152 can be used in essentially any plasma processing chamber in which a version of the showerhead 150 or equivalent is used to dispense process gas into a region in which the process gas is transformed into a plasma. Therefore, it should be understood that the embodiments disclosed herein can be used with many variations of the substrate processing system 100, and with other types of plasma-based substrate processing/fabrication systems.

Figure 2A:
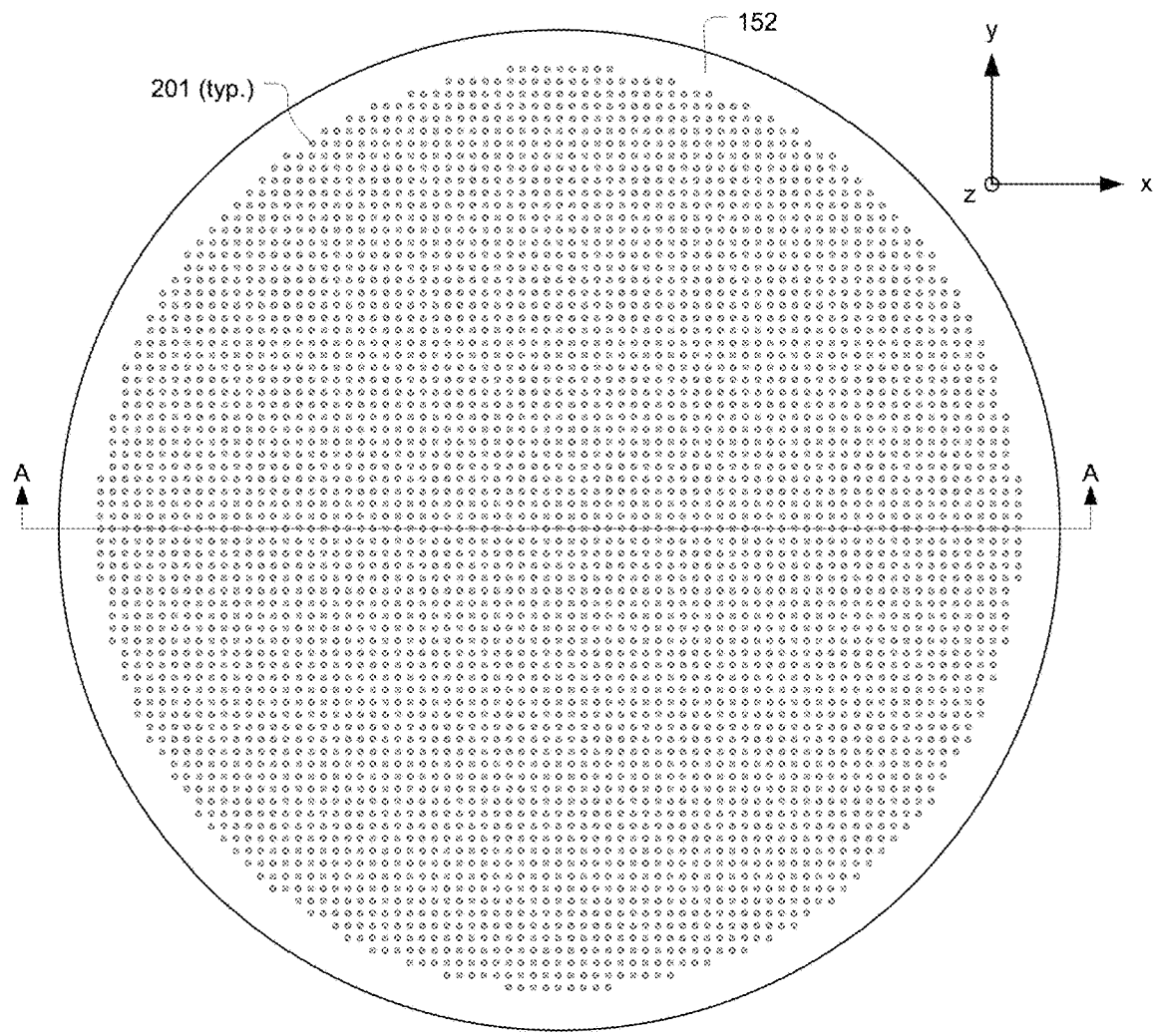
FIG. 2A shows a bottom view of the faceplate, in accordance with some embodiments.
Figure 2B:
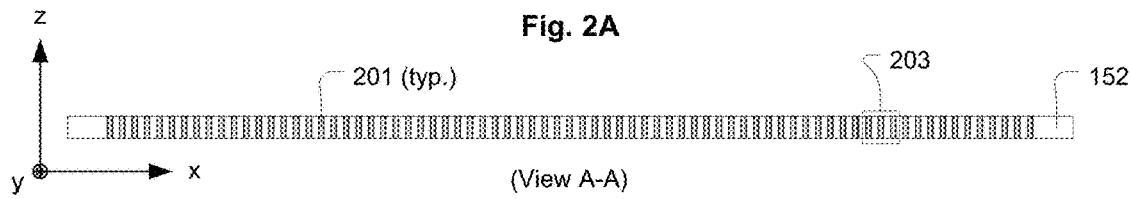
FIG. 2B shows a vertical cross-section of the faceplate, corresponding to View A-A in FIG. 2A, in accordance with some embodiments.
Figure 2C:
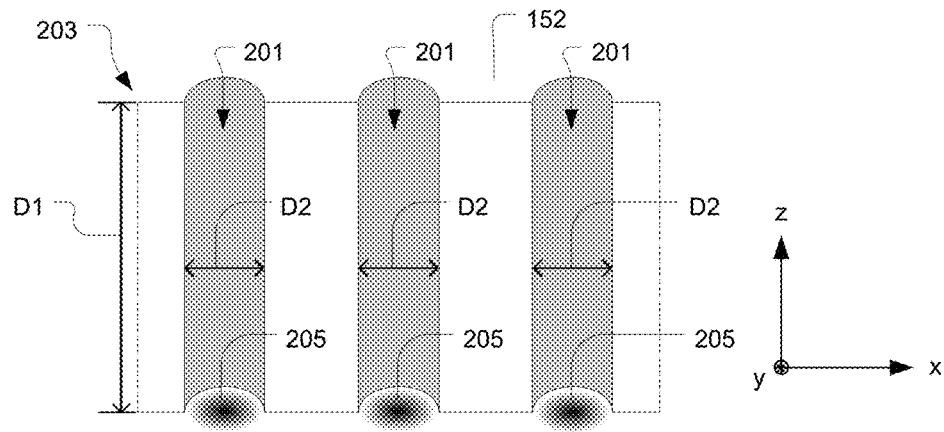
FIG. 2C shows a close-up vertical cross-section view of a region as identified in FIG. 2B, in accordance with some embodiments.

FIG. 2A shows a bottom view of the faceplate 152, in accordance with some embodiments. The faceplate 152 includes an arrangement of through-holes 201 (typ.), depicted as the small circles in FIG. 2A. The example of FIG. 2A shows the through-holes 201 (typ.) arranged in a square-lattice array. FIG. 2B shows a vertical cross-section of the faceplate 152, corresponding to View A-A in FIG. 2A, in accordance with some embodiments. FIG. 2C shows a close-up vertical cross-section view of a region 203 as identified in FIG. 2B, in accordance with some embodiments. As shown in FIG. 2C, the faceplate 152 has a vertical, i.e., z-direction, thickness D1. In various embodiments, the thickness D1 of the faceplate 152 is set so that the faceplate 152 will provide sufficient thermal performance and maintain structural integrity during processing. In some embodiments, the thickness D1 of the faceplate 152 is within a range extending from about 0.25 inch to about 2 inches. In some embodiments, the thickness D1 of the faceplate is about 0.375 inch. However, it should be understood that in some embodiments the thickness of the faceplate 152 can be either less than 0.25 inch or greater than 2 inches. In some embodiments, the through-holes 201 have a circular shape in the horizontal direction, i.e., in the x-y plane. In these embodiments, each of the through-holes 201 (typ.) has a diameter D2, as measured in the horizontal direction, i.e., in the x-y plane. In some embodiments, the diameter D2 is within a range extending from about 0.02 inch to about 0.08 inch. In some embodiments, the diameter D2 is about 0.08 inch. In some embodiments, the diameter D2 is within a range extending from about 0.02 inch to about 0.04 inch. In some embodiments, the diameter D2 is about 0.04 inch.

In some embodiments, the faceplate 152 is formed of aluminum, such as 6061 aluminum or 3003 aluminum, among others. In some embodiments, the faceplate 152 is formed of a ceramic material, such as aluminum oxide ($Al_2O_3$), aluminum nitride (AlN), or yttria ($Y_2O_3$), among other ceramic materials. Also, in some embodiments, the faceplate 152 is formed of stainless steel. It should be understood that in various embodiments, the faceplate 152 can be formed of essentially any material that: a) is chemically compatible with the process gas chemistry and with materials present in the plasma processing region 154 during processing, b) has sufficient mechanical strength to maintain structural integrity in the presence of pressure differentials that can exist between the top and bottom sides of the faceplate 152 during processing, c) has sufficient thermal properties to satisfy thermal performance requirements during processing, and d) has sufficient electrical properties to satisfy electrical performance requirements during processing. Also, in some embodiments, the bottom of the faceplate 152 that faces toward the plasma processing region 154 can be coated with a coating such as a metal oxide, e.g., aluminum oxide ($Al_2O_3$), among other coating materials. In various embodiments, the coating material applied to the bottom side of the faceplate 152 should remain adhered to the faceplate 152 during processing and should be chemically compatible with the process gas chemistry and with materials present in the plasma processing region 154 during processing.

With reference to FIG. 2C, during processing, hollow cathode discharge (HCD) 205 can form within the through-holes 201 near the bottom side of the faceplate 152, depending on the process conditions, e.g., pressure and RF power, and on the geometry and size of the through-holes 201. The particular combination of process conditions determines a critical dimension for hollow cathode discharge suppression. Concave features larger than the critical dimension will allow the plasma sheath to form a robust HCD, but concave features smaller than the critical dimension will not support the formation of a significant HCD. Some processes, such as ashable hard mask (AHM) processes, require pressures greater than about 11 Torr or even greater than about 13 Torr, and require RF power that exceeds 9 kiloWatts (kW) at higher frequencies and/or that exceeds 3 kW at lower frequencies. In these processes and others, as pressure and/or RF power increases during processing, HCD 205 can occur in the through-holes 201 that have cylindrical shape with the diameter D2 set at about 0.08 inch or larger. When the HCD 205 forms in the through-hole 201 of the faceplate 152, a local plasma density around the HCD 205 is perturbed, which can adversely affect process uniformity across the substrate 101. Also, localized formation of HCD 205 in the through-hole 201 of the faceplate 152 can allow electrical arcing to occur at the HCD 205 location, which can damage the substrate 101 and cause non-uniformity in process results on the substrate 101. Therefore, it is of interest to avoid formation of HCD's 205 within the through-holes 201 of the faceplate 152 in order to reduce/eliminate process non-uniformity and electrical arcing.

One approach for reducing HCD 205 formation is to reduce the diameter D2 of the through-holes 201 below the limit for the formation of HCD. However, there are practical limits to how much the diameter D2 of the through-holes 201 can be reduced with conventional drilling fabrication methods. Also, as the diameter D2 of the through-holes 201 is decreased, the total number of through-holes 201 must be increased to maintain a required overall process gas flow conductance through the faceplate 152 and to maintain a required pressure drop across the faceplate 152 (between the plenum region(s) 151 and the plasma processing region 154). Because the process gas flow conductance through a given through-hole 201 is a function of the flow area of the given through-hole 201 and a function of friction associated with a flow boundary layer along the sides of the given through-hole 201, the required total number of through-holes 201 increases non-linearly (approximately exponentially) as the diameter D2 decreases below about 0.08 inch. Additionally, the process uniformity can be sensitive to the pressure drop across the faceplate 152. Therefore, it is of interest to maintain the same pressure drop across the faceplate 152 when adjusting the size and number of the through-holes 201 within the faceplate 152.

It has been demonstrated that in some processes, such as AHM processes, with the faceplate 152 having a flat bottom side and including 3,870 cylindrical-shaped through-holes 201, HCD's 205 will still occur within the through-holes 201 having the diameter D2 set at about 0.02 inch. It has been determined that the diameter D2 of the through-holes should be reduced to about 0.012 inch, or about 0.01 inch, or even smaller, in order to avoid HCD 205 formation at higher process pressures and RF powers, such as present in AHM processes. And, with the diameter D2 of the cylindrical-shaped through-holes 201 set at 0.012 inch, more than 50,000 through-holes 201 are required in order to match the specified overall process gas flow conductance through the faceplate 152 and to match the specified pressure drop across the faceplate 152, for given downstream pressure and flows through the showerhead 150. However, it is not practical to manufacture the faceplate 152 using conventional drilling techniques to form 50,000 through-holes 201 of diameter D2 set at 0.012 inch. One reason for this is that drill bit breakage becomes a significant problem when drilling holes of diameter less than about 0.02 inch. And, if a drill bit break occurs when drilling any of the many (e.g., 50,000) through-holes 201, there is a high likelihood that the faceplate 152 will be damaged and rendered unusable. It should be understood that successful fabrication of the faceplate 152 is limited by the shape, size, and quantity of the through-holes 201 when attempting to make the through-holes 201 small enough to suppress the HCD 205. Not only is the required quantity of the through-holes 201 prohibitive, but the required diameter D2 of the through-holes 201 makes "drilling yield" prohibitive, as the drill bits can be prone to break during drilling and can be prone to form/machine less precise through-holes 201.

Through-spindle cooling techniques can be used to assist with drilling holes that have diameters down to about 0.02 inch. In the through-spindle cooling technique, the drill bit includes coolant channels through which a coolant is flowed while drilling, thereby preventing overheating and corresponding mechanical failure of the drill bit. While the through-spindle cooling technique allows for faster and more consistent drilling of the through-holes 201 without breaking the drill bit, the through-spindle cooling technique is not available for a drill bit having a size less than 0.02 inch. Therefore, a regular (not through-spindle cooled) drill bit has to be used to form a through-hole 201 of diameter D2 less than 0.02 inch. Also, at diameter D2 sizes of less than 0.02 inch, the through-holes 201 have to be drilled using a peck-drilling process in order to handle material chips that are generated during the drilling process. And, drill bit breakage is even more likely when peck-drilling is done using the small diameter (less than 0.02 inch) drill bit that is not through-spindle cooled.

Mechanical drilling of circular through-holes 201 with the diameter D2 below the critical dimension required to suppress HCD formation may be possible, but in order to drill enough through-holes 201 to maintain a sufficiently high process gas flow conductance and uniformity, fabrication of the faceplate 152 becomes prohibitively expensive and low-yield. For example, it would be necessary to drill tens of thousands of through-holes 201, each at the diameter D2 of about 0.012 inch, through the faceplate 152 in order to match the process gas flow conductance of a faceplate 152 that has 3,870 through-holes 201, each at the diameter D2 of 0.02 inch. Given that through-holes 201 of diameter D2 less than about 0.02 inch cannot be drilled with through-spindle cooling technology, the time required to drill each through-hole 201 at the diameter D2 of about 0.012 inch would be slower. Also, without the use of through-spindle cooling technology and with such a large number of through-holes 201 to be drilled, the risk of breaking a drill bit and destroying the faceplate 152 becomes significantly higher with correspondingly lower faceplate 152 yield. This combined with the increased machining time makes the cost per faceplate 152 prohibitively expensive. Given the limit of mechanical drilling at the diameter D2 of about 0.02 inch, and given that the diameter D2 of the through-holes 201 needs to be less than about 0.012 inch in order to avoid HCD 205 formation at expected increased pressure and RF power process settings, alternate configurations of the faceplate 152 are disclosed herein that do not require drilling of the through-holes 201 through the entire thickness D1 of the faceplate 152.

Various embodiments are disclosed herein for modified faceplates (152A-152T), i.e., a modification of the faceplate 152, of the showerhead 150 that provides for elimination of the HCD formation within the modified faceplates (152A-152T). Each of the modified faceplates (152A-152T) has a geometric configuration defined to eliminate HCD formation within process gas passages at the plasma-side (bottom side) of the modified faceplates (152A-152T) in the presence of higher process pressures and higher process RF powers, such as present in AHM processes and other processes. For HCD suppression, it is the minimum cross-sectional size of the process gas passages, i.e., flow apertures, right at the plasma-side (bottom side) of the modified faceplate (152A-152T) that is of concern. The modified faceplates (152A-152T) disclosed herein include small apertures formed in the plasma-side of the modified faceplate (152A-152T) to provide for process gas flow to the plasma processing region 154. These small apertures can have various cross-sectional shapes within a plane of the plasma-side of the modified faceplate (152A-152T), such as rectangular cross-sectional shapes, curved cross-sectional shapes, circular cross-section shapes, bent cross-sectional shapes, among other cross-sectional shapes. Each small aperture formed in the plasma-side of the modified faceplate (152A-152T) has an HCD suppression dimension in at least one direction. The HCD suppression dimension is sized small enough to prevent HCD formation within the aperture in the presence of higher process pressures and higher process RF powers. For example, in some embodiments, the HCD suppression dimension of the apertures is sized at less than or equal to about 0.012 inch.

The small apertures formed in the plasma-side of the modified faceplate(152A-152T) intersect with larger openings formed through the plenum-side (top side) of the modified faceplate (152A-152T). To enable reliable and efficient manufacturing of the modified faceplate (152A-152T), the more difficult to manufacture small apertures are formed to extend a limited distance into the plasma-side of the modified faceplate (152A-152T). And, the larger holes that are easier to manufacture are formed to extend through a majority of the overall thickness of the modified faceplate (152A-152T) from the plenum-side of the modified faceplate (152A-152T), so as to intersect with one or more of the small apertures and thereby form fluid passageways through the modified faceplate (152A-152T) for flow of process gas. Therefore, the smaller cross-sectional size and shallow depth of the apertures formed within the plasma-side of the modified faceplate (152A-152T) are maintained within a range that is manufacturable using mechanical drilling/ machining methods, or methods that would be less feasible for full-thickness drilling, such as laser drilling/cutting methods, and/or other cutting methods (e.g., water jet cutting, plasma cutting, etc.), and/or wire electric discharge machining (EDM) methods (e.g., sinker EDM, wire EDM, etc.), among other fabrication methods. And, the larger cross-sectional size and larger depth of the openings formed in the plenum-side of the modified faceplate (152A-152T) are maintained within a range that is manufacturable using mechanical drilling methods and/or machining methods and/or laser cutting methods, among other fabrication methods.

A distribution of the small apertures formed within the plasma-side of the modified faceplate (152A-152T) provide for substantially uniform distribution of process gas flow into the plasma processing region 154. Also, the number and the geometric specifications of the small apertures, e.g., cross-sectional open area, length, depth, etc., can be defined so that the process gas flow conductance into the plasma processing region 154 provided by the modified faceplate (152A-152T) substantially matches the process gas flow conductance of existing showerhead designs in order to substantially match process performance, e.g., process gas flow uniformity, pressure drop across faceplate, etc. The larger openings formed through the plenum-side of the modified faceplate (152A-152T) can be configured to provide for process gas flow conductance matching and pressure drop matching to existing showerhead designs, while providing for reduction in the depth (cut/machined depth) of the small apertures at the plasma-side of the modified faceplate (152A-152T).

By using small apertures having shallow depth at the plasma-side of the modified faceplate (152A-152T) in combination with intersecting larger and deeper openings formed through the plenum-side of the modified faceplate (152A-152T), the modified faceplate (152A-152T) can be more easily fabricated with lower process gas flow restrictions, while allowing the bulk of the modified faceplate (152A-152T) to be thicker in order to provide adequate thermal and mechanical performance. Also, the modified faceplate (152A-152T) that uses small apertures of shallow depth at the plasma-side of the modified faceplate (152A-152T) in combination with intersecting larger and deeper openings formed through the plenum-side of the modified faceplate (152A-152T) can be more easily tuned to deliver a desired process gas flow conductance over a much wider range in comparison with the faceplate 152 that uses a similar number of drilled holes of uniform cross-section formed through an entire thickness of the faceplate 152.

Figure 3A:
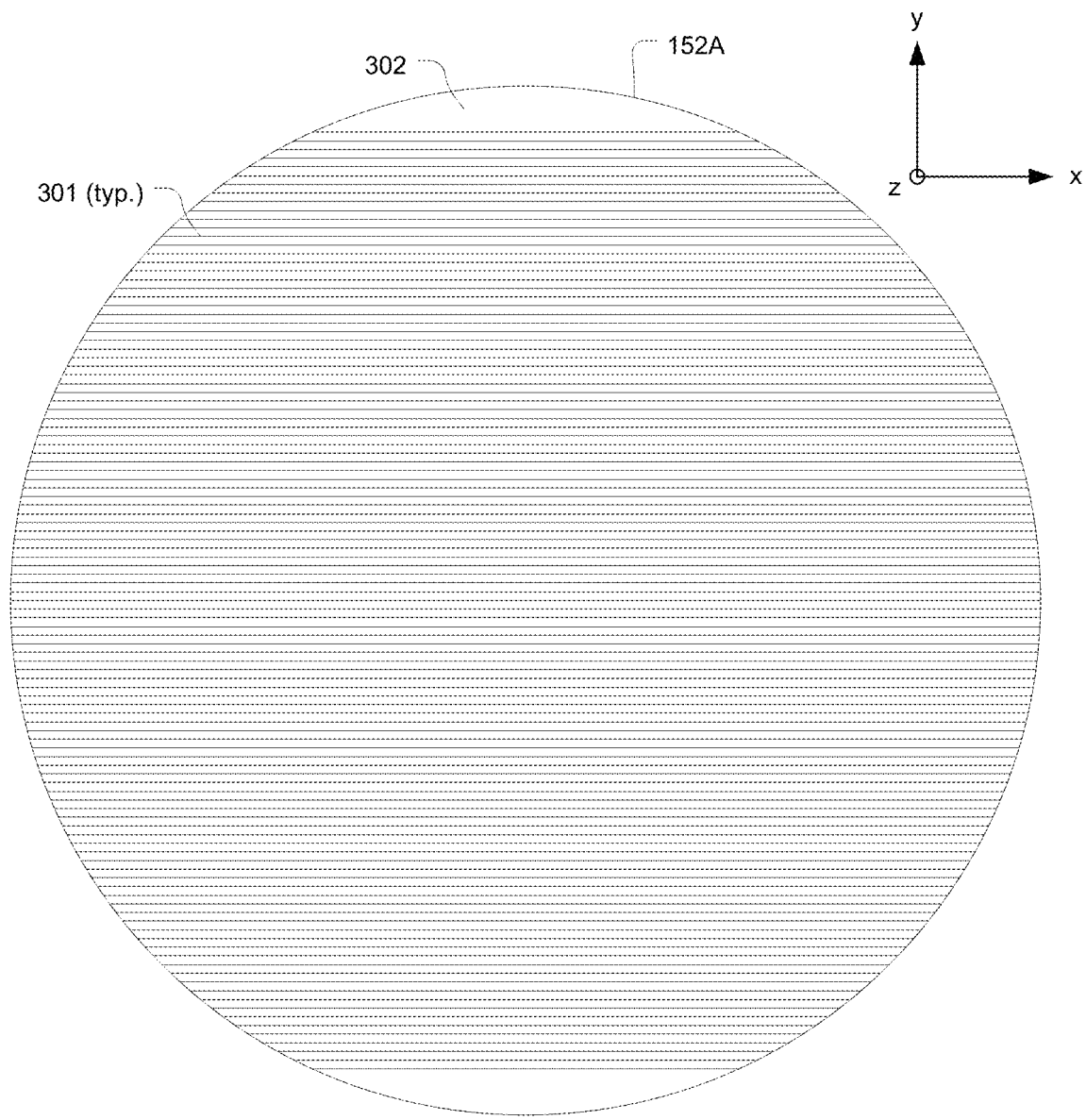
FIG. 3A shows a bottom view of a faceplate 152A, in accordance with some embodiments.
Figure 3B:
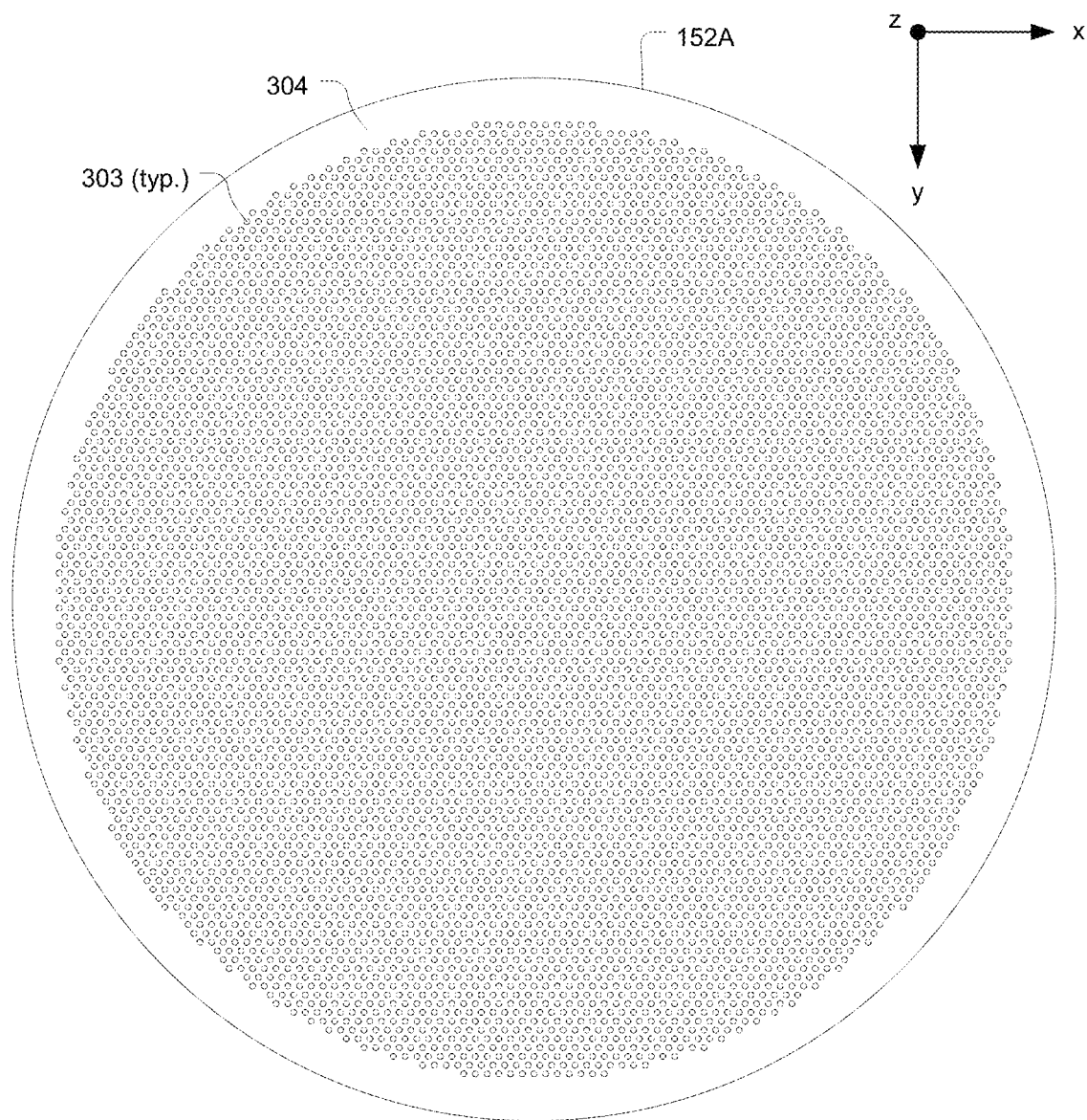
FIG. 3B shows a top view of the faceplate 152A, in accordance with some embodiments.
Figure 3C:
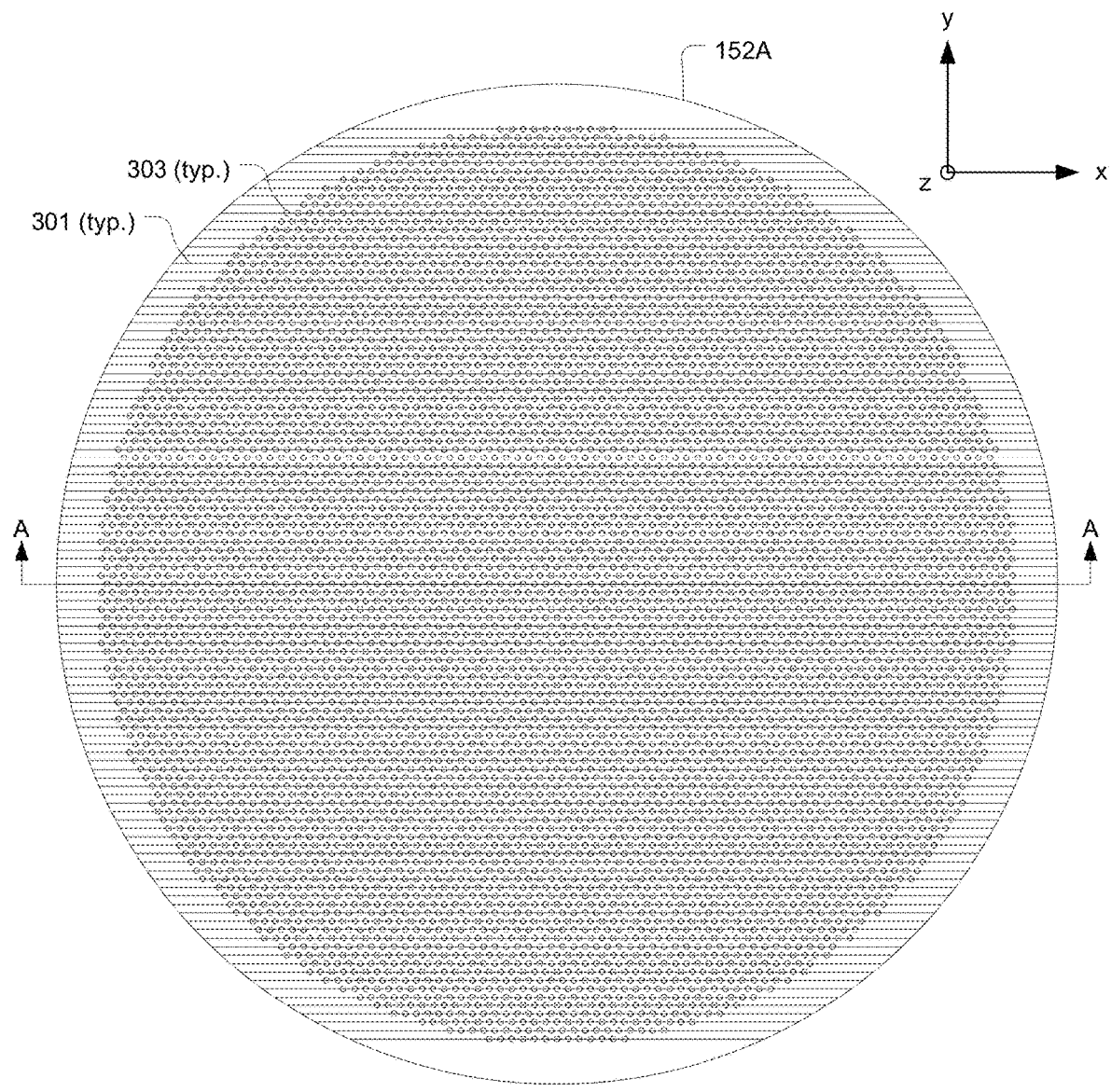
FIG. 3C shows a transparent view of the faceplate 152A so that the arrangement of parallel slots and the arrangement of holes are visible with respect to each other, in accordance with some embodiments.

FIG. 3A shows a bottom view of a faceplate 152A, in accordance with some embodiments. The faceplate 152A includes an arrangement of parallel slots 301 formed to extend across a bottom side 302 of the faceplate 152A. The slots 301 are depicted in FIG. 3A as the horizontal lines that extend across the bottom side 302 of the faceplate 152A. The slots 301 form bottom side apertures through which process gas flows into the plasma processing region 154. FIG. 3B shows a top view of the faceplate 152A, in accordance with some embodiments. FIG. 3B shows holes 303 formed to extend through a top side 304 of the faceplate 152A to depth within the faceplate 152 at which the holes 303 intersect with the slots 301. The holes 303 are depicted in FIG. 3B as the small circles distributed across the top side 304 of the faceplate 152A. In the example of FIG. 3B, the holes 303 are arranged in a hexagonal-lattice array. However, in other embodiments, the holes 303 can be arranged in other patterns, such as in a square lattice array, or a rectangular lattice array, or a rhombic lattice array, or a parallelogrammic lattice array, or in a Vogel pattern, or in another pattern. The holes 303 form top side apertures through which process gas flows to reach the slots 301 (bottom side apertures). FIG. 3C shows a transparent view of the faceplate 152A so that the arrangement of parallel slots 301 and the arrangement of holes 303 are visible with respect to each other, in accordance with some embodiments. At some depth within the faceplate 152A, each of the holes 303 intersects with one of the slots 301 to form a fluid passage through the faceplate 152A, through which process gas can flow into the plasma processing region 154.

Figure 3D:
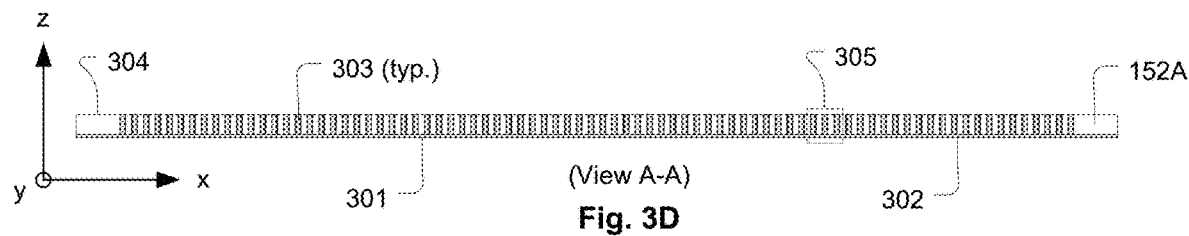
FIG. 3D shows a vertical cross-section of the faceplate 152A, corresponding to View A-A as referenced in FIG. 3C, in accordance with some embodiments.
Figure 3E:
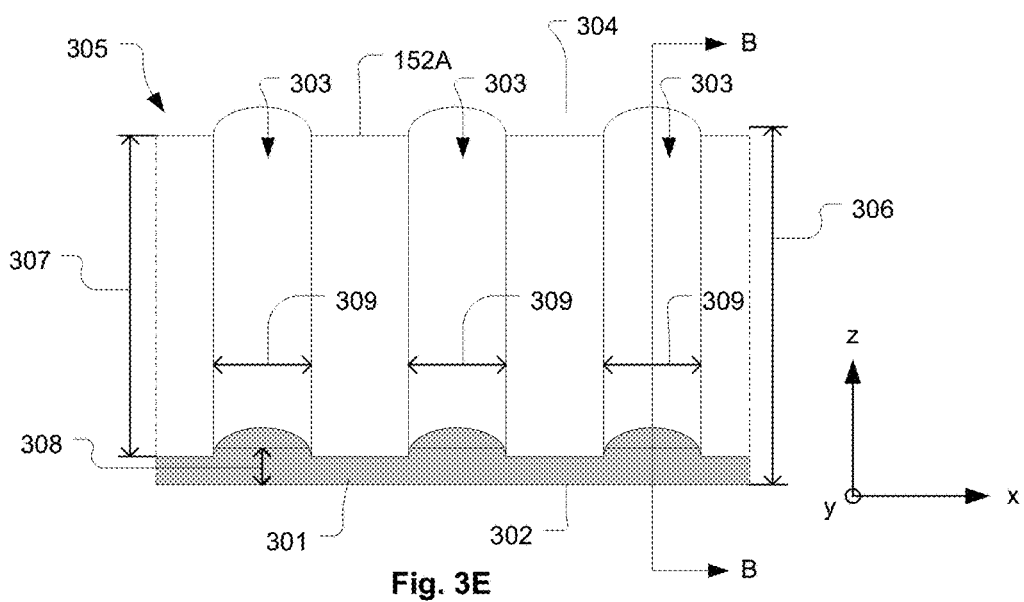
FIG. 3E shows a close-up vertical cross-section view of a region as identified in FIG. 3D, in accordance with some embodiments.

FIG. 3D shows a vertical cross-section of the faceplate 152A, corresponding to View A-A as referenced in FIG. 3C, in accordance with some embodiments. FIG. 3E shows a close-up vertical cross-section view of a region 305 as identified in FIG. 3D, in accordance with some embodiments. As shown in FIG. 3E, the faceplate 152A has an overall thickness 306 as measured between the top side 304 and the bottom side 302 of the faceplate 152A in the vertical direction, i.e., z-direction. In various embodiments, the overall thickness 306 of the faceplate 152A is set so that the faceplate 152A will provide sufficient thermal performance and maintain structural integrity during processing. In some embodiments, the overall thickness 306 of the faceplate 152A is within a range extending from about 0.25 inch to about 2 inches. In some embodiments, the overall thickness 306 of the faceplate is about 0.375 inch. However, it should be understood that in some embodiments the overall thickness 306 of the faceplate 152A can be either less than 0.25 inch or greater than 2 inches.

The holes 303 extend a distance 307 into the faceplate 152A from the top side 304 of the faceplate 152A. The distance 307 is a portion of the overall thickness 306 of the faceplate 152A. Also, the slots 301 extend a distance 308 into the faceplate 152A from the bottom side 302 of the faceplate 152A. The distance 308 is at least large enough to cause the slots 301 to intersect with the holes 303 that are spatially coincident with the slots 301. Therefore, the slots 301 of shallow depth are formed across the plasma-side (bottom side) of the faceplate 152A, with each slot 301 forming multiple small apertures where it intersects with the larger holes 303 of greater depth formed through the plenum-side (top side) of the faceplate 152A. It should be understood that the distance 308 is set small enough to enable reliable and economical fabrication of the slots 301. Therefore, the holes 303 (top side openings) are formed to extend through a portion (distance 307) of the overall thickness 306 of the faceplate 152A to intersect with at least one of the slots 301 (bottom side apertures) to form a corresponding flow path for process gas through the faceplate 152A.

In some embodiments, the distance 308, i.e., the depth of the slots 301, is within a range extending from about 0.001 inch to about 0.03 inch. In some embodiments, the distance 308 is about 0.03 inch. In some embodiments, the distance 308 is greater than 0.03 inch. In some embodiments, the distance 308 is less than or equal to about 50% of the overall thickness 306 of the faceplate 152A. In some embodiments, the distance 308 is less than or equal to about 10% of the overall thickness 306 of the faceplate 152A.

The example faceplate 152A includes 109 slots 301 and 7,043 holes 303. However, it should be understood that in various embodiments, the faceplate 152A can include any number of slots 301 and any number holes 303 as needed to have a prescribed process gas flow distribution into the plasma processing region 154, a prescribed pressure drop across the faceplate 152A, and a prescribed process gas flow conductance through the faceplate 152A, while maintaining sufficient mechanical and thermal performance of the faceplate 152A.

In some embodiments, the holes 303 have a circular shape in the horizontal direction, i.e., in the x-y plane. In these embodiments, each of the holes 303 has a diameter 309, as measured in the horizontal direction, i.e., in the x-y plane. In some embodiments, the diameter 309 is within a range extending from about 0.02 inch to about 0.09 inch. In some embodiments, the diameter 309 is greater than or equal to about 0.02 inch. In some embodiments, the diameter 309 is greater than or equal to about 0.04 inch. In some embodiments, the diameter 309 is greater than or equal to about 0.08 inch. In some embodiments, the diameter 309 is greater than or equal to about 0.1 inch. It should be understood that the diameter 309 can be larger than a diameter at which HCD is expected to occur, because it is the slots 301 that are sized to prevent HCD. It should also be understood that the diameter 309 can be specified to ease fabrication of the holes 303. Also, in various embodiments, a given hole 303 can be sized to intersect with either one slot 301 or with multiple slots 301. In some embodiments, the diameter 309 is sized to achieve a desired process flow conductance through the faceplate 152A. Also, in various embodiments, the spatial distribution of the holes 303 can be defined in different ways to achieve a desired process gas flow uniformity into the plasma processing region 154 and to accommodate formation of a total number of holes 303 required to achieve a target total process gas flow conductance through the faceplate 152A and a target pressure drop across the faceplate 152A. In some embodiments, a center-to-center spacing between adjacent holes 300 is about 0.16 inch. However, it should be understood that in other embodiments, the center-to-center spacing between adjacent holes 300 can be either less than about 0.16 inch or greater than about 0.16 inch.

Figure 3F:
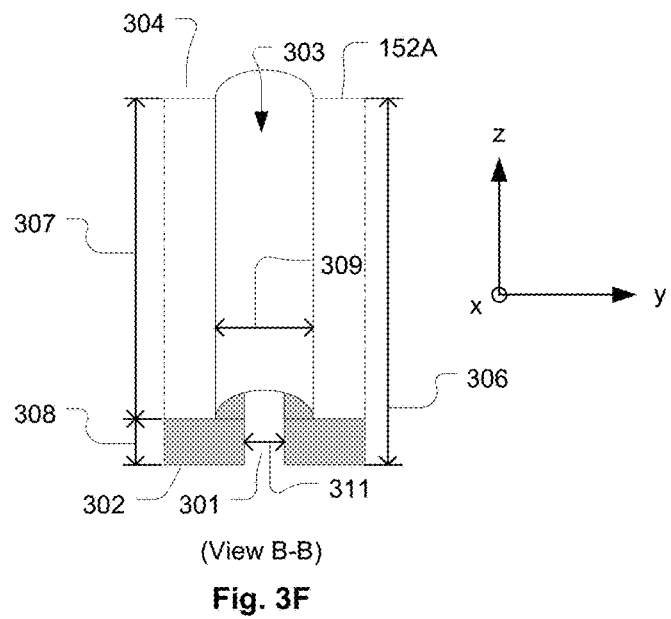
FIG. 3F shows a close-up vertical cross-section of the faceplate 152A, corresponding to View B-B as referenced in FIG. 3E, in accordance with some embodiments.

FIG. 3F shows a close-up vertical cross-section of the faceplate 152A, corresponding to View B-B as referenced in FIG. 3E, in accordance with some embodiments. FIG. 3F shows that each slot 301 is formed to have a slot opening distance 311 as measured horizontally, i.e., in the x-y plane, in a direction perpendicular to the parallel direction in which the slots 301 are oriented. The slot opening distance 311 defines an HCD suppression dimension of the bottom side aperture formed by the slot 301. More specifically, the slot opening distance 311 is sized small enough to prevent HCD formation with the slot 301. It should be understood that a cross-section of a given bottom side aperture in the x-y plane needs to have the HCD suppression dimension in just one direction to be effective at preventing HCD formation with the given bottom side aperture. For example, the slot opening distance 311 is in just one direction, but is sized small enough to prevent HCD formation within the slot 301. However, in some embodiments, a cross-section of a given bottom side aperture in the x-y plane can have the HCD suppression dimension in more than one direction. For example, if a given bottom side aperture has a circular cross-section in the x-y plane, a diameter of the cross-section of the given bottom side aperture defines the HCD suppression dimension.

It should be understood that the slot opening distance 311 necessary to prevent HCD formation within the slot 301 is dependent upon at least the process pressure and process RF power. Therefore, for some processes of higher process pressure and/or higher process RF power, the slot opening distance 311 may need to be smaller to prevent HCD formation within the slot 301. But, for some processes of lower process pressure and/or lower process RF power, the slot opening distance 311 may be larger and still be effective at preventing HCD formation within the slot 301. In some embodiments, the slot opening distance 311 is within a range extending from about 0.005 inch to about 0.04 inch. In some embodiments, the slot opening distance 311 is within a range extending from about 0.008 inch to about 0.018 inch. In some embodiments, the slot opening distance 311 is within a range extending up to about 0.008 inch. In some embodiments, the slot opening distance 311 is within a range extending up to about 0.08 inch. In some embodiments, the slot opening distance 311 is within a range extending up to about 0.1 inch. In some embodiments, the slot opening distance 311 is within a range extending up to about 0.2 inch. In some embodiments, the slot opening distance 311 is about 0.08 inch. In some embodiments, the slot opening distance 311 is about 0.01 inch. Again, the upper limit on the slot opening distance 311 is process dependent, i.e., dependent upon the pressure and/or RF power of the process, because the potential for HCD formation within a given slot 301 is process dependent. Additionally, a given slot 301 has an aspect ratio (width-to-depth) defined by the ratio of (distance 311/distance 308). In some embodiments, the aspect ratio of given slot 301 is less than or equal to about 1. In some embodiments, the aspect ratio of given slot 301 is less than or equal to about 0.3. In some embodiments, the aspect ratio of given slot 301 is less than or equal to about 0.1.

Figure 3H:
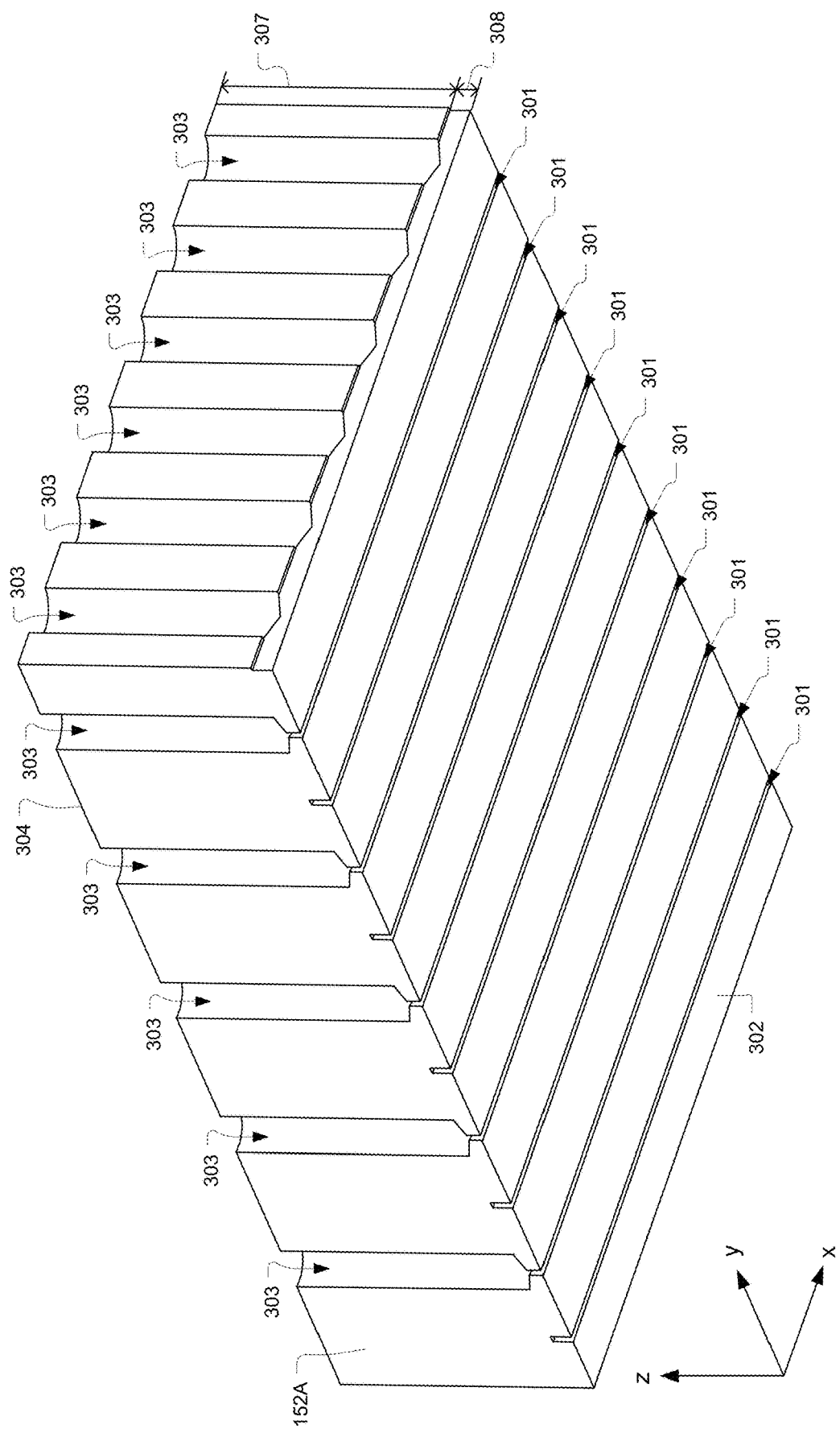
FIG. 3H shows a bottom isometric view of a portion of the faceplate 152A, in accordance with some embodiments.
Figure 3I:
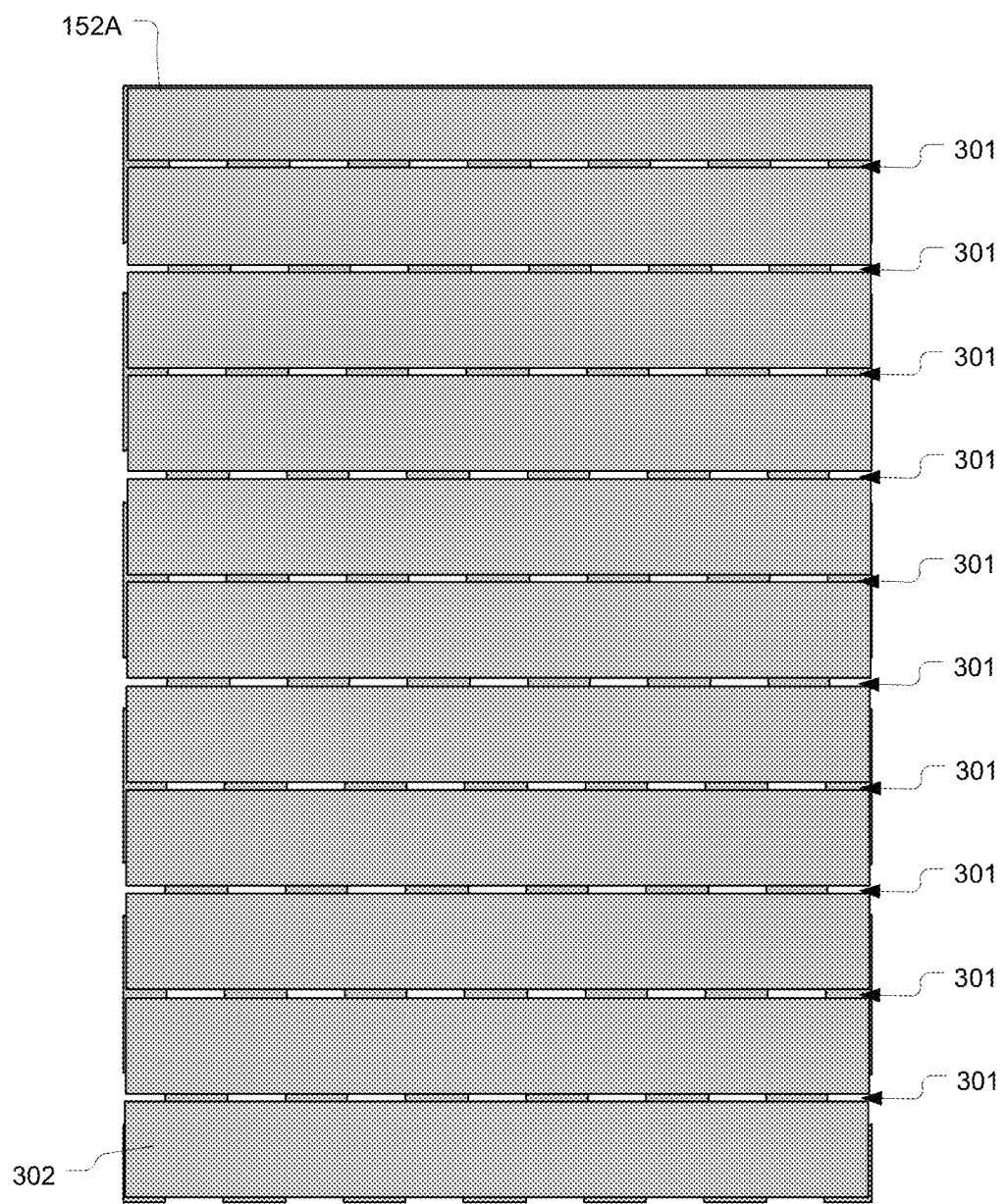
FIG. 3I shows a bottom view of a portion of the faceplate 152A, in accordance with some embodiments.
Figure 3J:
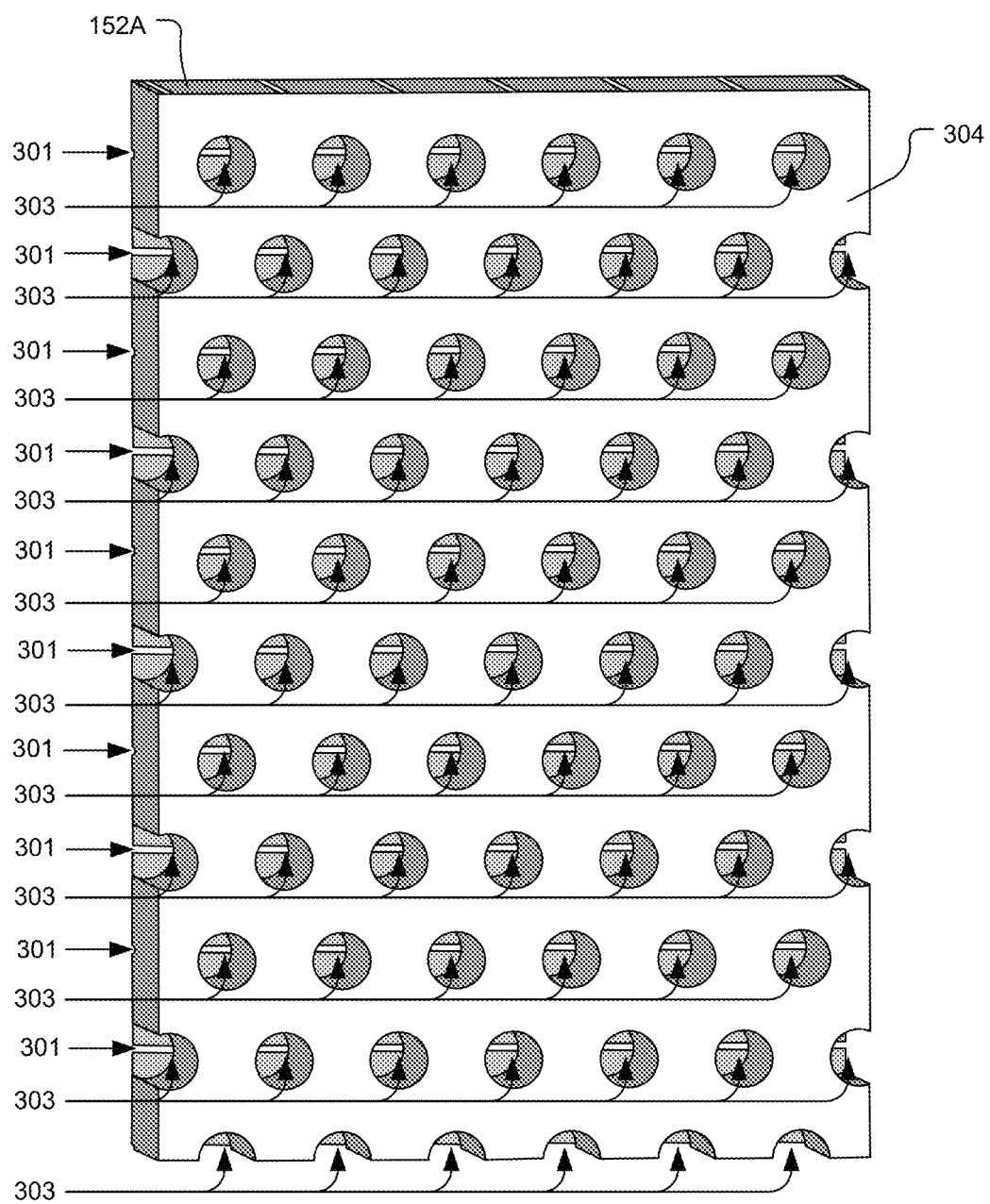
FIG. 3J shows a top isometric view of a portion of the faceplate 152A, in accordance with some embodiments.

FIG. 3G shows a bottom isometric view of the faceplate 152A as depicted in FIGS. 3A-3F, in accordance with some embodiments. FIG. 3H shows a bottom isometric view of a portion of the faceplate 152A, in accordance with some embodiments. FIG. 3I shows a bottom view of a portion of the faceplate 152A, in accordance with some embodiments. FIG. 3J shows a top isometric view of a portion of the faceplate 152A, in accordance with some embodiments. In some embodiments, the faceplate 152A is formed of aluminum, such as 6061 aluminum or 3003 aluminum, among other aluminum materials. In some embodiments, the faceplate 152A is formed of a ceramic material, such as aluminum oxide ($Al_2O_3$), aluminum nitride (AlN), or yttria ($Y_2O_3$), among other ceramic materials. Also, in some embodiments, the faceplate 152A is formed of stainless steel. It should be understood that in various embodiments, the faceplate 152A can be formed of essentially any material that: a) is chemically compatible with the process gas chemistry and with materials present in the plasma processing region 154 during processing, b) has sufficient mechanical strength to maintain structural integrity in the presence of pressure differentials that can exist between the top and bottom side of the faceplate 152A during processing, c) has sufficient thermal properties to satisfy thermal performance requirements during processing, and d) has sufficient electrical properties to satisfy electrical performance requirements during processing. Also, in some embodiments, the bottom side 302 of the faceplate 152A that faces toward the plasma processing region 154 can be coated with a coating such as metal oxide, e.g., aluminum oxide ($Al_2O_3$), among other coating materials. In various embodiments, the coating material applied to the bottom side 302 of the faceplate 152A should remain adhered to the faceplate 152A during processing and should be chemically compatible with the process gas chemistry and with materials present in the plasma processing region 154 during processing.

In some embodiments, the slots 301 can be formed in the faceplate 152A by a sawing process, e.g., using a splitting saw. In some embodiments, the slots 301 can be formed in the faceplate 152A by and EDM process, such as wire EDM or sinker EDM. In some embodiments, the slots 301 can be formed in the faceplate 152A by a cutting process, such as water jet cutting, or plasma cutting, or other type of cutting process. In some embodiments, the slots 301 can be formed in the faceplate 152A by a mechanical machining process. It should be appreciated that the amount of material that is removed from the faceplate 152A in forming the slots 301 is less than an amount of material that would be removed from the faceplate 152A if through-holes of uniform diameter were formed through the faceplate 152A instead of the slots 301 to achieve a same overall process gas flow conductance through the faceplate 152A. Therefore, use of the slots 301 to define apertures on the bottom side of the faceplate 152A reduces an overall amount of material removed from the faceplate 152A, and provides corresponding improvement in faceplate 152A fabrication time and expense.

In some embodiments, the faceplate 152A is formed monolithically such that the slots 301 and the holes 303 are formed within a single monolithic plate of material. In some embodiments, the faceplate 152A is formed as a combination of plates. For example, in some embodiments, the faceplate 152A includes a lower plate and an upper plate, where the lower plate has a thickness equal to the distance 308, and the upper plate has a thickness equal to the distance 307. In these embodiments, the slots 301 are formed within the lower plate, and the holes 303 are formed within the upper plate. In these embodiments, the upper plate and lower plate are secured together so that the slots 301 and holes 303 align to form the faceplate 152A. Also, in these embodiments, the upper plate and the lower plate are secured together in thermal and electrical contact with each other to form the faceplate 152A. In some embodiments, the faceplate 152A is a replaceable component within the showerhead 150.

Figure 3K:
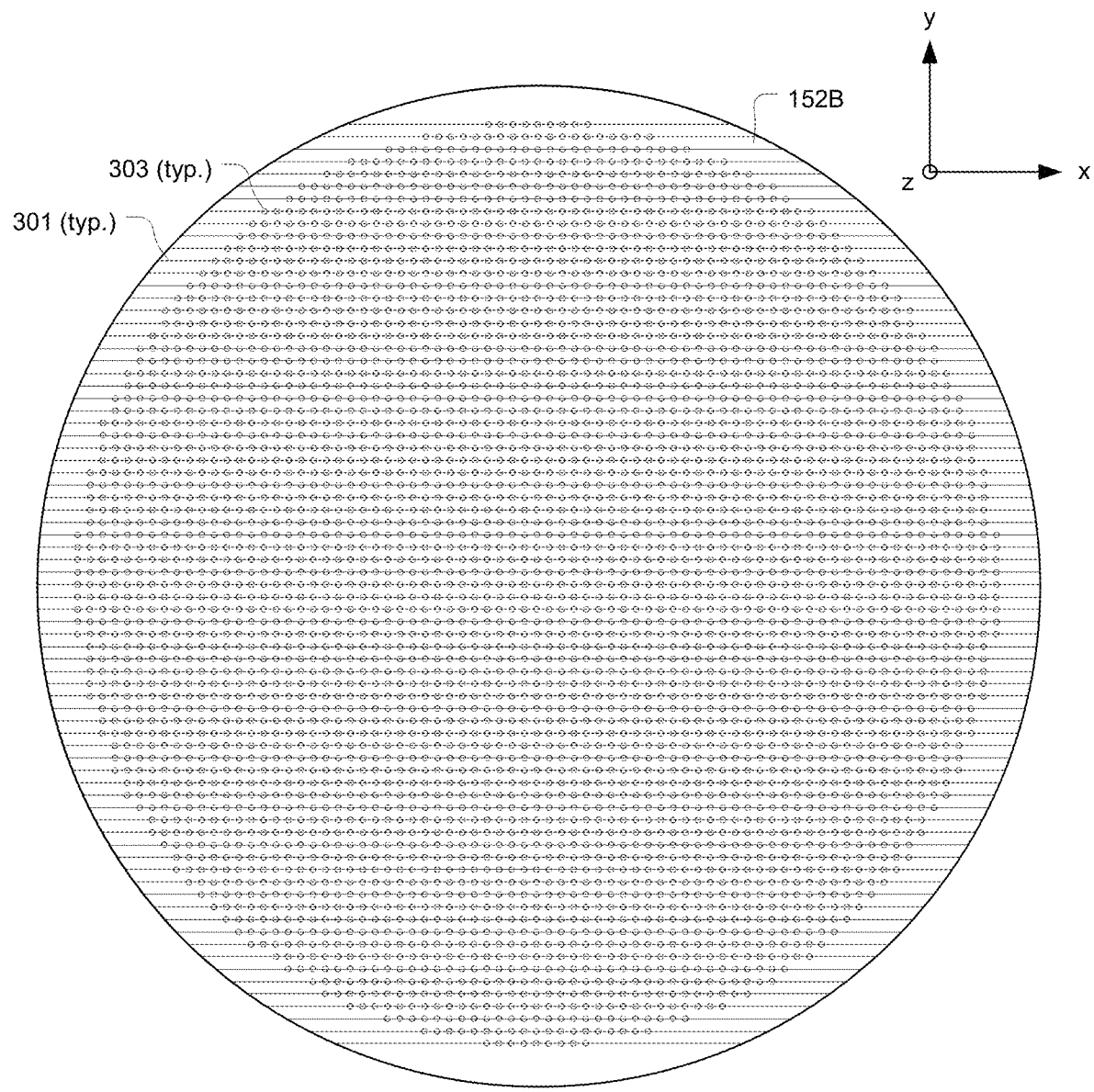
FIG. 3K shows a faceplate 152B that has the holes arranged in a square lattice array, in accordance with some embodiments.

As previously mentioned, in various embodiments, the holes 303 can be arranged in many different patterns and still align to intersect with the slots 301. FIG. 3K shows a faceplate 152B that has the holes 303 arranged in a square lattice array, in accordance with some embodiments. FIG. 3K is a transparent view of the faceplate 152B that shows the arrangement of parallel slots 301 and the square lattice array arrangement of holes 303 visible with respect to each other. At some depth within the faceplate 152B, each of the holes 303 intersects with corresponding one of the slots 301 to form a fluid passage through the faceplate 152B, through which process gas can flow into the plasma processing region 154.

Figure 3L:
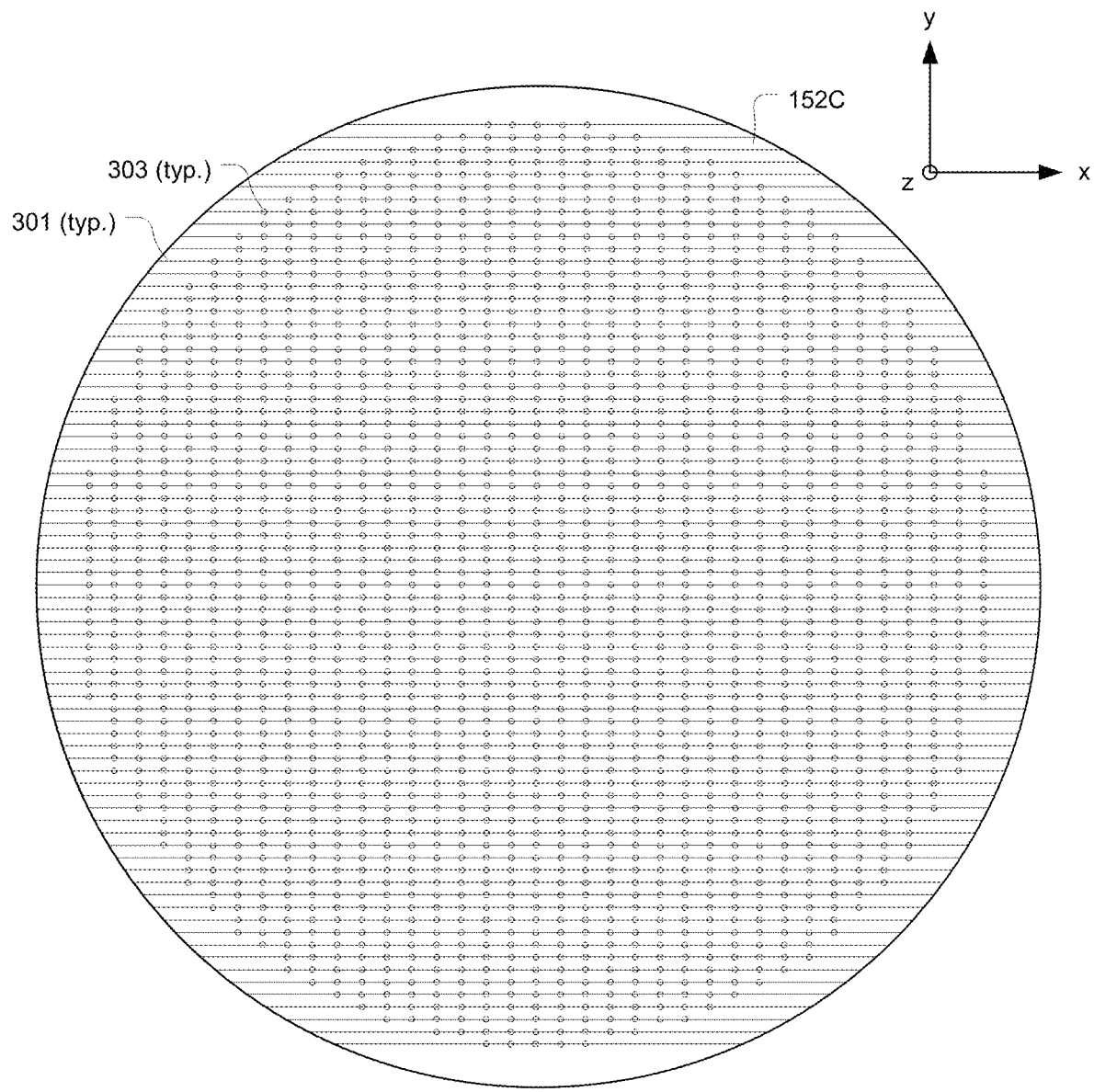
FIG. 3L shows a faceplate 152C that has the holes arranged in a rectangular lattice array, in accordance with some embodiments.

FIG. 3L shows a faceplate 152C that has the holes 303 arranged in a rectangular lattice array, in accordance with some embodiments. FIG. 3L is a transparent view of the faceplate 152C that shows the arrangement of parallel slots 301 and the rectangular lattice array arrangement of holes 303 visible with respect to each other. At some depth within the faceplate 152C, each of the holes 303 intersects with corresponding one of the slots 301 to form a fluid passage through the faceplate 152C through which process gas can flow into the plasma processing region 154.

Figure 3M:
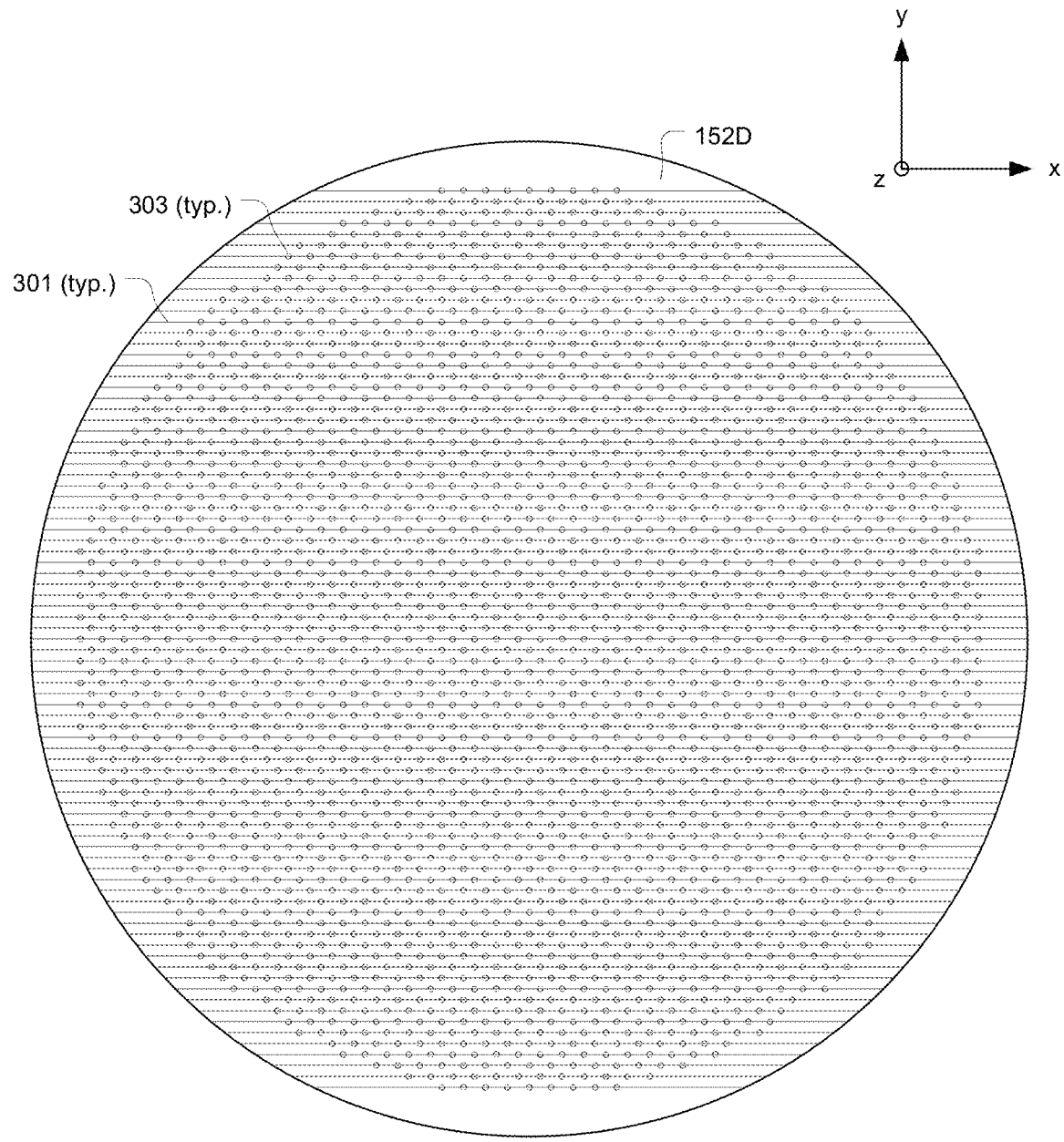
FIG. 3M shows a faceplate 152D that has the holes arranged in a rhombic lattice array, in accordance with some embodiments.

FIG. 3M shows a faceplate 152D that has the holes 303 arranged in a rhombic lattice array, in accordance with some embodiments. FIG. 3M is a transparent view of the faceplate 152D that shows the arrangement of parallel slots 301 and the rhombic lattice array arrangement of holes 303 visible with respect to each other. At some depth within the faceplate 152D, each of the holes 303 intersects with corresponding one of the slots 301 to form a fluid passage through the faceplate 152D through which process gas can flow into the plasma processing region 154.

Figure 3N:
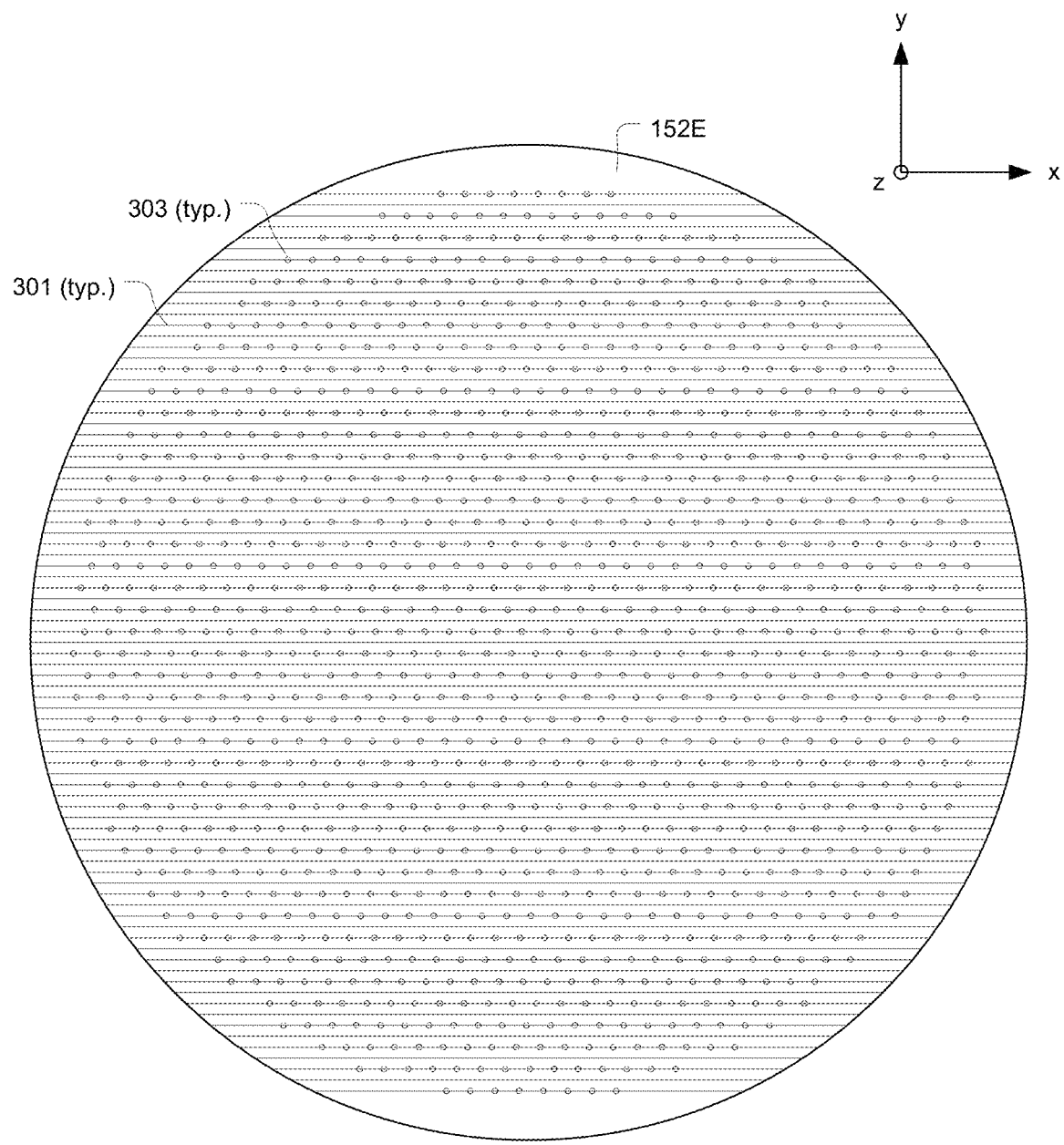
FIG. 3N shows a faceplate 152E that has the holes arranged in a parallelogrammic lattice array, in accordance with some embodiments.

FIG. 3N shows a faceplate 152E that has the holes 303 arranged in a parallelogrammic lattice array, in accordance with some embodiments. FIG. 3N is a transparent view of the faceplate 152E that shows the arrangement of parallel slots 301 and the parallelogrammic lattice array arrangement of holes 303 visible with respect to each other. At some depth within the faceplate 152E, each of the holes 303 intersects with corresponding one of the slots 301 to form a fluid passage through the faceplate 152E through which process gas can flow into the plasma processing region 154.

Figure 3O:
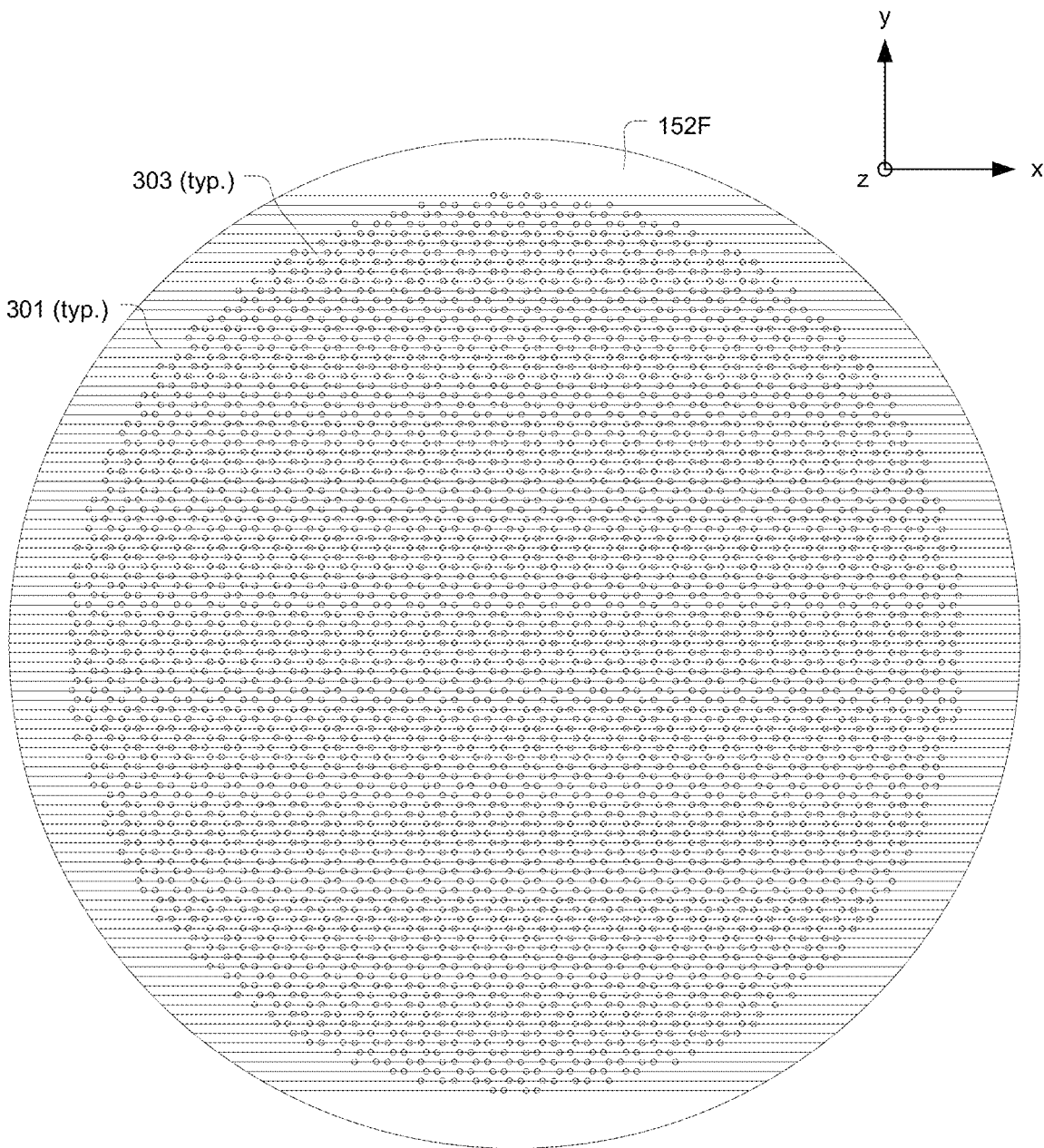
FIG. 3O shows a faceplate 152F that has the holes arranged in customized pattern, in accordance with some embodiments.
Figure 3P:
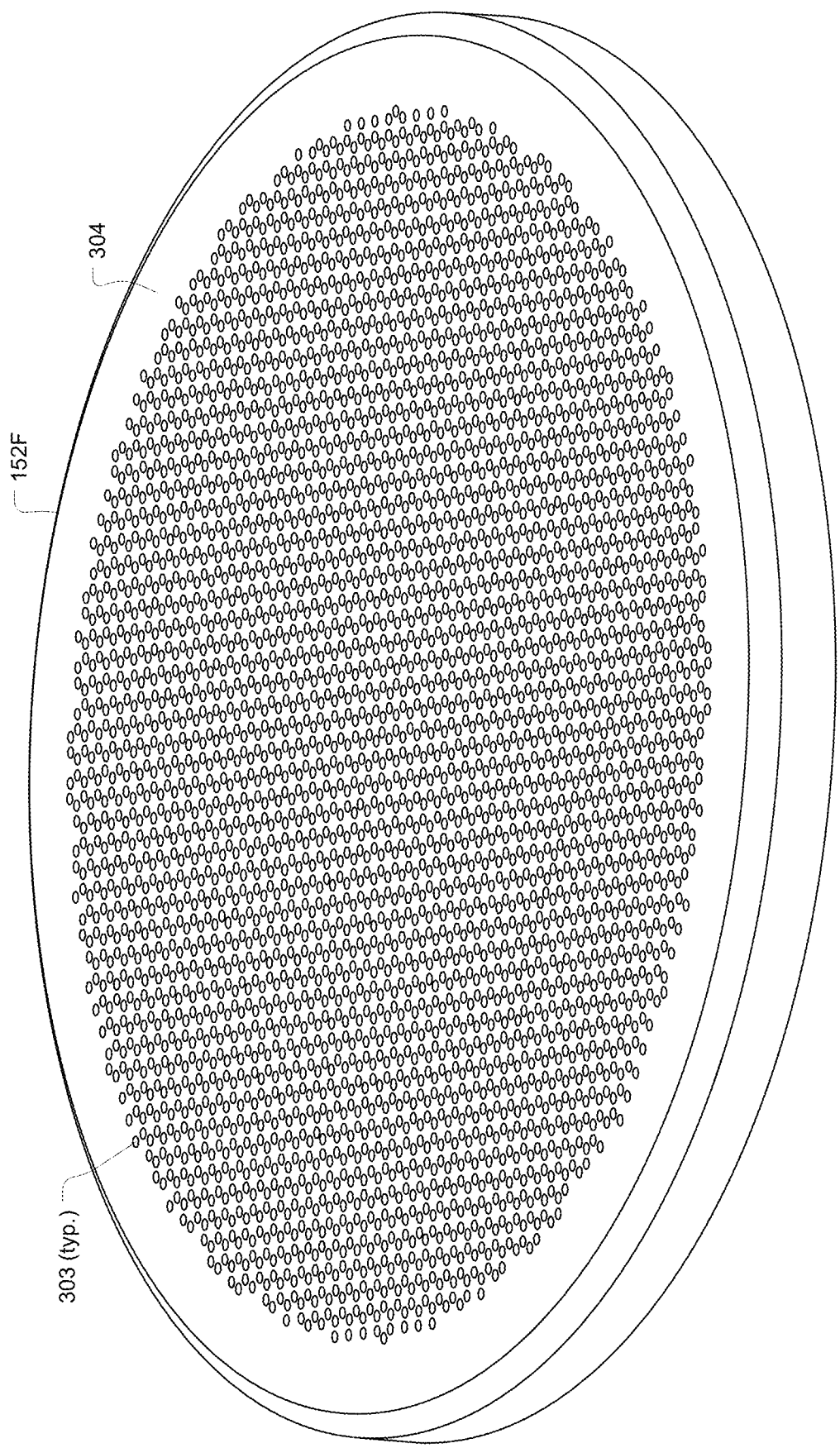
FIG. 3P shows an isometric top view of the faceplate 152F, in accordance with some embodiments.
Figure 3Q:
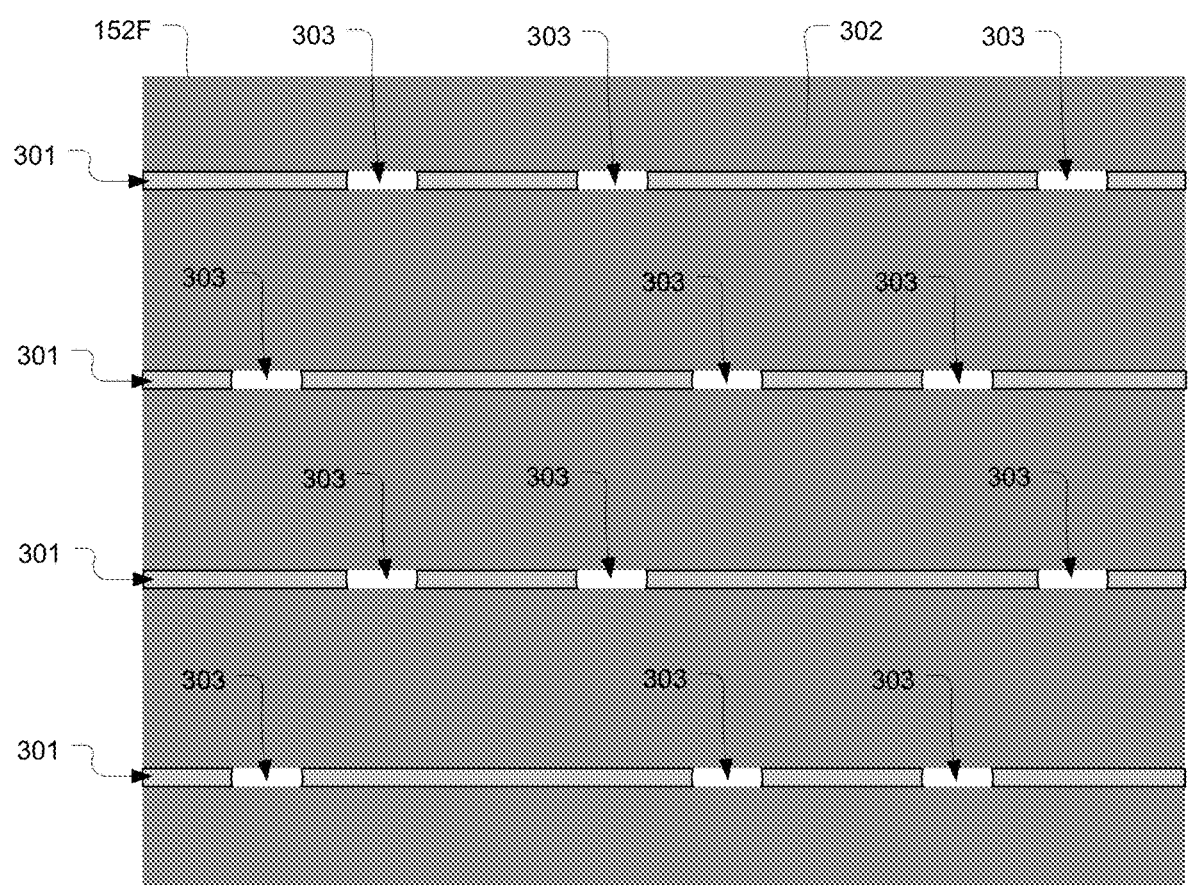
FIG. 3Q shows a bottom view of a portion of the faceplate 152F, in accordance with some embodiments.

FIG. 3O shows a faceplate 152F that has the holes 303 arranged in customized pattern, in accordance with some embodiments. FIG. 3O is a transparent view of the faceplate 152F that shows the arrangement of parallel slots 301 and the customized pattern arrangement of holes 303 visible with respect to each other. At some depth within the faceplate 152F, each of the holes 303 intersects with corresponding one of the slots 301 to form a fluid passage through the faceplate 152F through which process gas can flow into the plasma processing region 154. FIG. 3P shows an isometric top view of the faceplate 152F, in accordance with some embodiments. FIG. 3Q shows a bottom view of a portion of the faceplate 152F, in accordance with some embodiments.

In various embodiments, each aperture, e.g., slot 101, formed in the bottom side 302 of the modified faceplate (152A-152T) that is in fluid communication with a corresponding hole 303 can have one of many different cross-sectional shapes. More specifically, in various embodiments, the cross-sectional shape of a given aperture formed in the bottom side 302 of the modified faceplate (152A-152T) of the showerhead 150 can be any shape suitable for providing a desired shaped "jet" of process gas flow through the given aperture into the plasma processing region 154. For example, a given aperture can have various cross-sectional shapes within the plane of the bottom side 302 of the modified faceplate (152A-152T), such as a rectangular cross-sectional shape, a curved cross-sectional shape, a circular cross-section shape, a bent cross-sectional shape, among other cross-sectional shapes, to achieve a desired shape of process gas "jet" through the given aperture. Also, in some embodiments, the apertures formed in the bottom side 302 of the modified faceplate (152A-152T) can have a same cross-sectional shape across the bottom side 302 of the modified faceplate (152A-152T). And, in some embodiments, the apertures formed in the bottom side 302 of the modified faceplate (152A-152T) can have different cross-sectional shapes across the bottom side 302 of the modified faceplate (152A-152T). Regardless of the cross-sectional shape(s) of the apertures across the bottom side 302 of the modified faceplate (152A-152T), each aperture formed in the bottom side 302 of the modified faceplate (152A-152T) has an HCD suppression dimension in at least one direction. Also, in various embodiments, the apertures formed within the bottom side 302 of the modified faceplate (152A-152T) can be tuned so that the overall process gas flow conductance through the modified faceplate (152A-152T) substantially matches a target overall process gas flow conductance value. In some embodiments, the target overall process gas flow conductance value through the modified faceplate (152A-152T) substantially matches an overall process gas flow conductance value through a prior faceplate design that has been used in previous plasma processing operations. In some embodiments, depending on the process requirements, the target overall process gas flow conductance value through the modified faceplate (152A-152T) can be higher or lower than the overall process gas flow conductance value through a prior faceplate design.

Figures 1, 4A:
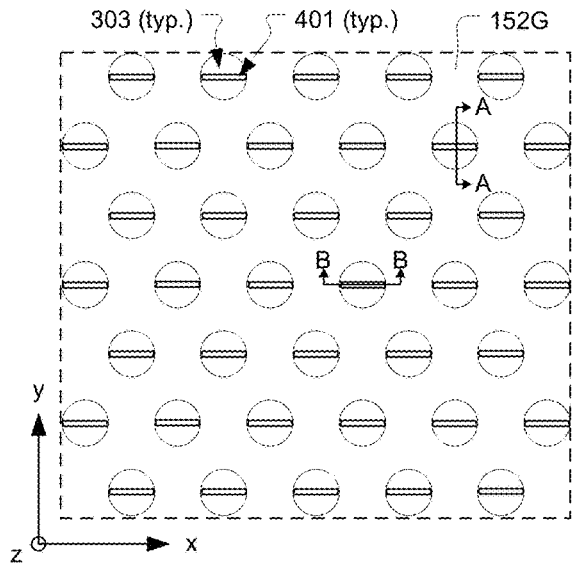
Figures 2, 4A:
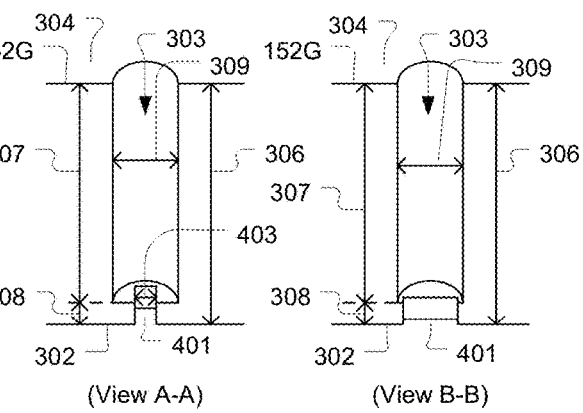
Figures 3, 4A:
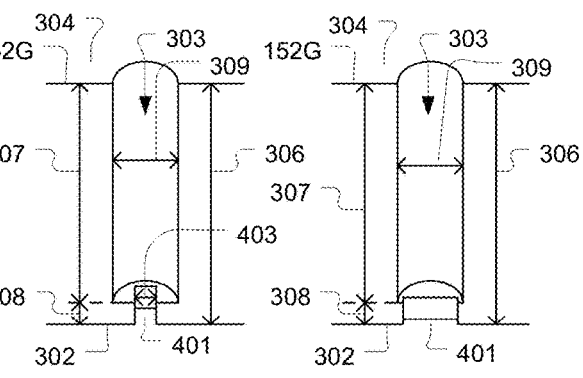

FIG. 4A-1 shows a bottom view of a portion of a modified faceplate 152G that includes apertures 401 of rectangular cross-sectional shape that are separately formed at each hole 303 location, in accordance with some embodiments. It should be understood that FIG. 4A-1 shows a transparent view of the faceplate 152G so that the slots 401 and the holes 303 are visible with respect to each other. FIG. 4A-2 shows a vertical cross-section view through a hole 303 of the modified faceplate 152G corresponding to View A-A in FIG. 4A-1, in accordance with some embodiments. FIG. 4A-3 shows a vertical cross-section view through a hole 303 of the modified faceplate 152G corresponding to View B-B in FIG. 4A-1, in accordance with some embodiments. In the faceplate 152G, the apertures 401 are essentially just the portions of the slots 101 that occur at the locations of the holes 303 in the faceplate 152A of FIG. 3C. Each aperture 401 has an HCD suppression dimension 403 measured in a direction across a shortest span of the aperture 401. In FIG. 4A-2 the HCD suppression dimension 403 is dependent upon at least the process pressure and process RF power. Therefore, for some processes of higher process pressure and/or higher process RF power, the HCD suppression dimension 403 may need to be smaller to prevent HCD formation within the aperture 401. But, for some processes of lower process pressure and/or lower process RF power, the HCD suppression dimension 403 may be larger and still be effective at preventing HCD formation within the aperture 401. In various embodiments, the HCD suppression dimension 403 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 403 is process dependent, i.e., dependent upon the pressure and/or RF power of the process, because the potential for HCD formation within a given aperture 401 is process dependent.

Additionally, a given aperture 401 has an aspect ratio (width-to-depth) defined by the ratio of (HCD suppression dimension 403/distance 308). In various embodiments, the aspect ratio of given aperture 401 is less than or equal to about 1, or less than or equal to about 0.3, or less than or equal to about 0.1. In various embodiments, the apertures 401 can be formed by an EDM process (e.g., sinker EDM or wire EDM), or by a mechanical machining process, or by a laser drilling process, or by a cutting process (e.g., water jet cutting, plasma cutting, or other type of cutting process).

Figure 4B:
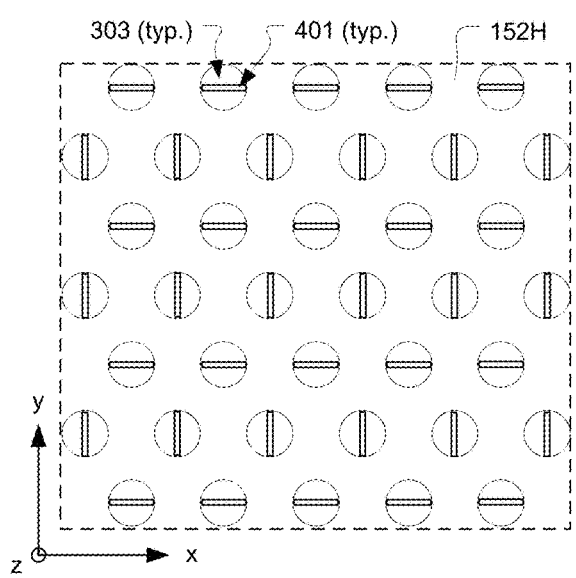
FIG. 4B shows the apertures of rectangular cross-sectional shape separately formed at each hole location within a modified faceplate 152H, with the apertures oriented in a non-parallel and ordered manner with respect to each other, in accordance with some embodiments.
Figure 4C:
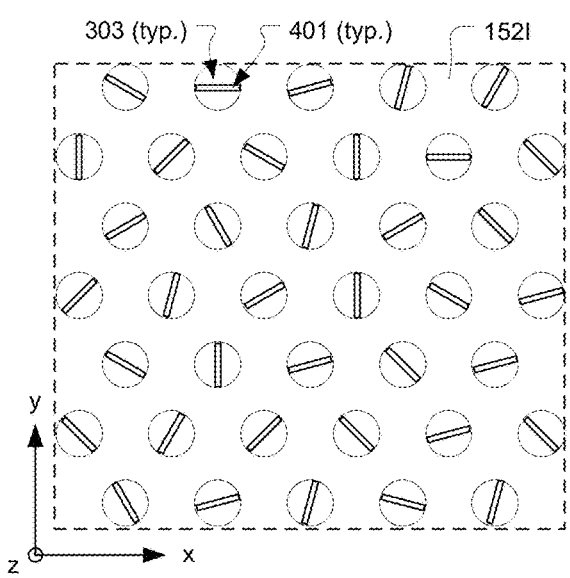
FIG. 4C shows the apertures of rectangular cross-sectional shape separately formed at each hole location within a modified faceplate 152I, with the apertures oriented in a non-parallel and random manner with respect to each other, in accordance with some embodiments.

FIG. 4A-1 shows the apertures 401 of rectangular cross-sectional shape oriented parallel with each other. However, in some embodiments, the apertures 401 can be oriented in a non-parallel manner with respect to each other. In various embodiments, the non-parallel manner of orientation of the apertures 401 can be either ordered or random. FIG. 4B shows the apertures 401 of rectangular cross-sectional shape separately formed at each hole 303 location within a modified faceplate 152H, with the apertures 401 oriented in a non-parallel and ordered manner with respect to each other, in accordance with some embodiments. It should be understood that FIG. 4B shows a transparent view of the faceplate 152H so that the apertures 401 and the holes 303 are visible with respect to each other. FIG. 4C shows the apertures 401 of rectangular cross-sectional shape separately formed at each hole 303 location within a modified faceplate 152I, with the apertures 401 oriented in a non-parallel and random manner with respect to each other, in accordance with some embodiments. It should be understood that FIG. 4C shows a transparent view of the faceplate 152I so that the apertures 401 and the holes 303 are visible with respect to each other.

In the modified faceplates 152G, 152H, and 152I, the holes 303 are arranged in the hexagonal lattice array, like the holes 303 in the faceplate 152A of FIG. 3C. However, it should be understood that in other embodiments, the holes 303 in the modified faceplates 152G, 152H, and 152I can be arranged in another pattern, such as in the square lattice array as shown in FIG. 3K, or in the rectangular lattice array as shown in FIG. 3L, or in the rhombic lattice array as shown in FIG. 3M, or in the parallelogrammic lattice array as shown in FIG. 3N, or in essentially any another customized pattern, e.g., the customized pattern shown in FIG. 3O.

Figures 1, 5A:
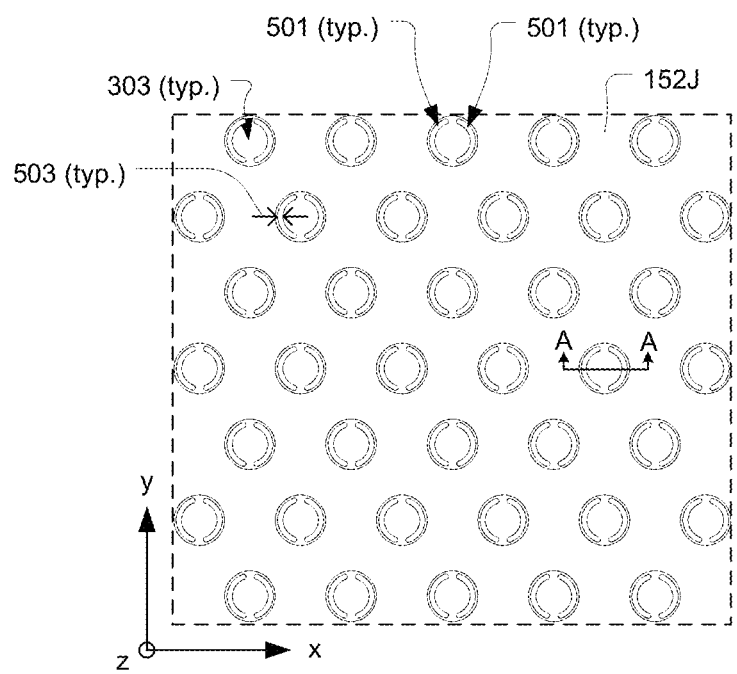
Figures 2, 5A:
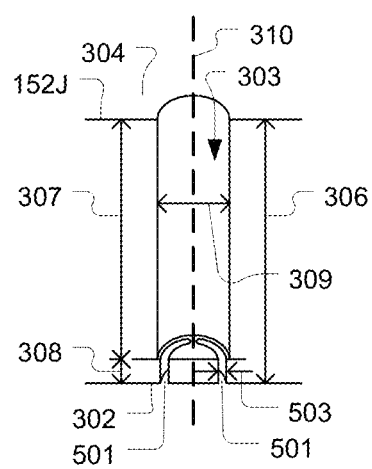

FIG. 5A-1 shows a bottom view of a portion of a modified faceplate 152J that includes apertures 501 of curved cross-sectional shape that are separately formed at each hole 303 location, in accordance with some embodiments. It should be understood that FIG. 5A-1 shows a transparent view of the faceplate 152J so that the slots 501 and the holes 303 are visible with respect to each other. FIG. 5A-2 shows a vertical cross-section view through a hole 303 of the modified faceplate 152J corresponding to View A-A in FIG. 5A-1, in accordance with some embodiments. In the faceplate 152J, each of the apertures 501 has a curved cross-sectional shape within the plane of the bottom side 302 of the faceplate 152J that is C-shaped. Also, the example of FIG. 5A-1 shows two apertures 501 per hole 303. In some embodiments, the apertures 501 are defined so that the "jet" of process gas that flows out of a pair of apertures 501 corresponding to a given hole 303 is substantially axisymmetric in shape. Each aperture 501 has an HCD suppression dimension 503 measured in a direction across a shortest span of the aperture 501.

Figure 5B:
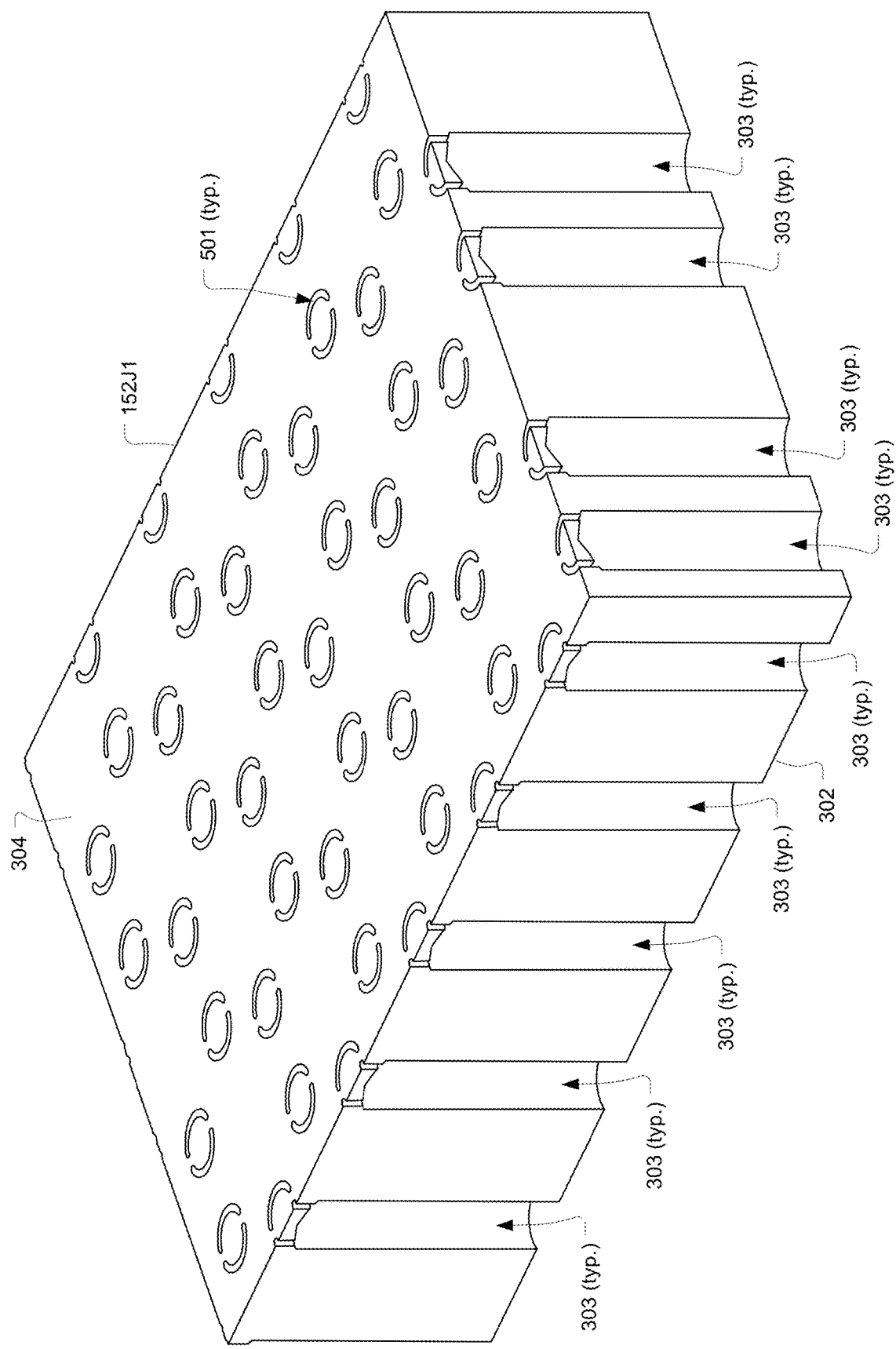
FIG. 5B shows a bottom isometric view of a portion of a modified faceplate 152J1 in which the holes are arranged in the customized pattern as shown in FIGS. 3O and 3P, in accordance with some embodiments.

In the modified faceplate 152J of FIG. 5A-1, the holes 303 are arranged in the hexagonal lattice array, like the holes 303 in the faceplate 152A of FIG. 3C. However, it should be understood that in other embodiments, the holes 303 in the modified faceplate 152J can be arranged in another pattern, such as in the square lattice array as shown in FIG. 3K, or in the rectangular lattice array as shown in FIG. 3L, or in the rhombic lattice array as shown in FIG. 3M, or in the parallelogrammic lattice array as shown in FIG. 3N, or in essentially any another customized pattern, e.g., the customized pattern shown in FIG. 3O. For example, FIG. 5B shows a bottom isometric view of a portion of a modified faceplate 152J1 in which the holes 303 are arranged in the customized pattern as shown in FIGS. 3O and 3P, in accordance with some embodiments.

The HCD suppression dimension 503 is dependent upon at least the process pressure and process RF power. Therefore, for some processes of higher process pressure and/or higher process RF power, the HCD suppression dimension 503 may need to be smaller to prevent HCD formation within the aperture 501. But, for some processes of lower process pressure and/or lower process RF power, the HCD suppression dimension 503 may be larger and still be effective at preventing HCD formation within the aperture 501. In various embodiments, the HCD suppression dimension 503 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 503 is process dependent, i.e., dependent upon the pressure and/or RF power of the process, because the potential for HCD formation within a given aperture 501 is process dependent. Additionally, a given aperture 501 has an aspect ratio (width-to-depth) defined by the ratio of (HCD suppression dimension 503/distance 308). In various embodiments, the aspect ratio of given aperture 501 is less than or equal to about 1, or less than or equal to about 0.3, or less than or equal to about 0.1. In various embodiments, the apertures 501 can be formed by an EDM process (e.g., sinker EDM or wire EDM), or by a mechanical machining process, or by a laser drilling process, or by a cutting process (e.g., water jet cutting, plasma cutting, or other type of cutting process).

In the modified faceplate 152J, each pair of apertures 501 per hole 303 is oriented in a like manner for each hole 303. More specifically, each pair of apertures 501 for a given hole 303 has a particular azimuthal orientation about an axis 310 of the given hole 303, where the axis 310 of the given hole 303 extends in the z-direction down the center of the given hole 303. In the modified faceplates 152J and 152J1, each pair of apertures 501 per hole 303 across the faceplates 152J and 152J1 has a substantially same azimuthal orientation about the axis 310 of the corresponding hole 303. However, in some embodiments, the apertures 501 can be defined so that pairs of apertures 501 for different holes 303 have different azimuthal orientations about the axis 310 of their corresponding hole 303.

Figure 5C:
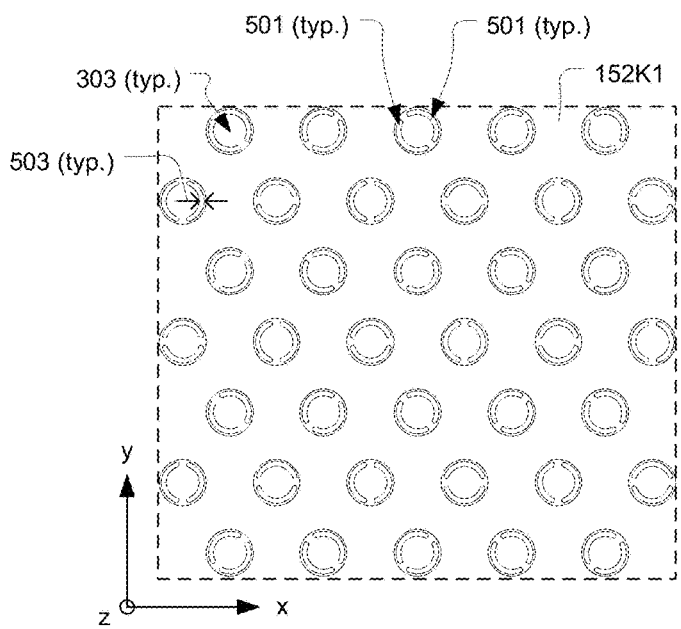
FIG. 5C shows apertures of curved cross-sectional shape that are separately formed at each hole location within a modified faceplate 152K1 and that have varying azimuthal orientations about the axis of their corresponding hole, in accordance with some embodiments.
Figure 5D:
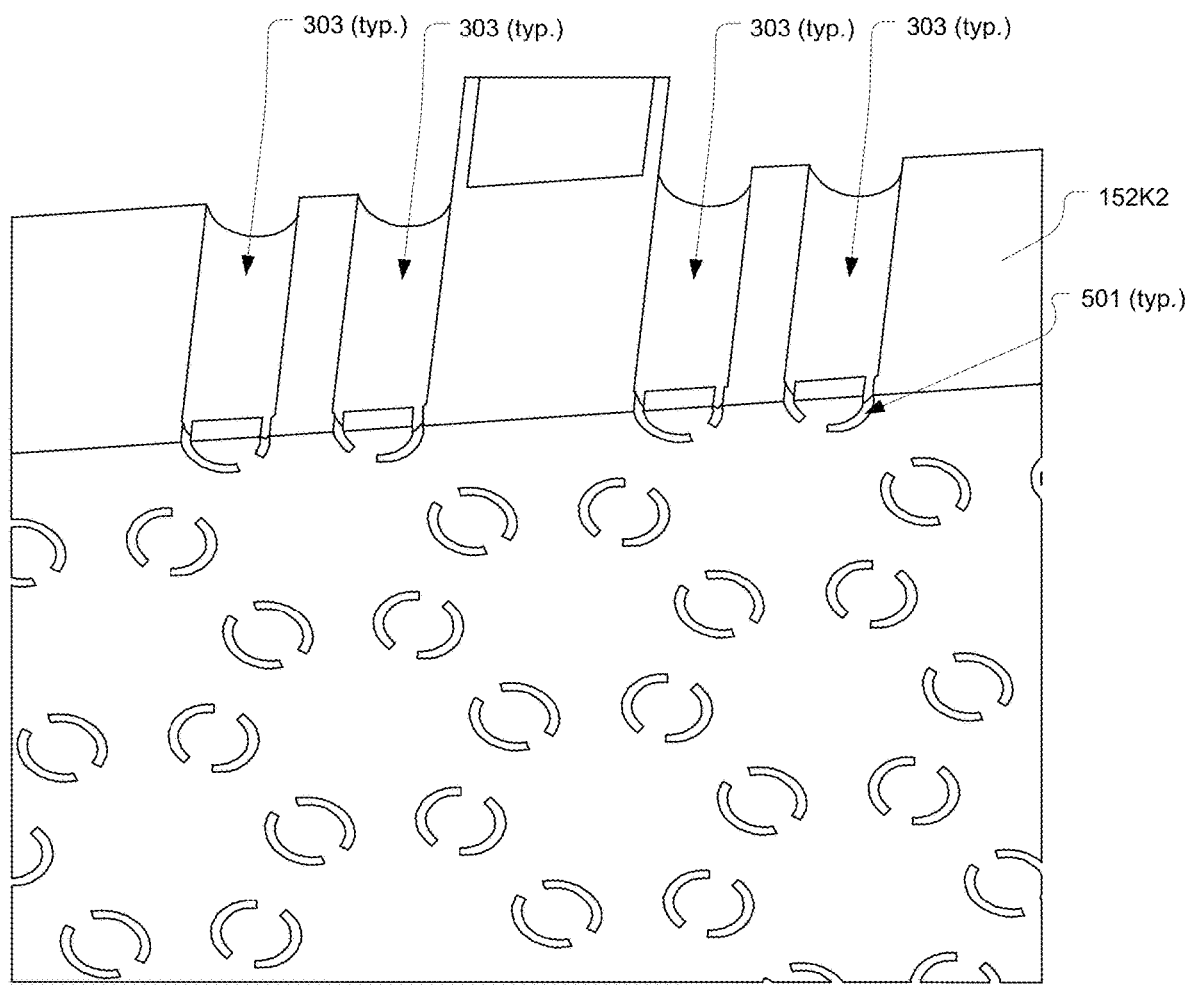
FIG. 5D shows a bottom isometric view of a portion of a modified faceplate 152K2, in accordance with some embodiments.

FIG. 5C shows apertures 501 of curved cross-sectional shape that are separately formed at each hole 303 location within a modified faceplate 152K1 and that have varying azimuthal orientations about the axis 310 of their corresponding hole 303, in accordance with some embodiments. It should be understood that FIG. 5C shows a transparent view of the faceplate 152K1 so that the apertures 501 and the holes 303 are visible with respect to each other. In some embodiments, the varying azimuthal orientations of the different pairs of apertures 501 about the axis 310 of their corresponding hole 303 can be defined to avoid imparting directionality to the process gas flow. FIG. 5D shows a bottom isometric view of a portion of a modified faceplate 152K2, in accordance with some embodiments. Both of the modified faceplates 152K1 and 152K2 include the apertures 501 of curved cross-sectional shape that are separately formed at each hole 303 location. The modified faceplate 152K1 has the holes 303 arranged in accordance with a hexagonal lattice pattern, such as shown in FIG. 3B. The modified faceplate 152K2 has the holes 303 arranged in accordance with a customized lattice pattern, such as shown in FIGS. 3O and 3P.

FIG. 6A-1 shows apertures 601 of bracket cross-sectional shape that are separately formed at each hole 303 location within a modified faceplate 152L, in accordance with some embodiments. It should be understood that FIG. 6A-1 shows a transparent view of the faceplate 152L so that the apertures 601 and the holes 303 are visible with respect to each other. FIG. 6A-2 shows a vertical cross-section view through a hole 303 of the modified faceplate 152L corresponding to View A-A in FIG. 6A-1, in accordance with some embodiments. The modified faceplate 152L includes two apertures 601 per hole 303. Each aperture 601 has an HCD suppression dimension 603 measured in a direction across a shortest span of the aperture 601. In FIG. 6A-1 the HCD suppression dimension 603 is dependent upon at least the process pressure and process RF power. Therefore, for some processes of higher process pressure and/or higher process RF power, the HCD suppression dimension 603 may need to be smaller to prevent HCD formation within the aperture 601. But, for some processes of lower process pressure and/or lower process RF power, the HCD suppression dimension 603 may be larger and still be effective at preventing HCD formation within the aperture 601. In various embodiments, the HCD suppression dimension 603 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 603 is process dependent, i.e., dependent upon the pressure and/or RF power of the process, because the potential for HCD formation within a given aperture 601 is process dependent. Additionally, a given aperture 601 has an aspect ratio (width-to-depth) defined by the ratio of (HCD suppression dimension 603/distance 308). In various embodiments, the aspect ratio of given aperture 601 is less than or equal to about 1, or less than or equal to about 0.3, or less than or equal to about 0.1. In various embodiments, the apertures 601 can be formed by an EDM process (e.g., sinker EDM or wire EDM), or by a mechanical machining process, or by a laser drilling process, or by a cutting process (e.g., water jet cutting, plasma cutting, or other type of cutting process).

In the example of FIG. 6A-1, each pair of apertures 601 per hole 303 is oriented in a like manner for each hole 303. More specifically, each pair of apertures 601 for a given hole 303 has a particular azimuthal orientation about the axis 310 of the given hole 303. In the example of FIG. 6A-1, each pair of apertures 601 per hole 303 across the faceplate 152L has a substantially same azimuthal orientation about the axis 310 of the corresponding hole 303. However, in some embodiments, the apertures 601 can be defined so that pairs of apertures 601 for different holes 303 have different azimuthal orientations about the axis 310 of their corresponding hole 303.

FIG. 6B shows apertures 601 of bracket cross-sectional shape that are separately formed at each hole 303 location within a modified faceplate 152M and that have varying azimuthal orientations about the axis 310 of their corresponding hole 303, in accordance with some embodiments. It should be understood that FIG. 6B shows a transparent view of the faceplate 152M so that the apertures 601 and the holes 303 are visible with respect to each other. In some embodiments, the varying azimuthal orientations of the different pairs of apertures 601 about the axis 310 of their corresponding hole 303 can be defined to avoid imparting directionality to the process gas flow.

In the modified faceplates 152L and 152M, the holes 303 are arranged in the hexagonal lattice array, like the holes 303 in the faceplate 152A of FIG. 3C. However, it should be understood that in other embodiments, the holes 303 in the modified faceplates 152L and 152M can be arranged in another pattern, such as in the square lattice array as shown in FIG. 3K, or in the rectangular lattice array as shown in FIG. 3L, or in the rhombic lattice array as shown in FIG. 3M, or in the parallelogrammic lattice array as shown in FIG. 3N, or in essentially any another customized pattern, e.g., the customized pattern shown in FIG. 3O.

Figures 1, 7A:
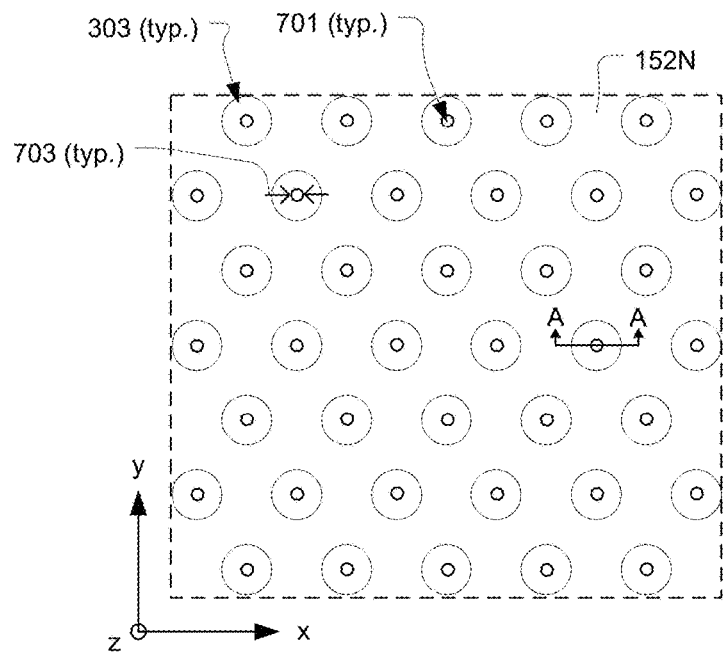
Figures 2, 7A:
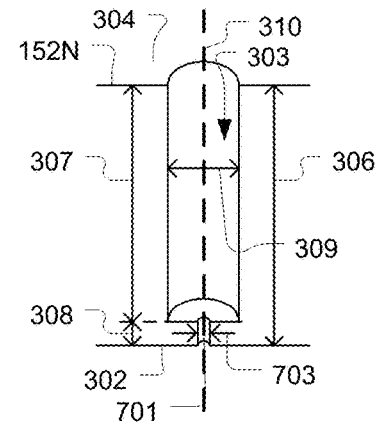

FIG. 7A-1 shows apertures 701 of circular cross-sectional shape that are separately formed at each hole 303 location within a modified faceplate 152N, in accordance with some embodiments. It should be understood that FIG. 7A-1 shows a transparent view of the faceplate 152N so that the apertures 701 and the holes 303 are visible with respect to each other. FIG. 7A-2 shows a vertical cross-section view through a hole 303 of the modified faceplate 152N corresponding to View A-A in FIG. 7A-1, in accordance with some embodiments. The modified faceplate 152N includes a single aperture 701 per hole 303. In some embodiments, the aperture 701 of a given hole 303 is substantially centered on the given hole 303 and is in fluid communication with the given hole 303. In some embodiments, the aperture 701 of a given hole 303 is not centered on the given hole 303, but is in fluid communication with the given hole 303.

Figures 1, 7B:
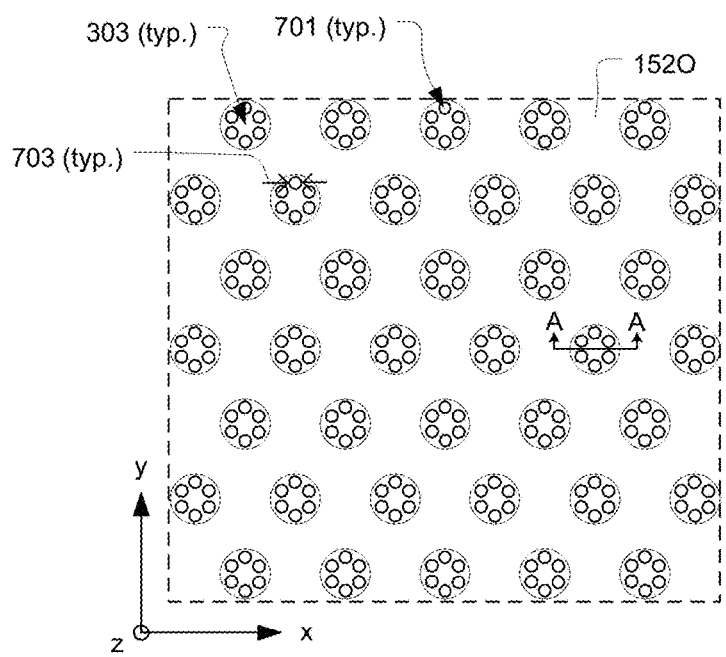
Figures 2, 7B:
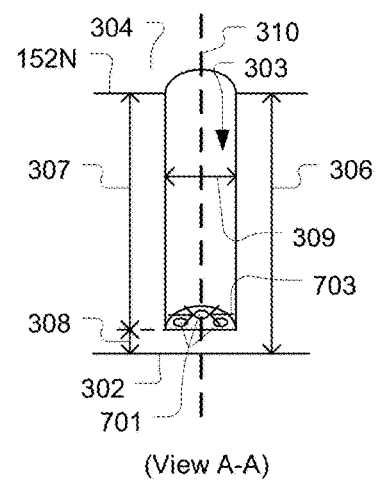
Figure 7C:
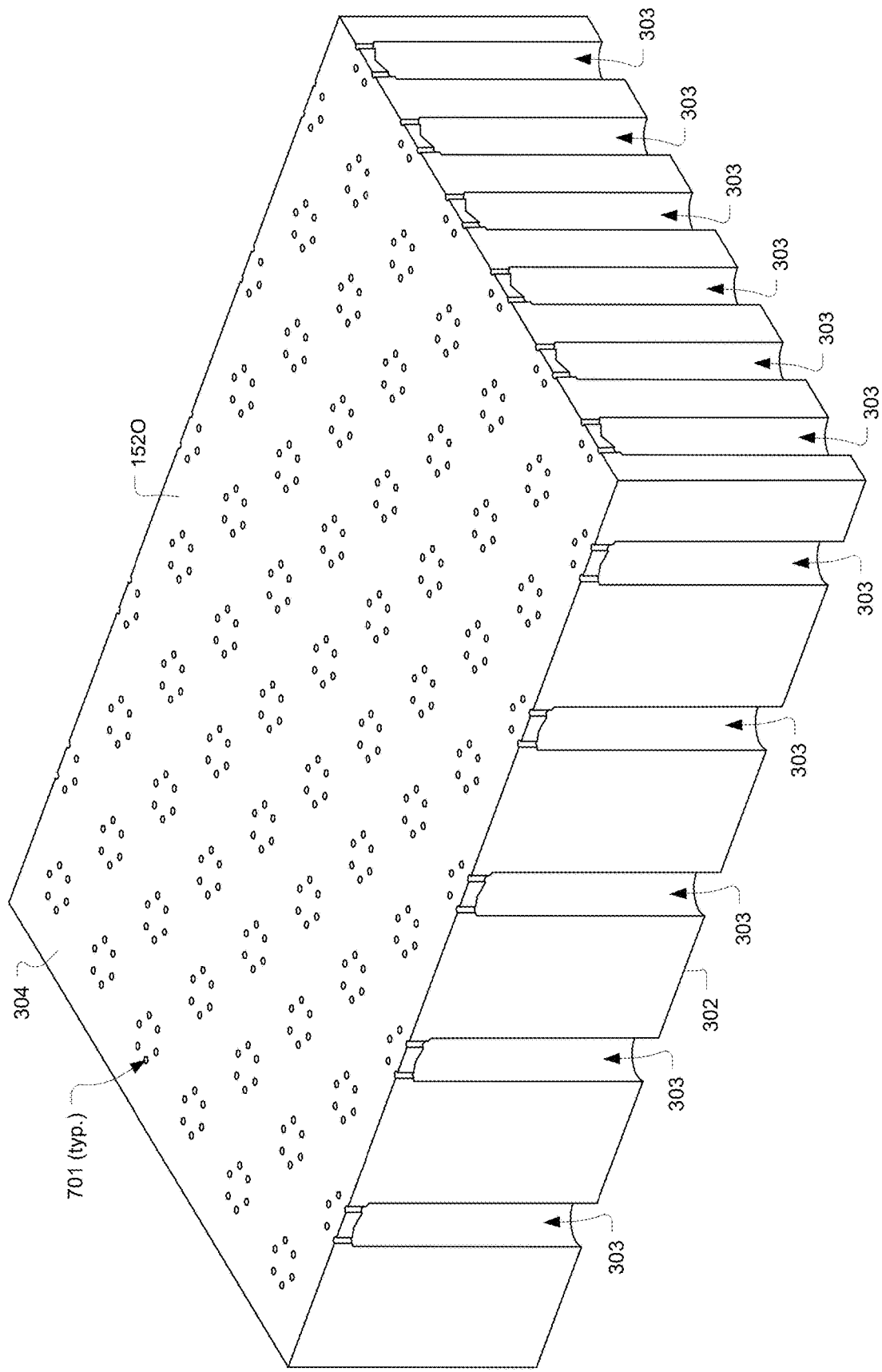
FIG. 7C shows a bottom isometric view of a portion of the modified faceplate 152O, in accordance with some embodiments.

FIG. 7B-1 shows multiple apertures 701 of circular cross-sectional shape per hole 303 within a modified faceplate 152O, in accordance with some embodiments. It should be understood that FIG. 7B-1 shows a transparent view of the faceplate 152O so that the apertures 701 and the holes 303 are visible with respect to each other. FIG. 7B-2 shows a vertical cross-section view through a hole 303 of the modified faceplate 152O corresponding to View A-A in FIG. 7B-1, in accordance with some embodiments. In various embodiments, any number of two or more apertures 701 can be positioned in fluid communication with a given hole 303. The example embodiment of FIG. 7B-1 shows six apertures 701 per hole 303. In some embodiments, there are up to 16 apertures 701 of circular cross-section per hole 303. In some embodiments, the multiple apertures 701 that are in fluid communication with a given hole 303 can be positioned in a symmetric pattern about the axis 310 of the given hole 303, where the axis of the given hole 303 extends in the z-direction down the center of the given hole 303. In the modified faceplate 152O, the six apertures 701 of a given hole 303 are symmetrically positioned about the axis 310 of the given hole 303. Also, in some embodiments, the multiple apertures 701 that are in fluid communication with a given hole 303 can be positioned in a non-symmetric pattern about the axis of the given hole 303. Each aperture 701 has an HCD suppression dimension 703 that is the diameter of the circular cross-sectional shape of the aperture 701. FIG. 7C shows a bottom isometric view of a portion of the modified faceplate 152O, in accordance with some embodiments.

In the modified faceplates 152N and 152O, the HCD suppression dimension 703 is dependent upon at least the process pressure and process RF power. Therefore, for some processes of higher process pressure and/or higher process RF power, the HCD suppression dimension 703 may need to be smaller to prevent HCD formation within the aperture 701. But, for some processes of lower process pressure and/or lower process RF power, the HCD suppression dimension 703 may be larger and still be effective at preventing HCD formation within the aperture 701. In various embodiments, the HCD suppression dimension 703 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 703 is process dependent, i.e., dependent upon the pressure and/or RF power of the process, because the potential for HCD formation within a given aperture 701 is process dependent. Additionally, a given aperture 701 has an aspect ratio (width-to-depth) defined by the ratio of (HCD suppression dimension 703/distance 308). In various embodiments, the aspect ratio of given aperture 701 is less than or equal to about 1, or less than or equal to about 0.3, or less than or equal to about 0.1. In various embodiments, the apertures 701 can be formed by an EDM process (e.g., sinker EDM or wire EDM), or by a mechanical machining process, or by a laser drilling process, or by a cutting process (e.g., water jet cutting, plasma cutting, or other type of cutting process).

In the modified faceplates 152N and 152O, the holes 303 are arranged in the hexagonal lattice array, like the holes 303 in the faceplate 152A of FIG. 3C. However, it should be understood that in other embodiments, the holes 303 in the modified faceplates 152N and 152O can be arranged in another pattern, such as in the square lattice array as shown in FIG. 3K, or in the rectangular lattice array as shown in FIG. 3L, or in the rhombic lattice array as shown in FIG. 3M, or in the parallelogrammic lattice array as shown in FIG. 3N, or in essentially any another customized pattern, e.g., the customized pattern shown in FIG. 3O.

Figure 8A:
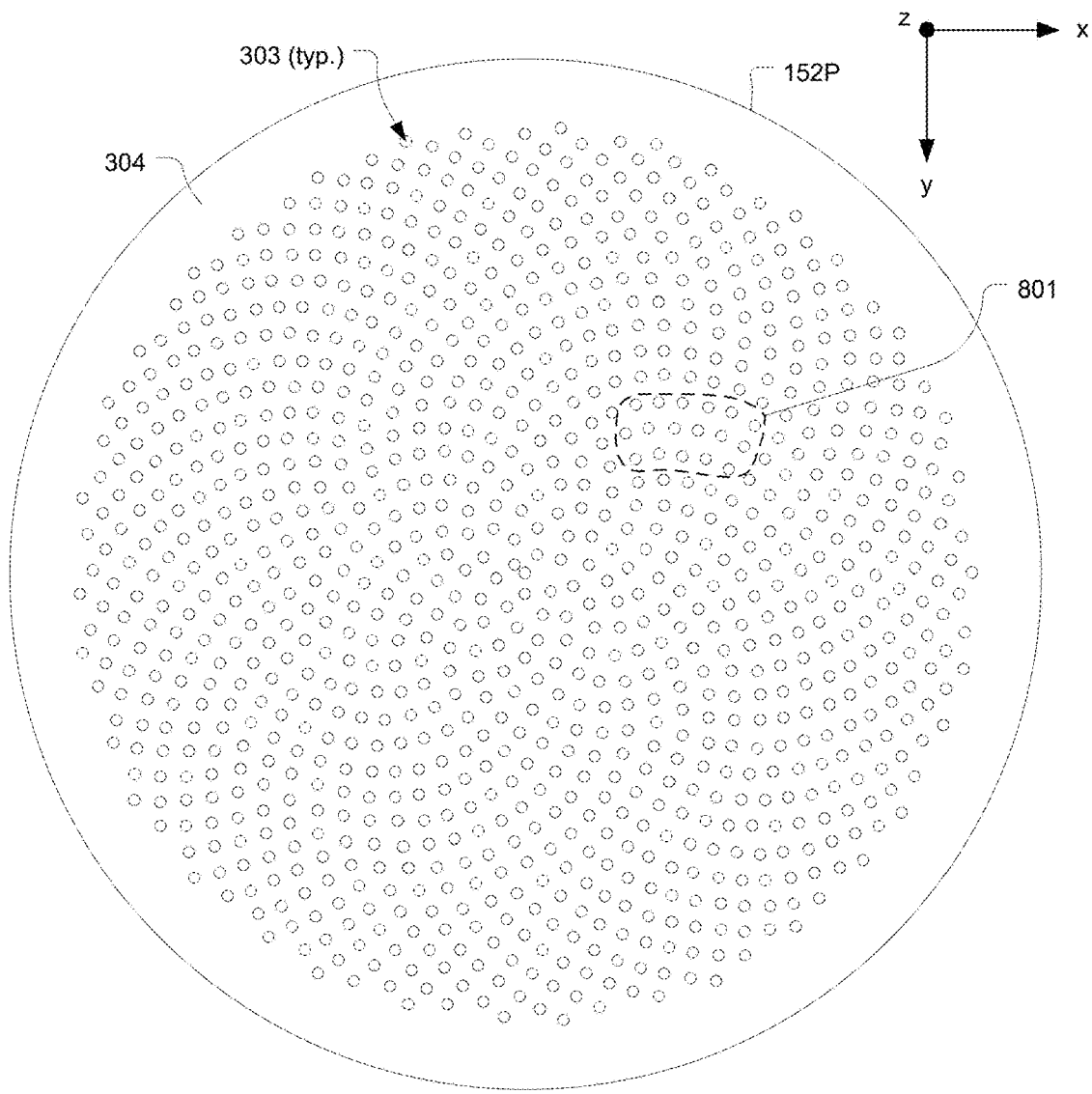
FIG. 8A shows a top view of a modified faceplate 152P that has the holes arranged in a Vogel pattern, in accordance with some embodiments.

FIG. 8A shows a top view of a modified faceplate 152P that has the holes 303 arranged in a Vogel pattern, in accordance with some embodiments. The Vogel pattern corresponds to a mathematical description, i.e., Vogel's model, of a geometric arrangement of a sunflower seed pattern as developed by Helmut Vogel. Vogel's model for sunflower seed arrangement uses discrete points on a spiral, with a very specific turning angle of $$\theta_1 = \frac{2\pi}{\varphi^2}$$

between consecutive points, where $$\varphi = \frac{1 + \sqrt{5}}{2}$$

is the golden ratio. Vogel's pattern is represented by the function $$S(n) = (r(n), \theta(n)) = \left(\sqrt{n}, \frac{2\pi n}{\varphi^2}\right).$$

This classic Vogel pattern described by this fundamental equation can be further modified by rotation, inversion, localized or uniform scaling, and/or other manipulations to form a slightly different generalized Vogel pattern. The Vogel pattern can be characterized as a pattern of points in which each point appears to be approximately the same distance from each of its neighboring points. In some embodiments, distributing the process gas into the plasma processing region 154 in a Vogel pattern arrangement can improve uniformity of process results on the substrate 101. In various embodiments, the modified faceplate 152P can be formed to have apertures of essentially any cross-sectional shape formed through the bottom side 302 of the modified faceplate 152P. These apertures are formed through the thickness 308 of the faceplate to fluidly connect with the holes 303.

Figure 8B:
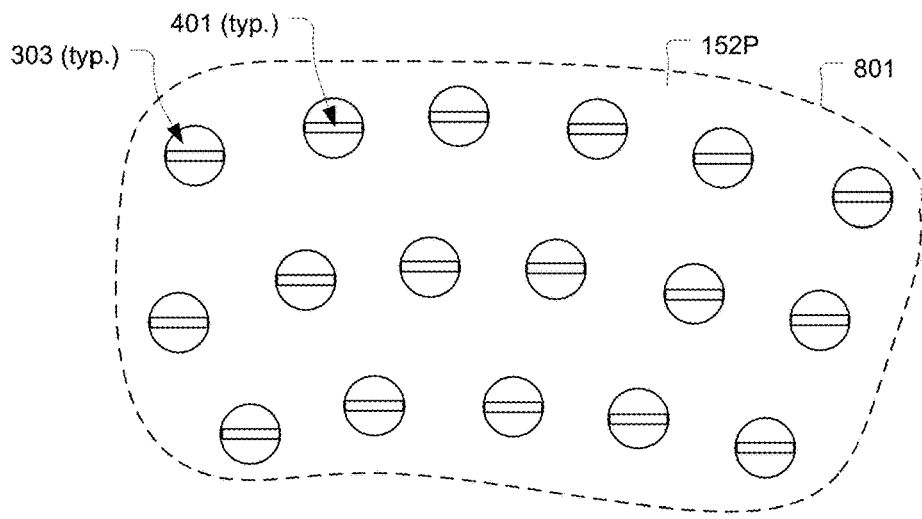
FIG. 8B shows a close-up view of a portion of the modified faceplate 152P, as referenced in FIG. 8A, that includes the apertures of rectangular cross-sectional shape, in accordance with some embodiments.

For example, in some embodiments, the apertures 401 of rectangular cross-sectional shape as described above with regard to modified faceplates 152G, 152H, and 152I can be formed through the bottom side 302 of the modified faceplate 152P to fluidly connect with the holes 303 arranged in the Vogel pattern. FIG. 8B shows a close-up view of a portion 801 of the modified faceplate 152P, as referenced in FIG. 8A, that includes the apertures 401 of rectangular cross-sectional shape, in accordance with some embodiments. It should be understood that FIG. 8B shows a transparent view of the portion of the faceplate 152P so that the Vogel pattern of holes 303 and the apertures 401 are visible with respect to each other.

Figure 8C:
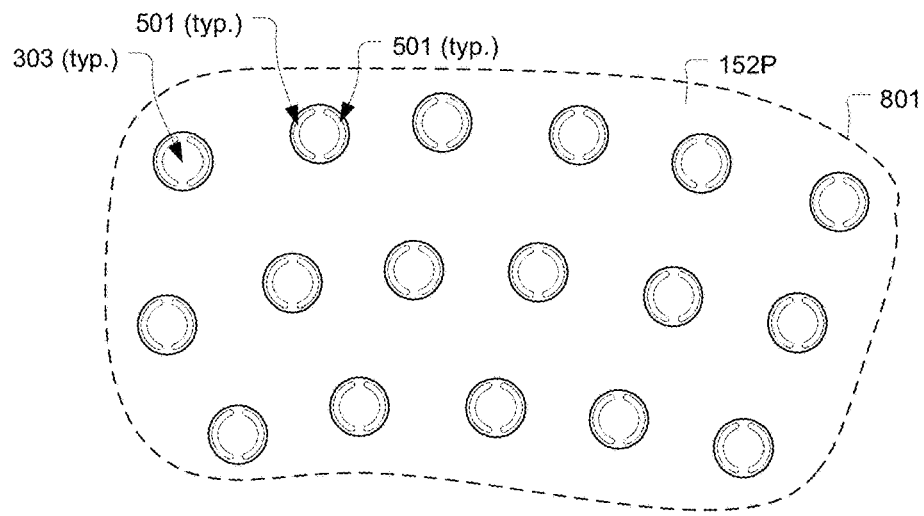
FIG. 8C shows a close-up view of the portion of the modified faceplate 152P that includes the apertures of curved cross-sectional shape, in accordance with some embodiments.

In some embodiments, the apertures 501 of curved cross-sectional shape as described above with regard to modified faceplates 152J, 152J1, 152K1, and 152K2 can be formed through the bottom side 302 of the modified faceplate 152P to fluidly connect with the holes 303 arranged in the Vogel pattern. FIG. 8C shows a close-up view of the portion 801 of the modified faceplate 152P that includes the apertures 501 of curved cross-sectional shape, in accordance with some embodiments. It should be understood that FIG. 8C shows a transparent view of the portion of the faceplate 152P so that the Vogel pattern of holes 303 and the apertures 501 are visible with respect to each other.

Figure 8D:
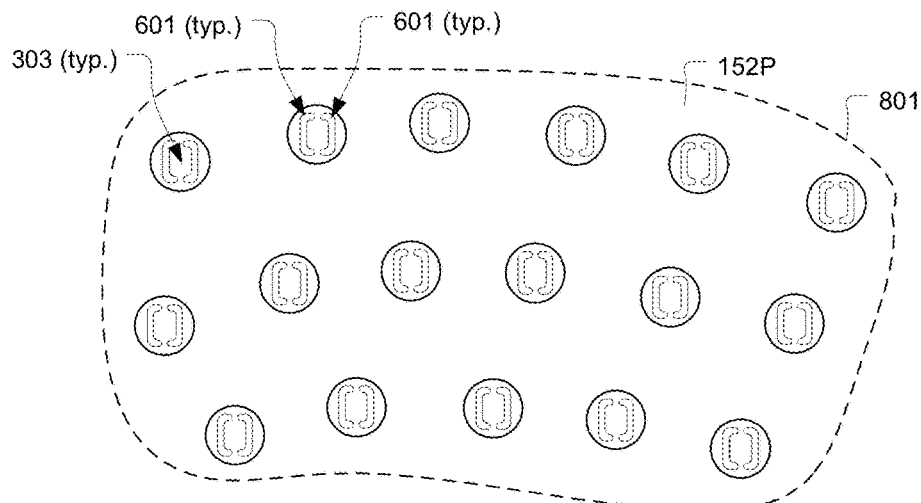
FIG. 8D shows a close-up view of the portion of the modified faceplate 152P that includes the apertures of bracket cross-sectional shape, in accordance with some embodiments.

In some embodiments, the apertures 601 of bracket cross-sectional shape as described above with regard to modified faceplates 152L and 152M can be formed through the bottom side 302 of the modified faceplate 152P to fluidly connect with the holes 303 arranged in the Vogel pattern. FIG. 8D shows a close-up view of the portion 801 of the modified faceplate 152P that includes the apertures 601 of bracket cross-sectional shape, in accordance with some embodiments. It should be understood that FIG. 8D shows a transparent view of the portion of the faceplate 152P so that the Vogel pattern of holes 303 and the apertures 601 are visible with respect to each other.

Figure 8E:
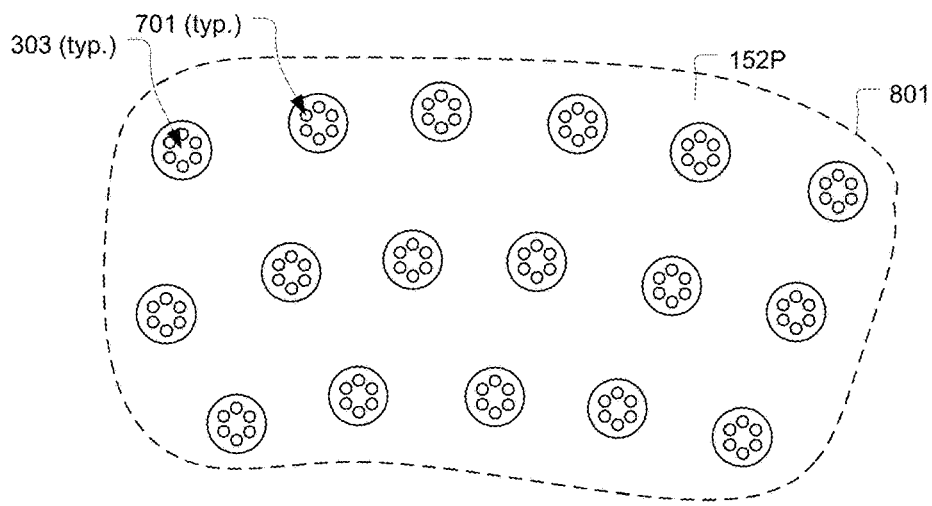
FIG. 8E shows a close-up view of a portion of the modified faceplate 152P that includes the apertures of circular cross-sectional shape, in accordance with some embodiments.

In some embodiments, the apertures 701 of circular cross-sectional shape as described above with regard to modified faceplates 152N and 152O can be formed through the bottom side 302 of the modified faceplate 152P to fluidly connect with the holes 303 arranged in the Vogel pattern. FIG. 8E shows a close-up view of a portion of the modified faceplate 152P that includes the apertures 701 of circular cross-sectional shape, in accordance with some embodiments. It should be understood that FIG. 8E shows a transparent view of the portion of the faceplate 152P so that the Vogel pattern of holes 303 and the apertures 701 are visible with respect to each other.

Figure 9A:
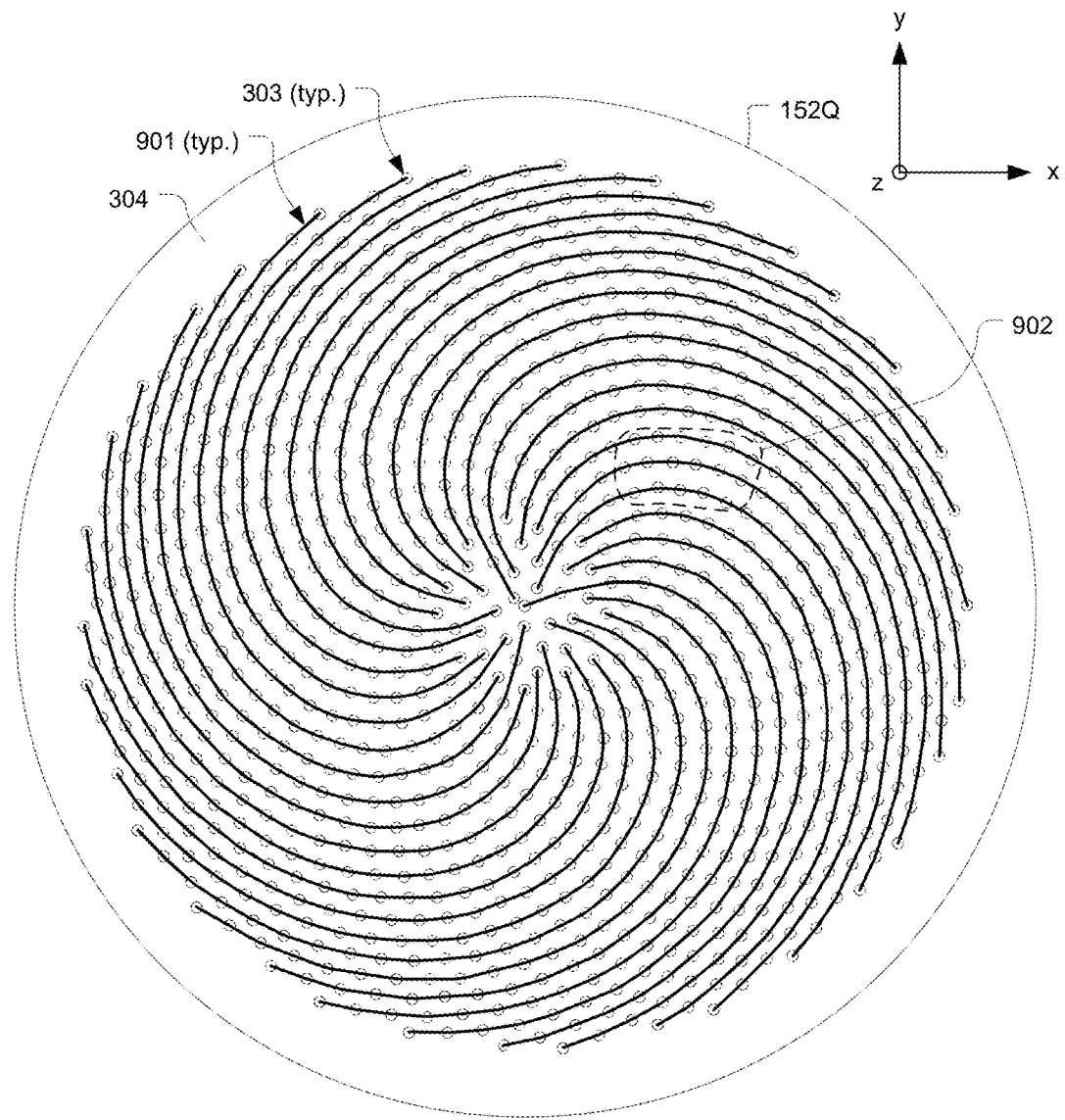
FIG. 9A shows a transparent view of a modified faceplate 152Q that includes a Vogel pattern of grooves formed through the bottom side of the faceplate to intersect with a Vogel pattern of holes formed through the top side of the faceplate, in accordance with some embodiments.
Figure 9B:
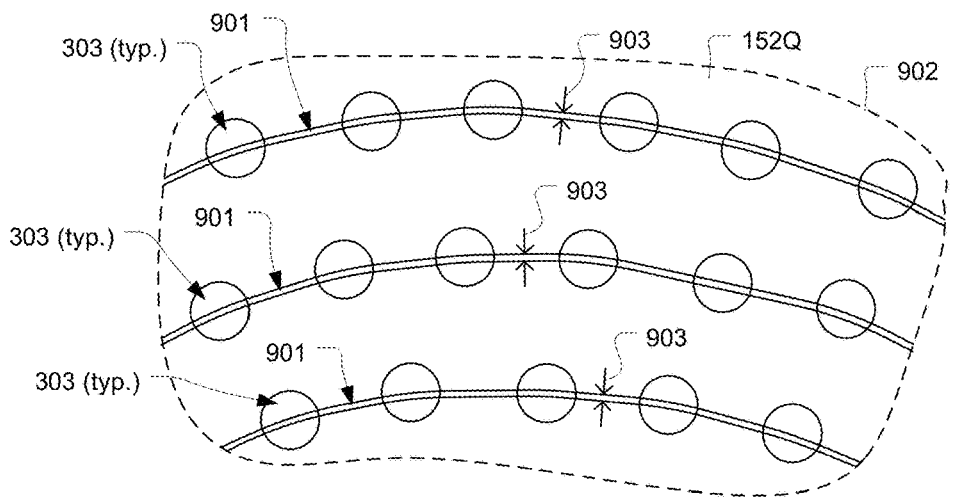
FIG. 9B shows a close-up view of a portion of the modified faceplate 152Q, in accordance with some embodiments.

FIG. 9A shows a transparent view of a modified faceplate 152Q that includes a Vogel pattern of grooves 901 formed through the bottom side of the faceplate 152Q to intersect with a Vogel pattern of holes 303 formed through the top side of the faceplate 152Q, in accordance with some embodiments. It should be understood that FIG. 9A shows a transparent view of the faceplate 152Q so that the grooves 901 and the holes 303 are visible with respect to each other. The holes 303 are depicted as circles, and the grooves 901 are depicted as solid lines that pass through the circles representing the holes 303. FIG. 9B shows a close-up view of a portion 902 of the modified faceplate 152Q, in accordance with some embodiments. It should be understood that FIG. 9B shows a transparent view of the faceplate 152Q so that the grooves 901 and the holes 303 are visible with respect to each other. At some depth within the faceplate 152Q, each of the holes 303 intersects with corresponding one of the grooves 901 to form a fluid passage through the faceplate 152Q, through which process gas can flow into the plasma processing region 154. In various embodiments, the grooves 901 can be defined in a similar manner as the slots 301 of FIG. 3A. For example, the holes 303 extend the distance 307 into the faceplate 152Q from the top side 304 of the faceplate 152Q. And, the grooves 901 extend the distance 308 into the faceplate 152Q from the bottom side 302 of the faceplate 152Q. The distance 308 is at least large enough to cause the grooves 901 to intersect with the holes 303 that are spatially coincident with the grooves 901. Therefore, the grooves 901 of shallow depth are formed across the plasma-side (bottom side) of the faceplate 152Q, with each groove 901 forming multiple small apertures where it intersects with the larger holes 303 of greater depth formed through the plenum-side (top side) of the faceplate 152Q. It should be understood that the distance 308 is set small enough to enable reliable and economical fabrication of the grooves 901. Therefore, the holes 303 (top side apertures) are formed to extend through a portion (distance 307) of the overall thickness 306 of the faceplate 152Q to intersect with at least one of the grooves 901 (bottom side apertures) to form a corresponding flow path for process gas through the faceplate 152Q. In various embodiments, the distance 308, i.e., the depth of the grooves 901, is within a range extending from about 0.001 inch to about 0.03 inch, or about 0.03 inch, or greater than 0.03 inch. In some embodiments, the distance 308, i.e., the depth of the grooves 901, is less than or equal to about 50% of the overall thickness 306 of the faceplate 152Q. In some embodiments, the distance 308, i.e., the depth of the grooves 901, is less than or equal to about 10% of the overall thickness 306 of the faceplate 152Q.

Each groove 901 has an HCD suppression dimension 903 measured in a direction across a shortest span of the groove 901. In FIGS. 9A and 9B, the HCD suppression dimension 903 is dependent upon at least the process pressure and process RF power. Therefore, for some processes of higher process pressure and/or higher process RF power, the HCD suppression dimension 903 may need to be smaller to prevent HCD formation within the groove 901. But, for some processes of lower process pressure and/or lower process RF power, the HCD suppression dimension 903 may be larger and still be effective at preventing HCD formation within the groove 901. In various embodiments, the HCD suppression dimension 903 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 903 is process dependent, i.e., dependent upon the pressure and/or RF power of the process, because the potential for HCD formation within a given groove 901 is process dependent. Additionally, a given groove 901 has an aspect ratio (width-to-depth) defined by the ratio of (HCD suppression dimension 903/distance 308). In various embodiments, the aspect ratio of given groove 901 is less than or equal to about 1, or less than or equal to about 0.3, or less than or equal to about 0.1. In various embodiments, the grooves 901 can be formed by an EDM process (e.g., sinker EDM or wire EDM), or by a mechanical machining process, or by a laser drilling process, or by a cutting process (e.g., water jet cutting, plasma cutting, or other type of cutting process).

In some embodiments, the holes 303 formed through the top side of the modified faceplate 152A-152Q can be replaced by openings of various shape and size, so long as the openings: 1) intersect with the apertures formed through the bottom side of the modified faceplate 152A-152Q, 2) provide an appropriate process gas flow conductance through the modified faceplate 152A-152Q, 3) provide an appropriate pressure drop across the modified faceplate 152A-152Q, 4) provide an appropriate process gas flow uniformity across the modified faceplate 152A-152Q, 5) provide for appropriate mechanical performance of the modified faceplate 152A-152Q, and 6) provided for appropriate thermal performance of the modified faceplate 152A-152Q.

It should be understood that in various embodiments the holes 303 and/or the apertures (e.g., 401, 501, 601, 701) can be arranged in various configurations that are based on the Vogel pattern. For example, in some embodiments, the holes 303 and/or the apertures (e.g., 401, 501, 601, 701) can be arranged in different zones, where one or more of the zones is arranged in a separately defined Vogel pattern. Examples of such showerhead hole configurations that are based on the Vogel pattern are described in U.S. patent application Ser. No. 16/006,591, filed on Jun. 12, 2018, entitled "Chemical Vapor Deposition Shower Head for Uniform Gas Distribution," which is incorporated herein by reference in its entirety for all purposes.

Figure 10A:
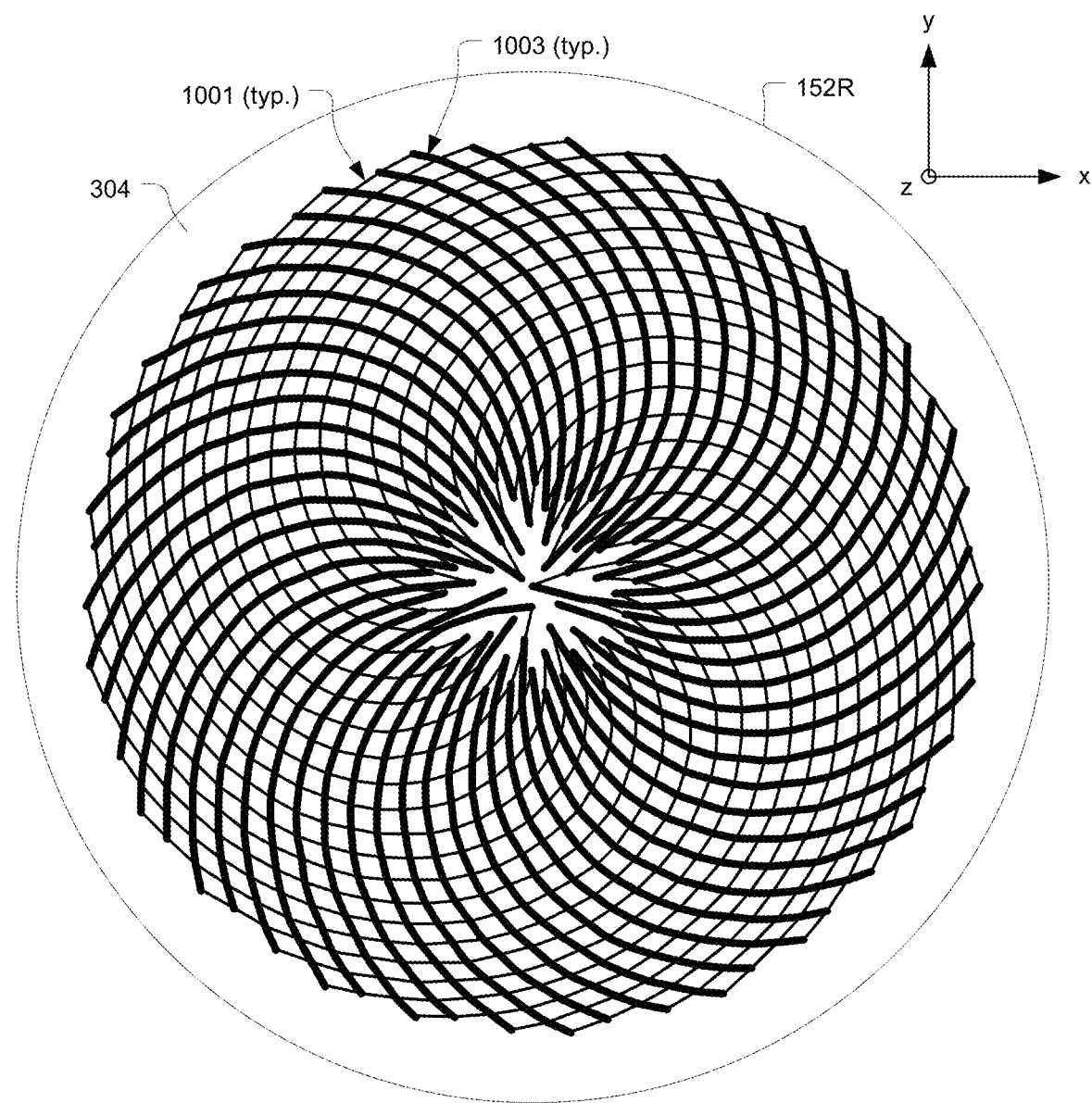
FIG. 10A shows a transparent view of a modified faceplate 152R that includes a first Vogel pattern of bottom side grooves formed through the bottom side of the faceplate to intersect with a second Vogel pattern of top side grooves formed through the top side of the faceplate, in accordance with some embodiments.
Figure 10B:
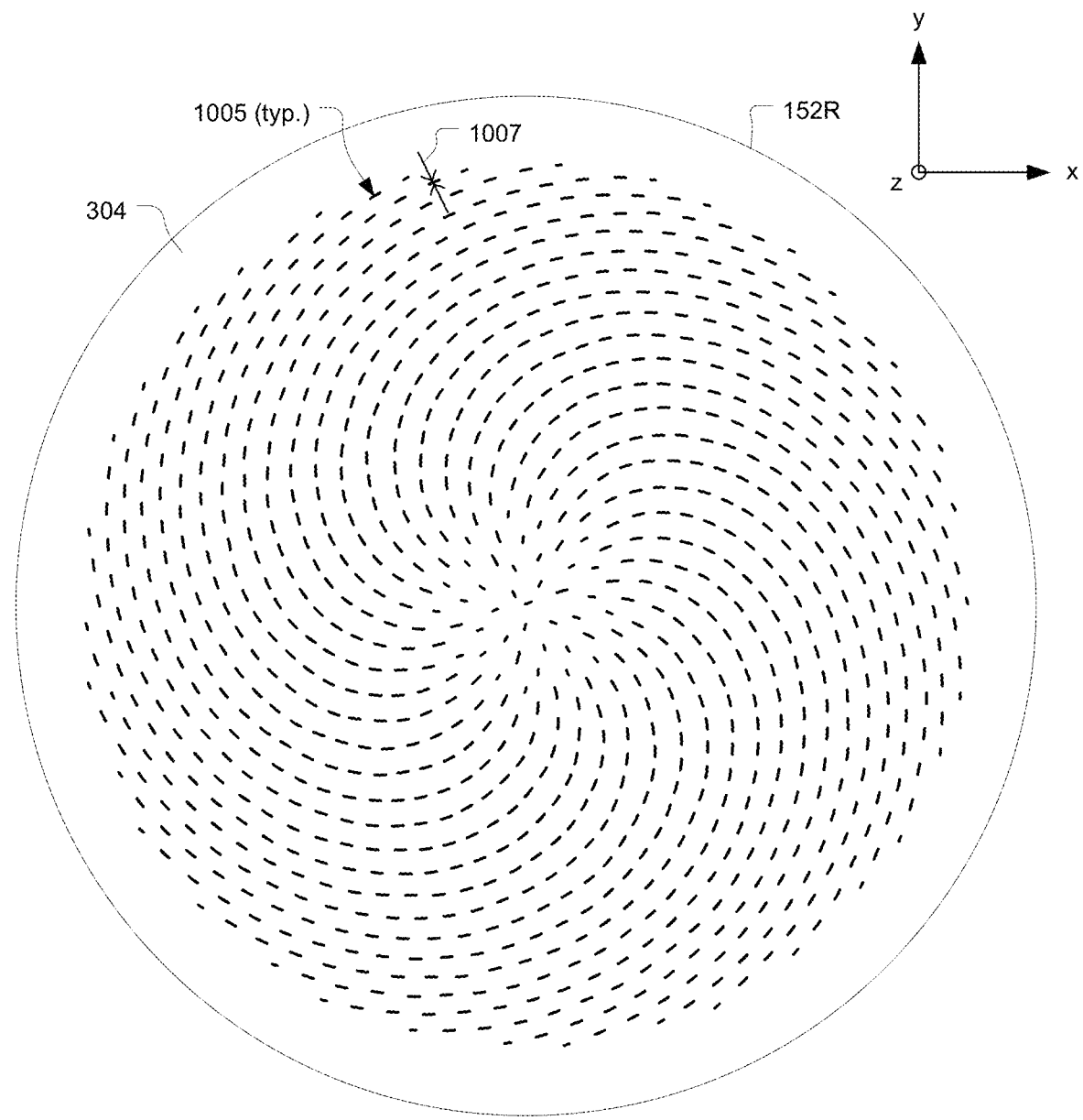
FIG. 10B shows cross-sections of apertures formed by intersection of the bottom side grooves with the top side grooves, in accordance with some embodiments.

FIG. 10A shows a transparent view of a modified faceplate 152R that includes a first Vogel pattern of bottom side grooves 1001 formed through the bottom side of the faceplate 152R to intersect with a second Vogel pattern of top side grooves 1003 formed through the top side of the faceplate 152R, in accordance with some embodiments. The second Vogel pattern of top side grooves 1003 travel in a reverse direction relative to the first Vogel pattern of bottom side grooves 1001. It should be understood that FIG. 10A shows a transparent view of the faceplate 152R so that the first Vogel pattern of bottom side grooves 1001 and the second Vogel pattern of top side grooves 1003 are visible with respect to each other. The bottom side grooves 1001 are shown in FIG. 10A as the thinner lines. The top side grooves 1003 are shown in FIG. 10A as the thicker lines. At some depth within the faceplate 152R, each of the top side grooves 1003 intersects with corresponding bottom side grooves 1001 to form fluid passages through the faceplate 152R, through which process gas can flow into the plasma processing region 154. FIG. 10B shows cross-sections of apertures 1005 formed by intersection of the bottom side grooves 1001 with the top side grooves 1003, in accordance with some embodiments.

In various embodiments, the bottom side grooves 1001 can be defined in a similar manner as the slots 301 of FIG. 3A. For example, the top side grooves 1003 extend the distance 307 into the faceplate 152R from the top side 304 of the faceplate 152R. And, the bottom side grooves 1001 extend the distance 308 into the faceplate 152R from the bottom side 302 of the faceplate 152R. The distance 308 is at least large enough to cause the bottom side grooves 1001 to intersect with the top side grooves 1003 at locations where they cross each other. Therefore, the bottom side grooves 1001 of shallow depth are formed across the plasma-side (bottom side) of the faceplate 152R, with each bottom side groove 1001 forming multiple small apertures 1005 where it intersects with the larger top side grooves 1003 of greater depth formed through the plenum-side (top side) of the faceplate 152R. It should be understood that the distance 308 is set small enough to enable reliable and economical fabrication of the bottom side grooves 1001. Therefore, each of the top side grooves 1003 is formed to extend through a portion (distance 307) of the overall thickness 306 of the faceplate 152R to intersect with multiple bottom side grooves 1001 to form a corresponding flow paths for process gas through the faceplate 152R. In various embodiments, the distance 308, i.e., the depth of the bottom side grooves 1001, is within a range extending from about 0.001 inch to about 0.03 inch, or about 0.03 inch, or greater than 0.03 inch. In some embodiments, the distance 308, i.e., the depth of the bottom side grooves 1001, is less than or equal to about 50% of the overall thickness 306 of the faceplate 152R. In some embodiments, the distance 308, i.e., the depth of the bottom side grooves 1001, is less than or equal to about 10% of the overall thickness 306 of the faceplate 152R.

Each bottom side groove 1001 has an HCD suppression dimension 1007 measured in a direction across a shortest span of the bottom side groove 1001. In the example faceplate 152R, the HCD suppression dimension 1007 is dependent upon at least the process pressure and process RF power. Therefore, for some processes of higher process pressure and/or higher process RF power, the HCD suppression dimension 1007 of the bottom side groove 1001 may need to be smaller to prevent HCD formation within the bottom side groove 1001. But, for some processes of lower process pressure and/or lower process RF power, the HCD suppression dimension 1007 may be larger and still be effective at preventing HCD formation within the bottom side groove 1001. In various embodiments, the HCD suppression dimension 1007 of the bottom side grooves 1001 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 1007 of the bottom side grooves 1001 is process dependent, i.e., dependent upon the pressure and/or RF power of the process, because the potential for HCD formation within a given bottom side groove 1001 is process dependent. Additionally, a given bottom side groove 1001 has an aspect ratio (width-to-depth) defined by the ratio of (HCD suppression dimension 1007/distance 308). In various embodiments, the aspect ratio of given bottom side groove 1001 is less than or equal to about 1, or less than or equal to about 0.3, or less than or equal to about 0.1. In various embodiments, the bottom side grooves 1001 can be formed by an EDM process (e.g., sinker EDM or wire EDM), or by a mechanical machining process, or by a laser drilling process, or by a cutting process (e.g., water jet cutting, plasma cutting, or other type of cutting process).

In various embodiments, a width dimension, i.e., the short horizontal cross-section dimension, of the top side grooves 1003 is within a range extending from about 0.02 inch to about 0.09 inch, or greater than or equal to about 0.02 inch, or greater than or equal to about 0.04 inch, or greater than or equal to about 0.08 inch, or greater than or equal to about 0.1 inch. It should be understood that the width dimension of the top side grooves 1003 can be larger than a size at which HCD is expected to occur, because it is the bottom side grooves 1001 that are sized to prevent HCD. It should also be understood that the width dimension of the top side grooves 1003 can be specified to ease fabrication of the top side grooves 1003. In various embodiments, the top side grooves 1003 can be formed by an EDM process (e.g., sinker EDM or wire EDM), or by a mechanical machining process, or by a laser drilling process, or by a cutting process (e.g., water jet cutting, plasma cutting, or other type of cutting process).

Figure 11A:
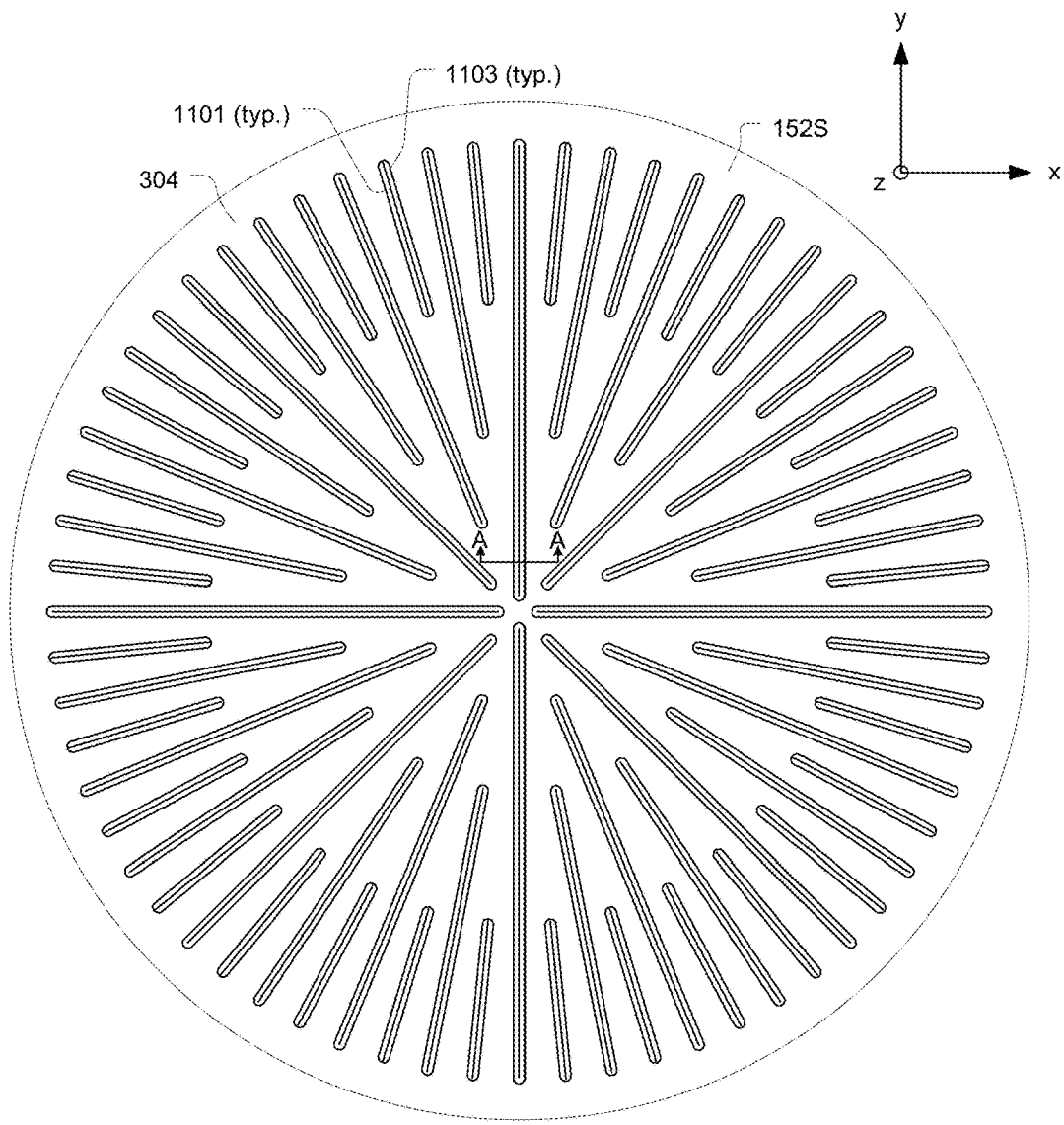
FIG. 11A shows a top view of a modified faceplate 152S that includes a radial-spoke pattern of bottom side grooves formed through the bottom side of the faceplate to intersect with a corresponding radial-spoke pattern of top side grooves formed through the top side of the faceplate, in accordance with some embodiments.
Figure 11B:
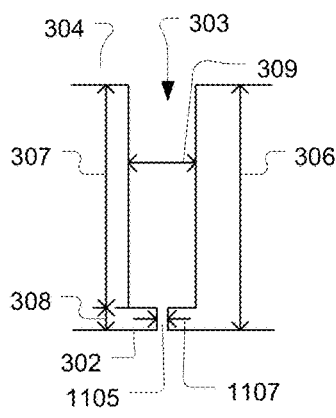
FIG. 11B shows a vertical cross-section of an aperture formed by intersection of a bottom side groove with a top side groove, in accordance with some embodiments.

FIG. 11A shows a top view of a modified faceplate 152S that includes a radial-spoke pattern of bottom side grooves 1101 formed through the bottom side of the faceplate 152S to intersect with a corresponding radial-spoke pattern of top side grooves 1103 formed through the top side of the faceplate 152S, in accordance with some embodiments. It should be understood that FIG. 11A shows a transparent view of the faceplate 152S so that the radial-spoke pattern of bottom side grooves 1101 and the radial-spoke pattern of top side grooves 1103 are visible with respect to each other. The bottom side grooves 1101 are shown in FIG. 11A as the thin lines. The top side grooves 1103 are shown in FIG. 11A as the substantially rectangular shaped areas that overlap the thin lines of the bottom side grooves 1101. At some depth within the faceplate 152S, each of the top side grooves 1103 intersects with a corresponding bottom side groove 1101 to form a fluid passage through the faceplate 152S, through which process gas can flow into the plasma processing region 154. FIG. 11B shows a vertical cross-section of an aperture 1105 formed by intersection of a bottom side groove 1101 with a top side groove 1103, in accordance with some embodiments.

In various embodiments, the bottom side grooves 1101 can be defined in a similar manner as the slots 301 of FIG. 3A. For example, the top side grooves 1103 extend the distance 307 into the faceplate 152S from the top side 304 of the faceplate 152S. And, the bottom side grooves 1101 extend the distance 308 into the faceplate 152S from the bottom side 302 of the faceplate 152S. The distance 308 is at least large enough to cause the bottom side grooves 1101 to intersect with corresponding the top side grooves 1103 at locations where they overlap each other. Therefore, the bottom side grooves 1101 of shallow depth are formed across the plasma-side (bottom side) of the faceplate 152S, with each bottom side groove 1101 forming the aperture 1105 where it intersects with the corresponding larger top side groove 1103 of greater depth formed through the plenum-side (top side) of the faceplate 152S. It should be understood that the distance 308 is set small enough to enable reliable and economical fabrication of the bottom side grooves 1101. Therefore, each of the top side grooves 1103 is formed to extend through a portion (distance 307) of the overall thickness 306 of the faceplate 152S to intersect with one or more corresponding bottom side grooves 1101 to form a corresponding flow paths for process gas through the faceplate 152S. In various embodiments, the distance 308, i.e., the depth of the bottom side grooves 1101, is within a range extending from about 0.001 inch to about 0.03 inch, or about 0.03 inch, or greater than 0.03 inch. In some embodiments, the distance 308, i.e., the depth of the bottom side grooves 1101, is less than or equal to about 50% of the overall thickness 306 of the faceplate 152S. In some embodiments, the distance 308, i.e., the depth of the bottom side grooves 1101, is less than or equal to about 10% of the overall thickness 306 of the faceplate 152S.

Each bottom side groove 1101 has an HCD suppression dimension 1107 measured in a direction across a shortest span of the bottom side groove 1101. In the example faceplate 152S, the HCD suppression dimension 1107 is dependent upon at least the process pressure and process RF power. Therefore, for some processes of higher process pressure and/or higher process RF power, the HCD suppression dimension 1107 of the bottom side groove 1101 may need to be smaller to prevent HCD formation within the bottom side groove 1101. But, for some processes of lower process pressure and/or lower process RF power, the HCD suppression dimension 1107 may be larger and still be effective at preventing HCD formation within the bottom side groove 1101. In various embodiments, the HCD suppression dimension 1107 of the bottom side grooves 1101 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 1107 of the bottom side grooves 1101 is process dependent, i.e., dependent upon the pressure and/or RF power of the process, because the potential for HCD formation within a given bottom side groove 1101 is process dependent. Additionally, a given bottom side groove 1101 has an aspect ratio (width-to-depth) defined by the ratio of (HCD suppression dimension 1107/distance 308). In various embodiments, the aspect ratio of given bottom side groove 1101 is less than or equal to about 1, or less than or equal to about 0.3, or less than or equal to about 0.1. In various embodiments, the bottom side grooves 1101 can be formed by an EDM process (e.g., sinker EDM or wire EDM), or by a mechanical machining process, or by a laser drilling process, or by a cutting process (e.g., water jet cutting, plasma cutting, or other type of cutting process).

In various embodiments, a width dimension, i.e., the short horizontal cross-section dimension, of the top side grooves 1103 is within a range extending from about 0.02 inch to about 0.09 inch, or greater than or equal to about 0.02 inch, or greater than or equal to about 0.04 inch, or greater than or equal to about 0.08 inch, or greater than or equal to about 0.1 inch. It should be understood that the width dimension of the top side grooves 1103 can be larger than a size at which HCD is expected to occur, because it is the bottom side grooves 1101 that are sized to prevent HCD. It should also be understood that the width dimension of the top side grooves 1103 can be specified to ease fabrication of the top side grooves 1103. In various embodiments, the top side grooves 1103 can be formed by an EDM process (e.g., sinker EDM or wire EDM), or by a mechanical machining process, or by a laser drilling process, or by a cutting process (e.g., water jet cutting, plasma cutting, or other type of cutting process).

Figure 12A:
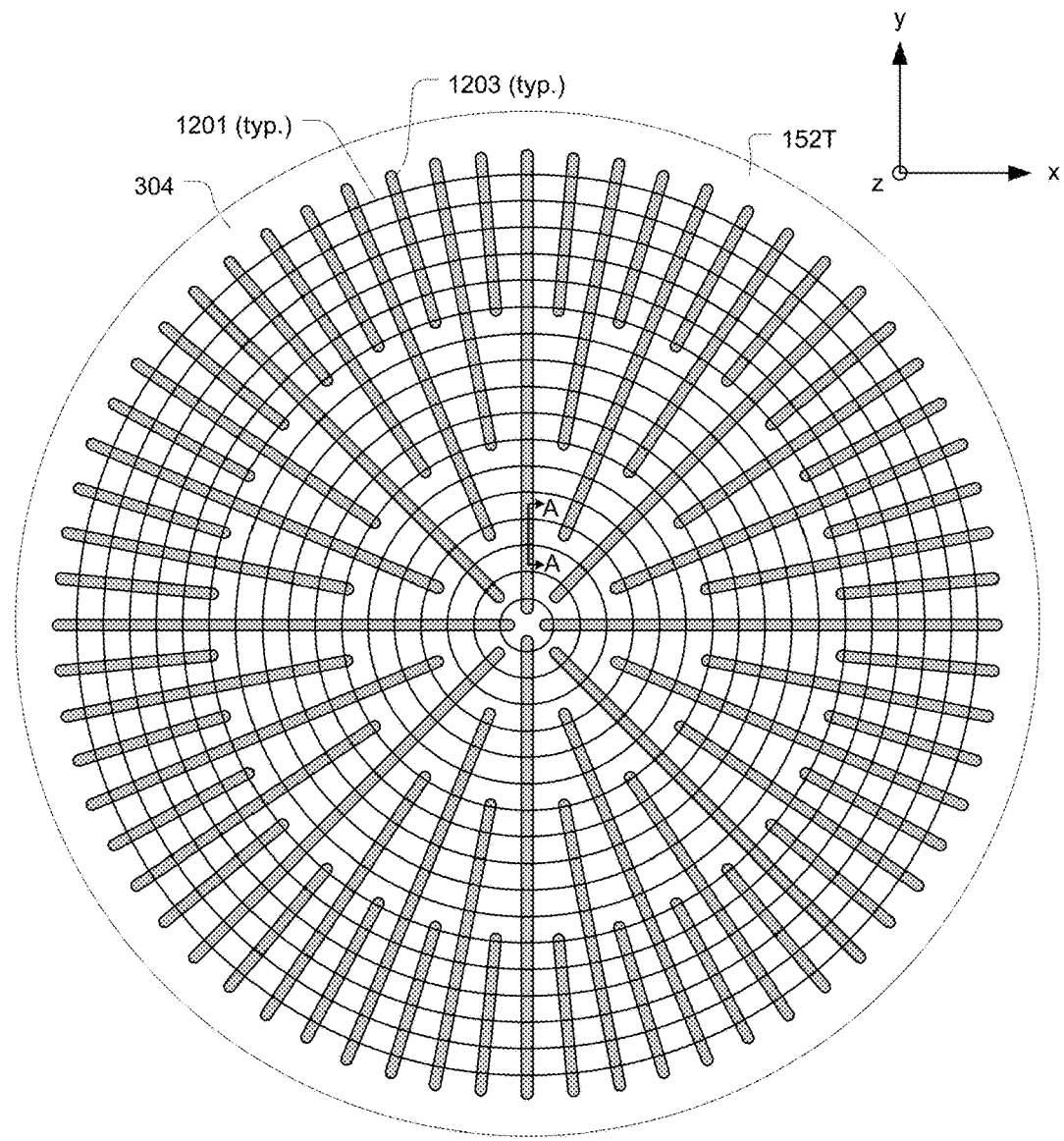
FIG. 12A shows a transparent view of a modified faceplate 152T that includes a concentric-circular pattern of bottom side grooves formed through the bottom side of the faceplate to intersect with a radial-spoke pattern of top side grooves formed through the top side of the faceplate, in accordance with some embodiments.
Figure 12B:
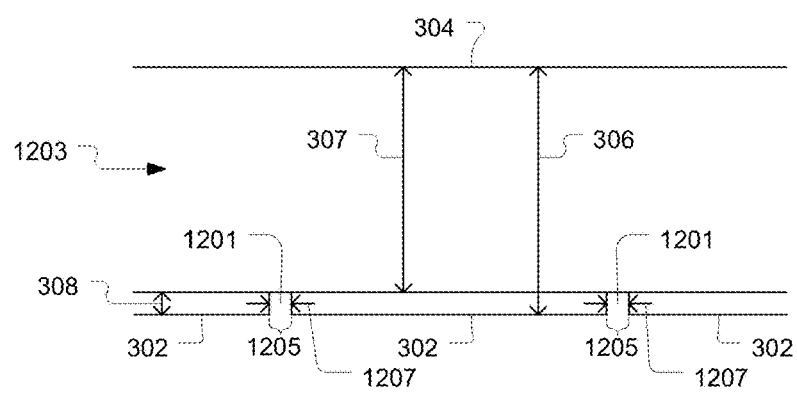
FIG. 12B shows a vertical cross-section corresponding to a view A-A referenced in FIG. 12A, in which apertures are shown at the intersections of bottom side grooves with a top side groove, in accordance with some embodiments.

FIG. 12A shows a transparent view of a modified faceplate 152T that includes a concentric-circular pattern of bottom side grooves 1201 formed through the bottom side of the faceplate 152T to intersect with a radial-spoke pattern of top side grooves 1203 formed through the top side of the faceplate 152T, in accordance with some embodiments. It should be understood that FIG. 12A shows a transparent view of the faceplate 152T so that the concentric-circular pattern of bottom side grooves 1201 and the radial-spoke pattern of top side grooves 1203 are visible with respect to each other. The bottom side grooves 1201 are shown in FIG. 12A as the thin lines. The top side grooves 1203 are shown in FIG. 12A as the shaded areas. At some depth within the faceplate 152T, each of the top side grooves 1203 intersects with a number of the bottom side grooves 1201 to form a fluid passage through the faceplate 152T, through which process gas can flow into the plasma processing region 154. FIG. 12B shows a vertical cross-section corresponding to a view A-A referenced in FIG. 12A, in which apertures 1205 are shown at the intersections of bottom side grooves 1201 with a top side groove 1203, in accordance with some embodiments.

In various embodiments, the bottom side grooves 1201 can be defined in a similar manner as the slots 301 of FIG.

3A. For example, the top side grooves 1203 extend the distance 307 into the faceplate 152T from the top side 304 of the faceplate 152T. And, the bottom side grooves 1201 extend the distance 308 into the faceplate 152T from the bottom side 302 of the faceplate 152T. The distance 308 is at least large enough to cause the bottom side grooves 1201 to intersect with the top side grooves 1203 at locations where they cross each other. Therefore, the bottom side grooves 1201 of shallow depth are formed across the plasma-side (bottom side) of the faceplate 152T, with each bottom side groove 1201 forming the aperture 1205 where it intersects with each top side groove 1203 of greater depth formed through the plenum-side (top side) of the faceplate 152T. It should be understood that the distance 308 is set small enough to enable reliable and economical fabrication of the bottom side grooves 1201. Therefore, each of the top side grooves 1203 is formed to extend through a portion (distance 307) of the overall thickness 306 of the faceplate 152T to intersect with one or more bottom side grooves 1201 to form flow paths for process gas through the faceplate 152T. In various embodiments, the distance 308, i.e., the depth of the bottom side grooves 1201, is within a range extending from about 0.001 inch to about 0.03 inch, or about 0.03 inch, or greater than 0.03 inch. In some embodiments, the distance 308, i.e., the depth of the bottom side grooves 1201, is less than or equal to about 50% of the overall thickness 306 of the faceplate 152T. In some embodiments, the distance 308, i.e., the depth of the bottom side grooves 1201, is less than or equal to about 10% of the overall thickness 306 of the faceplate 152T.

Each bottom side groove 1201 has an HCD suppression dimension 1207 measured in a direction across a shortest span of the bottom side groove 1201. In the example faceplate 152T, the HCD suppression dimension 1207 is dependent upon at least the process pressure and process RF power. Therefore, for some processes of higher process pressure and/or higher process RF power, the HCD suppression dimension 1207 of the bottom side groove 1201 may need to be smaller to prevent HCD formation within the bottom side groove 1201. But, for some processes of lower process pressure and/or lower process RF power, the HCD suppression dimension 1207 may be larger and still be effective at preventing HCD formation within the bottom side groove 1201. In various embodiments, the HCD suppression dimension 1207 of the bottom side grooves 1201 is within a range extending from about 0.005 inch to about 0.04 inch, or within a range extending from about 0.008 inch to about 0.018 inch, or within a range extending up to about 0.008 inch, or within a range extending up to about 0.08 inch, or within a range extending up to about 0.1 inch, or within a range extending up to about 0.2 inch, or about 0.08 inch, or about 0.01 inch. Again, the upper limit on the HCD suppression dimension 1207 of the bottom side grooves 1201 is process dependent, i.e., dependent upon the pressure and/or RF power of the process, because the potential for HCD formation within a given bottom side groove 1201 is process dependent. Additionally, a given bottom side groove 1201 has an aspect ratio (width-to-depth) defined by the ratio of (HCD suppression dimension 1207/distance 308). In various embodiments, the aspect ratio of given bottom side groove 1201 is less than or equal to about 1, or less than or equal to about 0.3, or less than or equal to about 0.1. In various embodiments, the bottom side grooves 1201 can be formed by an EDM process (e.g., sinker EDM or wire EDM), or by a mechanical machining process, or by a laser drilling process, or by a cutting process (e.g., water jet cutting, plasma cutting, or other type of cutting process).

In various embodiments, a width dimension, i.e., the short horizontal cross-section dimension, of the top side grooves 1203 is within a range extending from about 0.02 inch to about 0.09 inch, or greater than or equal to about 0.02 inch, or greater than or equal to about 0.04 inch, or greater than or equal to about 0.08 inch, or greater than or equal to about 0.1 inch. It should be understood that the width dimension of the top side grooves 1203 can be larger than a size at which HCD is expected to occur, because it is the bottom side grooves 1201 that are sized to prevent HCD. It should also be understood that the width dimension of the top side grooves 1203 can be specified to ease fabrication of the top side grooves 1203. In various embodiments, the top side grooves 1203 can be formed by an EDM process (e.g., sinker EDM or wire EDM), or by a mechanical machining process, or by a laser drilling process, or by a cutting process (e.g., water jet cutting, plasma cutting, or other type of cutting process).

Given the foregoing, in some embodiments, a showerhead (e.g., 150) is disclosed for delivering process gas to a plasma generation region (e.g., 154) within a substrate processing system (e.g., 100). The showerhead includes a faceplate (e.g., 152A-152T) having a bottom side (e.g., 302) and a top side (e.g., 304). The bottom side of the faceplate faces the plasma generation region during operation of the substrate processing system. The top side of the faceplate faces a plenum (e.g., 151) into which a process gas is supplied during operation of the substrate processing system. The faceplate has an overall thickness (e.g., 306) as measured between the bottom side and the top side of the faceplate. The faceplate includes apertures formed through the bottom side of the faceplate. The faceplate also includes openings formed through the top side of the faceplate. Each of the apertures is formed to extend through a portion (e.g., 308) of the overall thickness of the faceplate to intersect with at least one of the openings to form a corresponding flow path for process gas through the faceplate. In some embodiments, the portion of the overall thickness of the faceplate is within a range extending from about 0.001 inch to about 0.03 inch. In some embodiments, each of the openings is formed to extend through at least 50% (e.g., 307) of the overall thickness of the faceplate. In some embodiments, each of the openings is formed to extend through at least 90% (e.g., 307) of the overall thickness of the faceplate. Each of the apertures has a cross-section oriented parallel with the bottom side of the faceplate. The cross-section of each of the apertures has a hollow cathode discharge suppression dimension in at least one direction. Each of the openings has a cross-section oriented parallel with the top side of the faceplate. Each of the openings has a smallest cross-sectional dimension that is greater than the hollow cathode discharge suppression dimension. In some embodiments, the hollow cathode discharge suppression dimension is within a range extending from about 0.005 inch to about 0.04 inch. In some embodiments, the hollow cathode discharge suppression dimension is within a range extending from about 0.008 inch to about 0.018 inch.

In some embodiments, the openings formed through the top side of the faceplate are formed as circular holes. In some embodiments, the openings are arranged in either a hexagonal lattice array, a square lattice array, a rectangular lattice array, a rhombic lattice array, a parallelogrammic lattice array, a Vogel pattern, or a customized pattern.

In some embodiments, the apertures formed through the bottom side of the faceplate are formed as slots that extend through the bottom side of the faceplate. In some embodiments, each of the slots extends in a continuous manner across the bottom side of the faceplate, and the slots are oriented parallel to each other. In some embodiments, each of the slots is separately formed at locations of each of the openings. In some embodiments, each of the slots has a substantially rectangular cross-sectional shape in an orientation parallel with the bottom side of the faceplate. In these embodiments, the slots can be oriented either parallel with respect to each other, or in an ordered manner with respect to each other, or in a random manner with respect to each other.

In some embodiments, each of the slots has a curved cross-sectional shape in an orientation parallel with the bottom side of the faceplate. In these embodiments, each opening intersects a separate pair of slots within the faceplate. In some embodiments, the curved cross-sectional shape is either a C-shape or a bracket shape.

In some embodiments, each of the apertures formed through the bottom side of the faceplate has a circular cross-sectional shape in an orientation parallel with the bottom side of the faceplate. In some embodiments, the openings are arranged in a Vogel pattern, and the apertures are formed as a grooves that extend through the bottom side of the faceplate. In these embodiments, the grooves are formed in a Vogel pattern to intersect the openings.

In some embodiments, the openings are formed as a first set of grooves that extend through the top side of the faceplate, and the apertures are formed as a second set of grooves that extend through the bottom side of the faceplate. In these embodiments, the first set of grooves is formed in a first Vogel pattern, and the second set of grooves is formed in a second Vogel pattern, where the first and second Vogel patterns traverse in reverse direction with respect to each other.

In some embodiments, the openings are formed as a first set of grooves that extend through the top side of the faceplate, and the apertures are formed as a second set of grooves that extend through the bottom side of the faceplate. In these embodiments, the first set of grooves is formed in a radial-spoke pattern, and the second set of grooves is also formed in the radial-spoke pattern to intersect with the first set of grooves.

In some embodiments, the openings are formed as a first set of grooves that extend through the top side of the faceplate, and the apertures are formed as a second set of grooves that extend through the bottom side of the faceplate. In these embodiments, the first set of grooves is formed in a radial-spoke pattern, and the second set of grooves is formed in a concentric-circular pattern to intersect with the first set of grooves.

In some embodiments, a faceplate (e.g., 152A-152T) is disclosed for a showerhead (e.g., 150) for delivering process gas to a plasma generation region (e.g., 154) within a substrate processing system (e.g., 100). The faceplate includes a disc having a bottom side (e.g., 302) and a top side (e.g., 304). The bottom side of the disc faces the plasma generation region during operation of the substrate processing system. The top side of the disc faces a plenum (e.g., 151) into which a process gas is supplied during operation of the substrate processing system. The disc has an overall thickness (e.g., 306) as measured between the bottom side and the top side of the disc. The disc includes apertures formed through the bottom side of the disc. The disc also includes openings formed through the top side of the disc. Each of the apertures is formed to extend through a portion (e.g., 308) of the overall thickness of the disc to intersect with at least one of the openings to form a corresponding flow path for process gas through the disc. Each of the apertures has a cross-section oriented parallel with the bottom side of the disc. The cross-section of each of the apertures has a hollow cathode discharge suppression dimension in at least one direction. Each of the openings has a cross-section oriented parallel with the top side of the disc. Each of the openings has a smallest cross-sectional dimension that is greater than the hollow cathode discharge suppression dimension.

Figure 13:
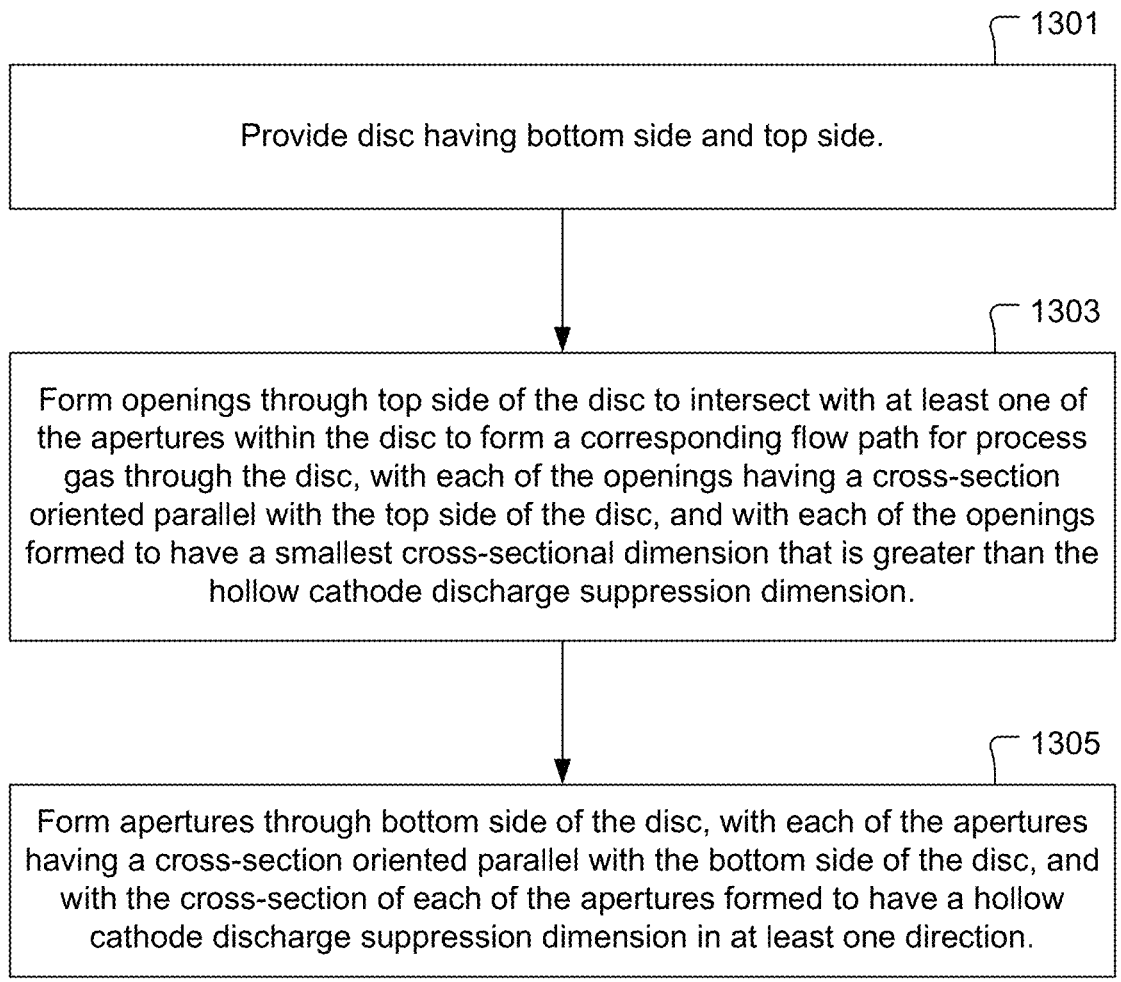
FIG. 13 shows a flowchart of a method for manufacturing a showerhead for delivering process gas to a plasma generation region within a substrate processing system, in accordance with some embodiments.

FIG. 13 shows a flowchart of a method for manufacturing a faceplate (e.g., 152A-152T) of a showerhead (e.g., 150) for delivering process gas to a plasma generation region (e.g., 154) within a substrate processing system (e.g., 100), in accordance with some embodiments. The method includes an operation 1301 for providing a disc having a bottom side (e.g., 302) and a top side (e.g., 304). The bottom side of the disc is configured to face the plasma generation region during operation of the substrate processing system. The top side of the disc is configured to face a plenum into which a process gas is supplied during operation of the substrate processing system. The disc has an overall thickness (e.g., 306) as measured between the bottom side and the top side of the disc. The method also includes an operation 1303 for forming openings through the top side of the disc. Each of the openings has a cross-section oriented parallel with the top side of the disc. Each of the openings is formed to have a smallest cross-sectional dimension that is greater than the hollow cathode discharge suppression dimension. The method also includes an operation 1305 for forming apertures through the bottom side of the disc to intersect with at least one of the apertures within the disc to form a corresponding flow path for process gas through the disc. Each of the apertures has a cross-section oriented parallel with the bottom side of the disc. The cross-section of each of the apertures is formed to have a hollow cathode discharge suppression dimension in at least one direction.

The various modified faceplates 152A-152T disclosed herein provide for suppression of HCD at various process conditions by having small apertures of shallow depth formed through the bottom side (plasma side) of the faceplate to intersect with larger openings formed through the top side (plenum side) of the faceplate. The horizontal cross-section(s) of the small apertures formed through the bottom side of the faceplate have an HCD suppression dimension in at least one direction. Also, the shallow depth of the small apertures formed through the bottom side of the faceplate enable the small apertures to be formed using various fabrication techniques, such as an EDM process (e.g., sinker EDM or wire EDM), or by a mechanical machining process (e.g., drilling), or by a laser drilling process, or by a cutting process (e.g., water jet cutting, plasma cutting, or other type of cutting process), among other processes. Also, the shallow depth of the small apertures formed through the bottom side of the faceplate enables faster material removal when forming the small apertures and enables lower process gas flow restriction through the small apertures.

The various modified faceplates 152A-152T disclosed herein provide for maintaining high process gas flow conductance and uniformity through the modified faceplate that is comparable to what is achieved with existing showerhead designs. More specifically, the geometry and number of the small apertures formed through the bottom side of the modified faceplate and the geometry and number of the larger openings formed through the top side of the modified faceplate can be defined to maintaining high process gas flow conductance and uniformity through the modified faceplate that is comparable to what is achieved with existing showerhead designs. Also, the various modified faceplates 152A-152T disclosed herein provide for suppression of HCD formation at essentially all process conditions, including AHM process conditions. More specifically, the HCD suppression dimension of the apertures formed through the bottom side of the modified faceplate can be set to ensure that HCD formation will not occur under planned process conditions of pressure and RF power. Also, the various modified faceplates 152A-152T disclosed herein can be economically fabricated at production scales.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for manufacturing a faceplate of a showerhead for delivering process gas to a plasma generation region within a substrate processing system, comprising:
   providing a disc having a bottom side and a top side, the bottom side of the disc to face the plasma generation region during operation of the substrate processing system, the top side of the disc to face one or more plenums into which one or more process gases are supplied during operation of the substrate processing system, the disc having an overall thickness as measured between the bottom side and the top side of the disc;
   forming apertures through the bottom side of the disc, each of the apertures having a cross-section oriented parallel with the bottom side of the disc, the cross-section of each of the apertures having a size in at least one direction within a range extending from about 0.005 inch to about 0.04 inch; and
   forming openings through the top side of the disc to intersect with at least one of the apertures within the disc to form a corresponding flow path for process gas through the disc, each of the openings having a cross-section oriented parallel with the top side of the disc, each of the openings formed to have a smallest cross-sectional dimension that is greater than a hollow cathode discharge suppression dimension.

2. The method as recited in claim 1, wherein each of the openings is formed to extend through at least 50% of the overall thickness of the disc.

3. The method as recited in claim 1, wherein each of the openings is formed to extend through at least 90% of the overall thickness of the disc.

4. The method as recited in claim 1, wherein the apertures are formed to extend through less than the overall thickness of the disc.

5. The method as recited in claim 1, wherein the apertures are formed to extend into the disc from the bottom side of the disc by a distance within a range extending from about 0.001 inch to about 0.03 inch.

6. The method as recited in claim 1, wherein the hollow cathode discharge suppression dimension is within a range extending from about 0.005 inch to about 0.04 inch.

7. The method as recited in claim 1, wherein the hollow cathode discharge suppression dimension is within a range extending from about 0.008 inch to about 0.018 inch.

8. The method as recited in claim 1, wherein the openings are formed as respective circular holes.

9. The method as recited in claim 8, further comprising:
   arranging the openings in either a hexagonal lattice array, a square lattice array, a rectangular lattice array, a rhombic lattice array, a parallelogrammic lattice array, a Vogel pattern, or a customized pattern.

10. The method as recited in claim 9, wherein the apertures are formed as slots that extend through the bottom side of the disc.

11. The method as recited in claim 10, wherein each of the slots is formed to extend in a continuous manner across the bottom side of the disc, and wherein the slots are oriented parallel to each other.

12. The method as recited in claim 10, wherein the slots are formed at locations of the openings, the slots formed separate from each other.

13. The method as recited in claim 12, wherein each of the slots is formed to have a substantially rectangular cross-sectional shape in an orientation parallel with the bottom side of the disc, the slots oriented either parallel with respect to each other, or in an ordered manner with respect to each other, or in a random manner with respect to each other.

14. The method as recited in claim 12, wherein each of the slots is formed to have a curved cross-sectional shape in an orientation parallel with the bottom side of the disc.

15. The method as recited in claim 14, wherein each opening is formed to intersect a separate pair of slots.

16. The method as recited in claim 14, wherein the curved cross-sectional shape is either a C-shape or a bracket shape.

17. The method as recited in claim 8, wherein each of the apertures is formed to have a circular cross-sectional shape in an orientation parallel with the bottom side of the disc.

18. The method as recited in claim 8, further comprising:
   arranging the openings in a Vogel pattern, the apertures formed as grooves that extend through the bottom side of the disc, the grooves formed in a Vogel pattern to intersect the openings.

19. The method as recited in claim 1, wherein the openings are formed as a first set of grooves that extend through the top side of the disc, and the apertures are formed as a second set of grooves that extend through the bottom side of the disc, the first set of grooves formed in a first Vogel pattern, the second set of grooves formed in a second Vogel pattern, the first and second Vogel patterns traversing in reverse direction with respect to each other.

20. The method as recited in claim 1, wherein the openings are formed as a first set of grooves that extend through the top side of the disc, and the apertures are formed as a second set of grooves that extend through the bottom side of the disc, the first set of grooves formed in a radial-spoke pattern, the second set of grooves also formed in the radial-spoke pattern to intersect with the first set of grooves.

21. The method as recited in claim 1, wherein the openings are formed as a first set of grooves that extend through the top side of the disc, and the apertures are formed as a second set of grooves that extend through the bottom side of the disc, the first set of grooves formed in a radial-spoke pattern, the second set of grooves formed in a concentric-circular pattern to intersect with the first set of grooves.

* * * * *